United States Patent
Li et al.

(10) Patent No.: US 9,111,928 B2
(45) Date of Patent: Aug. 18, 2015

(54) SWITCH CIRCUIT PACKAGE MODULE

(71) Applicant: Delta Electronics (Shanghai) Co., Ltd., Shanghai (CN)

(72) Inventors: Zeng Li, Shanghai (CN); Shou-Yu Hong, Shanghai (CN); Jian-Hong Zeng, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 13/760,079

(22) Filed: Feb. 6, 2013

(65) Prior Publication Data

US 2014/0117495 A1  May 1, 2014

(30) Foreign Application Priority Data

Oct. 31, 2012 (CN) .......................... 2012 1 0429620

(51) Int. Cl.
*H01L 25/00* (2006.01)
*H01L 23/495* (2006.01)
*H01L 23/64* (2006.01)

(52) U.S. Cl.
CPC .......... *H01L 25/50* (2013.01); *H01L 23/49562* (2013.01); *H01L 23/49589* (2013.01); *H01L 23/642* (2013.01); *H01L 2224/32145* (2013.01); *H01L 2224/32245* (2013.01); *H01L 2224/33181* (2013.01); *H01L 2224/48091* (2013.01); *H01L 2224/48137* (2013.01); *H01L 2224/48247* (2013.01); *H01L 2224/73265* (2013.01); *H01L 2924/1301* (2013.01); *H01L 2924/1305* (2013.01); *H01L 2924/13055* (2013.01); *H01L 2924/13062* (2013.01); *H01L 2924/13091* (2013.01); *H01L 2924/19041* (2013.01); *H01L 2924/19042* (2013.01); *H01L 2924/19104* (2013.01); *H01L 2924/19105* (2013.01); *H01L 2924/3011* (2013.01); *H01L 2924/30107* (2013.01)

(58) Field of Classification Search
CPC ............. H02M 3/00; H01F 2007/1822; H01F 17/0033; H01L 25/50; H01L 23/49562
USPC ............ 257/531–666; 361/782, 801; 327/536
See application file for complete search history.

(56) References Cited

U.S. PATENT DOCUMENTS

| | | | | |
|---|---|---|---|---|
| 5,859,632 A * | 1/1999 | Ito | ................. | 345/211 |
| 6,157,242 A * | 12/2000 | Fukui | ............ | 327/536 |
| 7,071,765 B2 * | 7/2006 | Kamijo | ........................ | 327/536 |
| 7,248,483 B2 * | 7/2007 | West | ............................. | 361/801 |
| 2009/0175014 A1 * | 7/2009 | Zeng et al. | ..................... | 361/782 |
| 2009/0256245 A1 * | 10/2009 | Liu et al. | ....................... | 257/666 |
| 2011/0291236 A1 * | 12/2011 | Hayashi et al. | ................ | 257/532 |

* cited by examiner

*Primary Examiner* — Eugene Lee
*Assistant Examiner* — Fang-Xing Jiang
(74) *Attorney, Agent, or Firm* — CKC & Partners Co., Ltd.

(57) ABSTRACT

A switch circuit package module includes a semiconductor switch unit and a capacitor unit. The semiconductor switch unit includes sub micro-switch elements. The capacitor unit is arranged at a periphery of the semiconductor switch unit or stacked on a surface of the semiconductor switch unit, such that impedances of commutation loops between the capacitor unit and the sub micro-switch elements are close to or the same with each other.

13 Claims, 42 Drawing Sheets

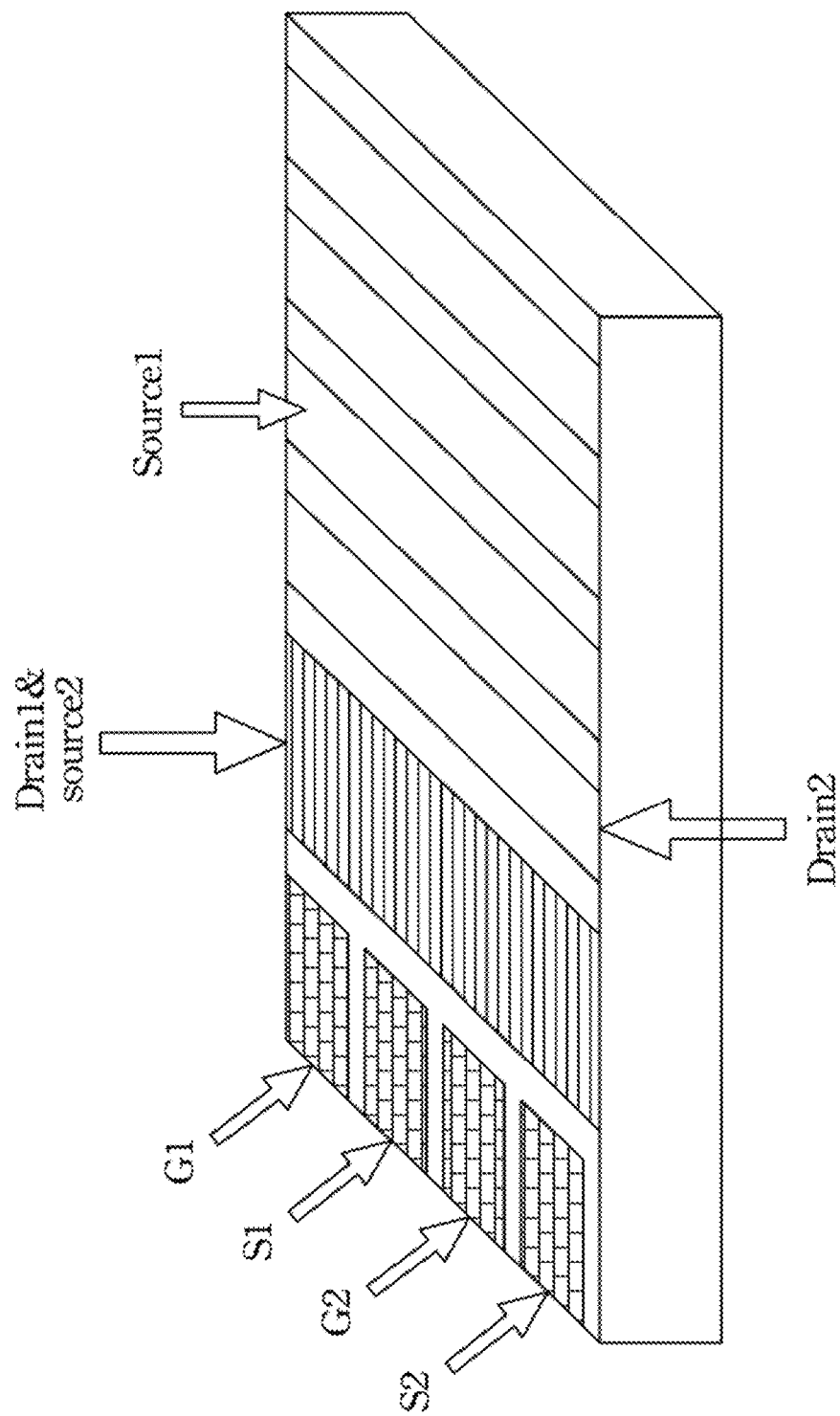

SWITCH CIRCUIT PACKAGE MODULE

RELATED APPLICATIONS

This application claims priority to China Application Serial Number 201210429620.8, filed Oct. 31, 2012, which is herein incorporated by reference.

BACKGROUND

1. Field of Disclosure

The disclosure relates to a switch circuit. More particularly, the disclosure relates to a package module structure of a switch circuit.

2. Description of Related Art

In recent years, since both of industrial electronic products and general electronic products are required to have a lower power loss during the operation, it becomes an important issue that how to make the switch circuits in the electronic products work more efficiently so as to decrease the losses of the electronic products.

In the switch circuit, when different switches work alternately, a process of switching the switches will make the energy stored in a parasitic inductor on a commutation loop to be consumed on the circuit, and since the switch circuit generally has a higher switch frequency, a larger switch loss will be generated. In addition, if the switch circuit is made in the form of chip, then the switch circuit has a higher current harmonics, which will lead to a non-uniform distribution of the current on the chip, so as to generate an additional chip loss. Since a larger parasitic inductance in the loop often leads to non-ideal efficiency of the switch circuit, a capacitor is usually added into the switch circuit, so as to shrink an equivalent inductance and reduce the loss.

There are many conventional methods used to reduce the loss of the switch circuit. However, under a high frequency operating condition, the conventional methods can still lead to the problems such as apparent non-uniform distribution of the current on the chip due to the switch circuit having a higher current harmonics and low utilization of the chip due to the non-uniform distribution of the current when the switch is at a transient state.

SUMMARY

An aspect of the disclosure relates to a switch circuit package module, which includes at least a first semiconductor switch unit and at least a first capacitor unit. The first semiconductor switch unit includes a plurality of sub micro-switch elements. The capacitor unit is arranged at a periphery of the first semiconductor switch unit, such that impedances of any two symmetrical commutation loops between the first capacitor unit and the sub micro-switch elements are close to or the same with each other.

Another aspect of the disclosure relates to a switch circuit package module, which includes at least a semiconductor switch unit and at least a capacitor unit. The semiconductor switch unit includes a plurality of sub micro-switch elements. The capacitor unit is stacked on a surface of the semiconductor switch unit, such that impedances of multiple commutation loops between the capacitor unit and the sub micro-switch elements are close to or the same with each other.

Still another aspect of the disclosure relates to a method for fabricating a switch circuit package module, which includes: integrating a first semiconductor switch element and a second semiconductor switch element on a semiconductor switch unit, in which the semiconductor switch unit includes a plurality of sub micro-switch elements; and configuring at least a capacitor unit on a surface of the semiconductor switch unit, such that impedances of multiple commutation loops between the capacitor unit and the sub micro-switch elements are close to or the same with each other.

Yet still another aspect of the disclosure relates to a commutation loop, which includes the switch circuit package module as described above and an external capacitor, in which the external capacitor is electrically connected to the switch circuit package module.

BRIEF DESCRIPTION OF THE DRAWINGS

FIG. 7B is a schematic diagram illustrating a switch circuit package structure having a staggered lead structure;

DETAILED DESCRIPTION

A detailed description is made hereinafter by taking embodiments and cooperating with the accompanying drawings. However, the embodiments described are not intended to limit the scope of the disclosure, while the description of a structural operation is not intended to limit the order of implementation. Any device with equivalent functions that is generated by a structure recombined by components shall fall into the scope of the disclosure. Additionally, the drawings are only used for illustration and are not drawn to scale.

As used herein, the terms "about", "approximately" or "roughly" generally refers to the error or scope of the quantity which is within a range of 20%, preferably within a range of 10%, and more preferably within a range of 5%. If no specific description is provided herein, then all the quantities mentioned herein are considered as approximate values, e.g., the error or scope being referred to by the terms "about", "approximately" or "roughly" or other approximate values.

Additionally, as used herein, both of the terms "couple" or "connect" can refer to the mutual physical contact or electrical contact performed directly or indirectly between two or more components. The terms "couple" or "connect" also can refer to the mutual operation or action between two or more components.

Generally, for the semiconductor chip, a single semiconductor switch chip may be decomposed into multiple or even millions of cells (each cell or multiple adjacent cells may be considered as one sub micro-switch element) according to conductive paths. It can be seen from the scanning electron microscope (SEM) diagram analyzed from the perspective of cell microstructure of the chip that, for a vertical-type metal oxide semiconductor field effect transistor (MOSFET), the cells of the MOSFET are distributed vertically, and a reverse-biased PN junction or an insulation layer is used for insulating two cells. Other related components that can be fabricated into the semiconductor chip, such as an insulated gate bipolar transistor (IGBT), a gate turn-off thyristor (GTO) and a junction field effect transistor (JFET), also have a similar structure.

Figure 1A:
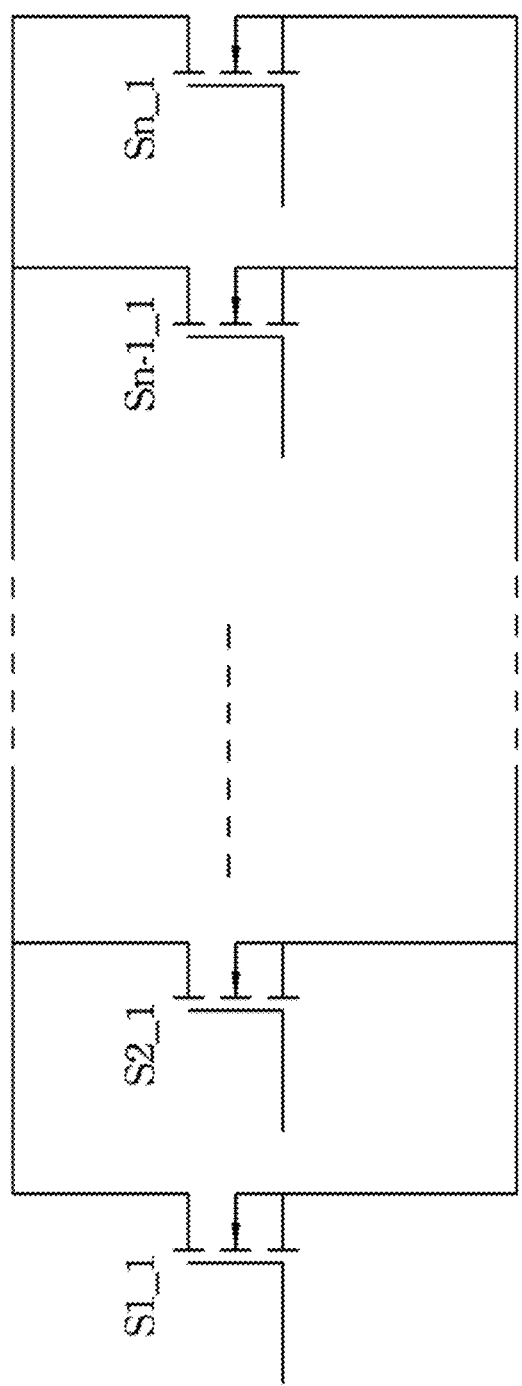
FIG. 1A is a schematic diagram illustrating a switch equivalent circuit having multiple switches juxtaposed.

The above-mentioned semiconductor cell is just a part of the semiconductor chip. In order to enable each cell in the chip to be connected smoothly, a layer of micro-sized (μm) metal interconnected layer is attached to the cell surface, and a thickness of the metal layer attached to the chip surface is about 4.6 μm (this thickness having subtle differences depending on different chips). At the same time, in order to enable the surface metal layer to be bonded with the wire bonding, solder and the like, the metal material, such as aluminum, aluminum-silicon, nickel-silver, nickel-gold, copper and the alloy material thereof are usually used as the surface metal. Multiple cells may be paralleled to constitute one MOSFET semiconductor chip through the connection of the metal layer, and this MOSFET semiconductor chip during the operation may be considered as an equivalent circuit in which multiple sub micro-switch elements are juxtaposed (the equivalent circuit in which multiple sub micro-switch elements S1_1, S2_1, . . . , Sn_1 are juxtaposed as shown in FIG. 1A).

The above-mentioned semiconductor chip and the metal wiring layer thereof, wiring bonding, solder, capacitor, substrate metal wiring may constitute a basic switch circuit. Compared to FIG. 1A, the equivalent circuit shown in FIG. 1B may further include a capacitor C and inductances Ld1-Ld(n−1) and Ls1-Ls(n−1). The capacitor C is connected in parallel to the above-mentioned equivalent circuit. The Ld1-Ld(n−1) are the parasitic inductances of the metal wiring layer, solder and metal conductive plate on the upper surface of the chip. The Ls1-Ls(n−1) are the parasitic inductances of the metal wiring layer, solder and metal substrate on the lower surface of the chip. The Ld and Ls are the parasitic inductances of metal conductors between the chip and the capacitor C. In other words, if multiple cells are paralleled to form each chip and meanwhile the parasitic inductance of each passage is considered, then the above-mentioned MOSFET semiconductor chip may be considered as the equivalent circuit having parasitic components as shown in FIG. 1B.

Figure 1B:
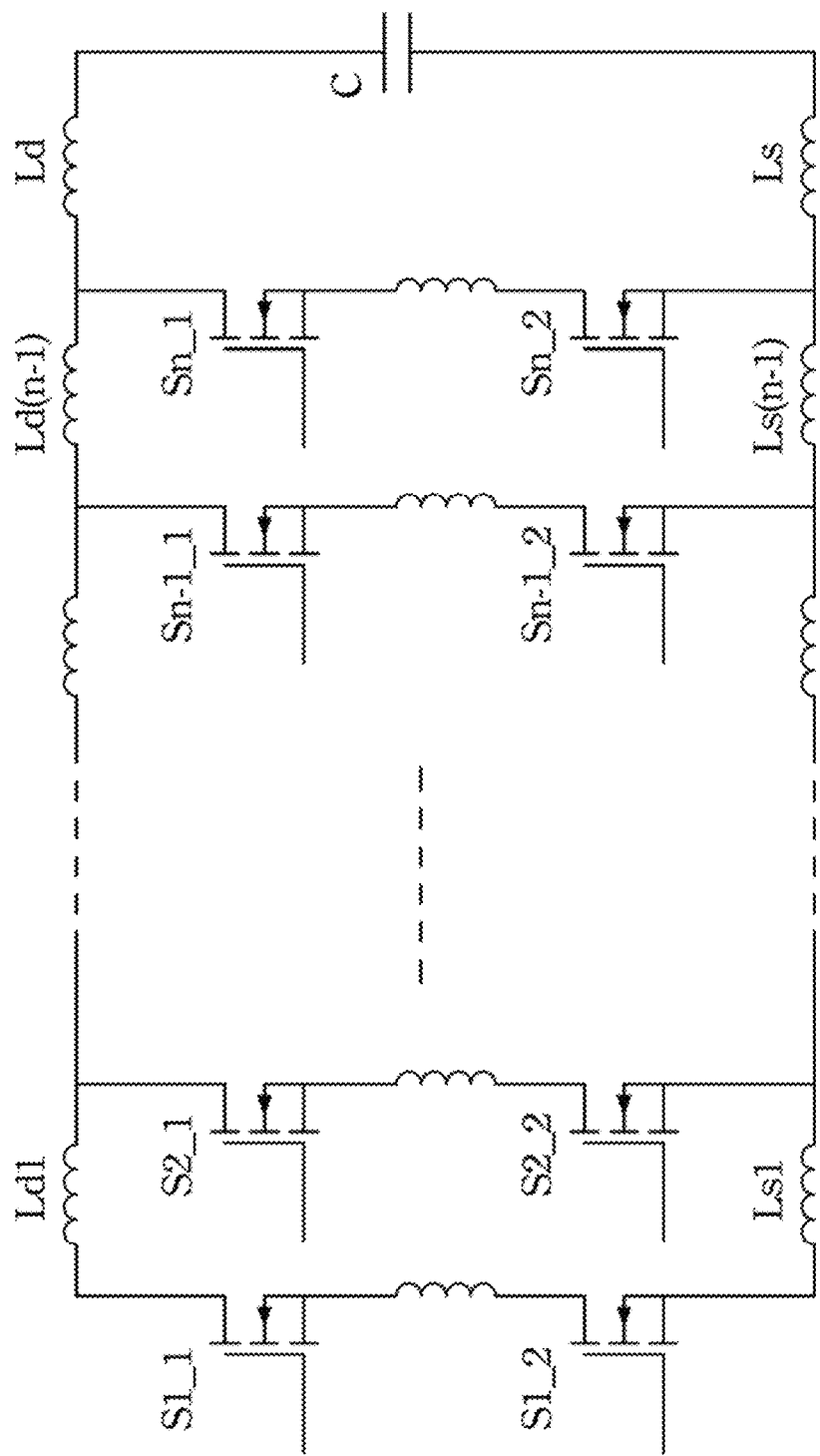
FIG. 1B is a schematic diagram illustrating a switch equivalent circuit having parasitic components.

It can be seen form the equivalent circuit shown in FIG. 1B that, compared to parasitic impedances on the commutation loop formed by the right-side MOSFET cells closer to the capacitor C and the capacitor C, parasitic impedances on the commutation loop formed by the left-side MOSFET cells away from the capacitor C and the capacitor C are larger. Therefore, under the condition that the cells in the chip are paralleled and switched on, the current density of the left-side cells will be less than the current density of the right-side cells.

The chip surface metal impedances lead to the non-uniform distribution of the current, and thus it apparently causes that a switch-on resistance $R_{ds,on}$ of the MOSFET is increased and more switch-on losses are generated. Due to the existence of the inductive impedances, the higher the frequency is, the larger the impedances are, so that the current distribution is also more non-uniform. Particularly at the switch time, since the speed is very quick, which is equivalent to the condition that the operating frequency is very high and the current distribution is very non-uniform, only a part of the MOSFET cells can participate in action at this time, such that the switch speed of the MOSFET is reduced and more switch-on losses are generated.

In view of the above, from a package perspective, the essential factor of affecting the switch circuit efficiency at least has the following three kinds: (A) the parasitic inductances of the commutation loops; (B) the current distribution of the MOSFET cells during the switch-on process, in which one quantifiable concept may be used for defining the current distribution density in the cells, i.e., the switch-on resistance $R_{ds,on}$ during the switch-on process; and (C) the switch process which is subjected to the factors such as the parasitic inductances on the cell surface, such that the number of the cells actually participating in the switch action is reduced, in which the utilization of the MOSFET semiconductor chip may be used for defining the number of the MOSFET cells actually participating in the switch action herein.

Therefore, in order to reduce the loop inductances, solve the problem that the semiconductor switch cell current is non-uniform, enhance the utilization of the semiconductor chip during the switch process, and then optimize the overall efficiency of the switch circuit, any one of the following manners or a combination thereof may be used when the switch circuit package module is fabricated:

1) a distance between the semiconductors in the commutation loop is minimized as far as possible. Alternatively, the semiconductor cells in the commutation loop are integrated into the semiconductor chip according to a matrix distribution by employing a monolithic integration technology;

2) a distance between the capacitor and the semiconductor is minimized as far as possible. Preferably, both of the capacitor and the semiconductor may be integrated into the same package structure;

3) the components are connected by employing a metal substrate rather than the wire bonding;

4) multiple chips with smaller size are selected to be connected in parallel. Alternatively, the semiconductor is divided into multiple paralleled semiconductor cell groups by employing the monolithic integration technology, while a lead of each cell group is respectively led out; alternatively, multiple capacitors with smaller size are selected to be connected in parallel, which are uniformly arranged at the periphery of the chip or on the surface of the chip, such that the paths of the commutation loops constituted by various paralleled cells and capacitors are basically identical;

5) a ground wire of a gate is connected with the largest cell on the loop paths, and alternatively, a separate gate signal is employed to drive various paralleled cells respectively;

6) the selection of an integration capacitance in the module should avoid the occurrence of resonance between the capacitor itself and an external line when the switch circuit operates.

Embodiments of the disclosure described below primarily provide a package module of the switch circuit integrated with the capacitor, so as to reduce the loss of the switch circuit during the operation and make the current distribution thereon uniform, to enhance the utilization of the switch or improve the efficiency of the switch circuit.

Figure 1C:
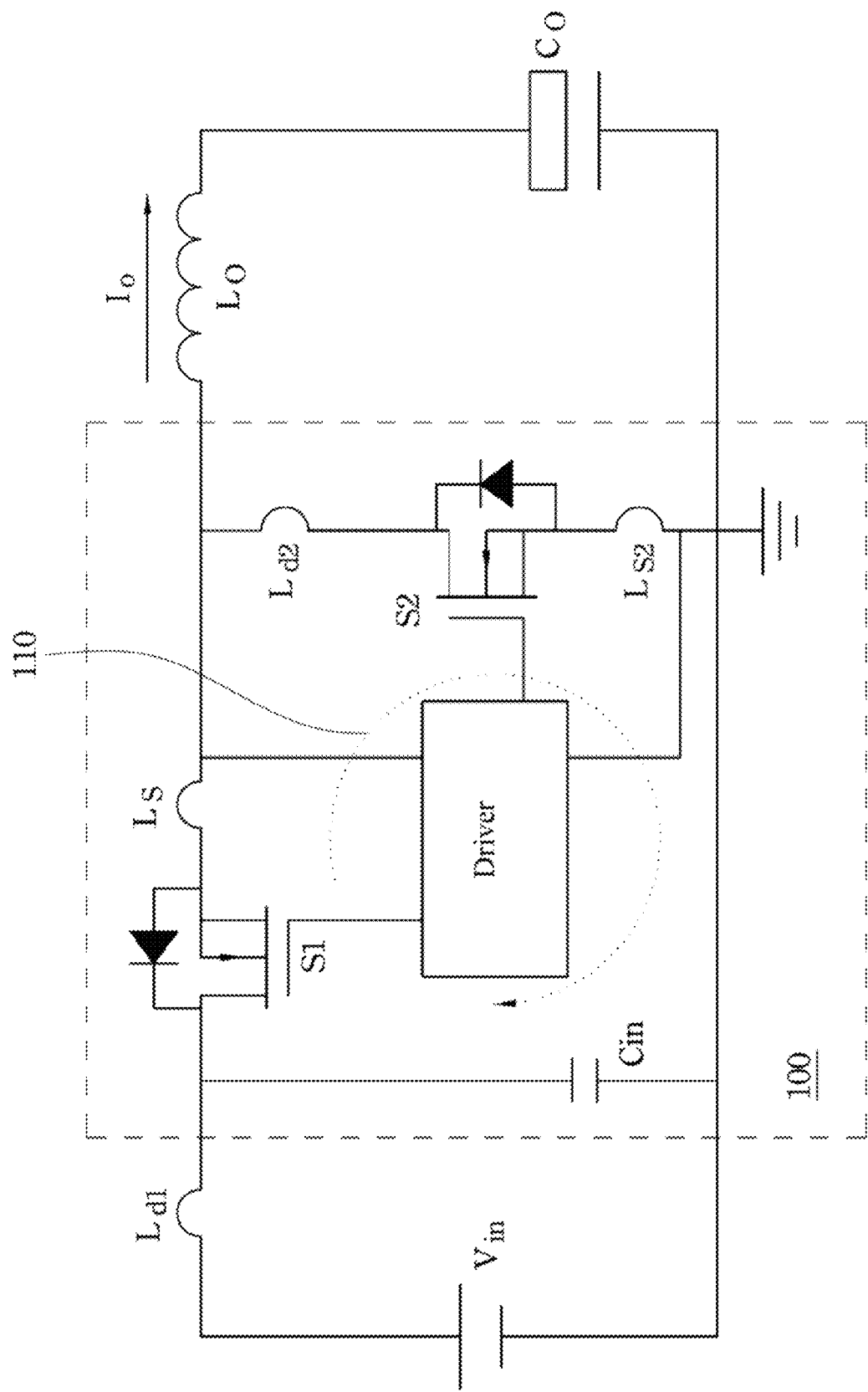
FIG. 1C is a schematic diagram illustrating a switch circuit according to an embodiment of the disclosure.

FIG. 1C is a schematic diagram illustrating a switch circuit according to an embodiment of the disclosure. As shown in FIG. 1C, a switch circuit 100 includes two switches S1 and S2, and the switches S1 and S2 are controlled by a driver and switched alternatively, so as to perform a switch process. Specifically, when the switch S1 is switched on, the current flows to an output inductance $L_O$ and an output capacitor $C_O$ through the switch S1; then, when the switch S1 is switched off, an voltage cross the switch S1 (such as a source-drain voltage) is raised, and an voltage cross the switch S2 (such as a source-drain voltage) is reduced. At this time, the current flowing through the switch S1 is transformed to flow to the switch S2. Afterwards, when the switch S2 is switched on, the current flows to the output inductance $L_O$ and the output capacitor $C_O$ through the switch S2; then, when the switch S2 is switched off and the switch S1 is switched on, the voltage cross the switch S2 is raised, and the voltage cross the switch S1 is reduced. At this time, the current flowing through the switch S2 is transformed to flow to the switch S1.

When the above-mentioned switch circuit 100 operates in a switch state, the current is switched between branch paths constituted by a capacitor Cin and the switches S1 and S2. As shown in FIG. 1C, the current is transformed from the branch path corresponding to the switch S2 to the branch path constituted by the capacitor Cin and the switch S1, and the loop constituted by the two branch paths is a commutation loop 110.

Figure 2A:
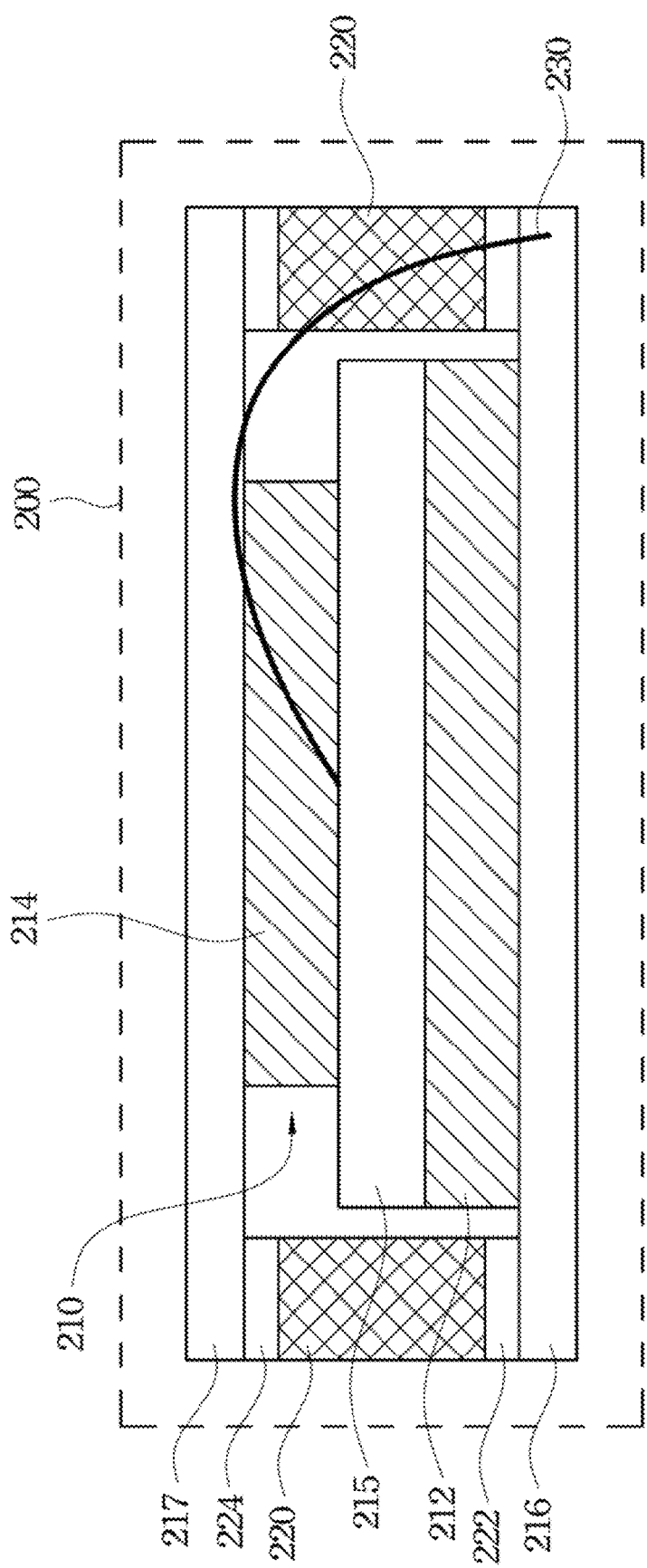
FIG. 2A is a schematic cross-section diagram illustrating a switch circuit package module according to a first embodiment of the disclosure.
Figure 2B:
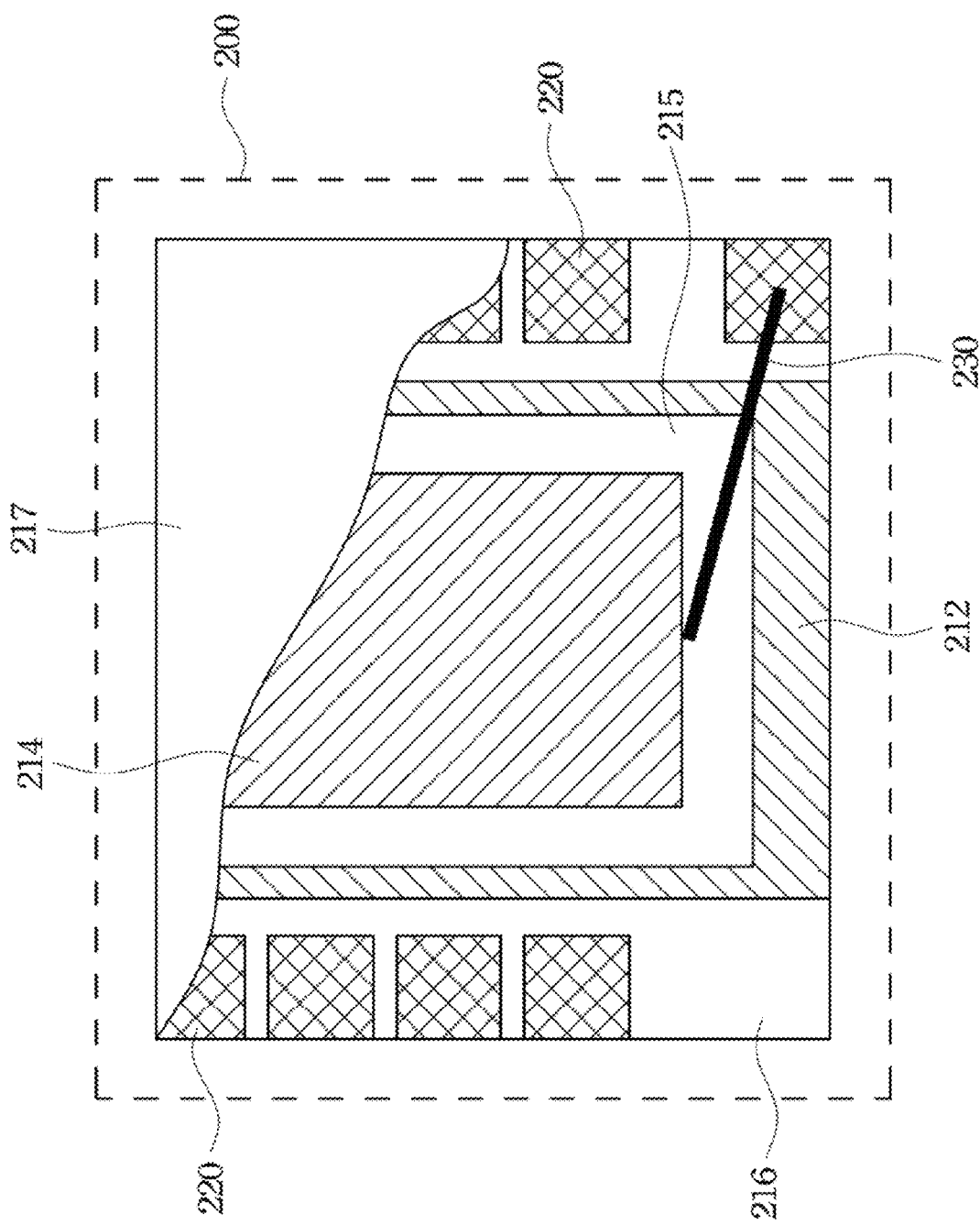
FIG. 2B is a schematic top diagram illustrating the switch circuit package module as shown in FIG. 2A according to an embodiment of the disclosure.

FIG. 2A is a schematic cross-section diagram illustrating a switch circuit package module according to a first embodiment of the disclosure. FIG. 2B is a schematic top diagram illustrating the switch circuit package module as shown in FIG. 2A according to an embodiment of the disclosure. As shown in FIGS. 2A and 2B, a switch circuit package module 200 includes a first semiconductor switch unit 212 and a capacitor unit (e.g., including multiple capacitors 220). The first semiconductor switch unit 212 includes a plurality of sub micro-switch elements (similar to the aforementioned descriptions, the first semiconductor switch unit 212 includes multiple cells, and each of which or multiple adjacent ones of which may be equivalent to one sub micro-switch element). The capacitor unit (e.g., including multiple capacitors 220) is arranged at a periphery of the first semiconductor switch unit 212 (e.g., at both sides), such that impedances of any two symmetrical commutation loops between the capacitor unit and the above-mentioned sub micro-switch elements are close to or the same with each other.

Figure 2C:
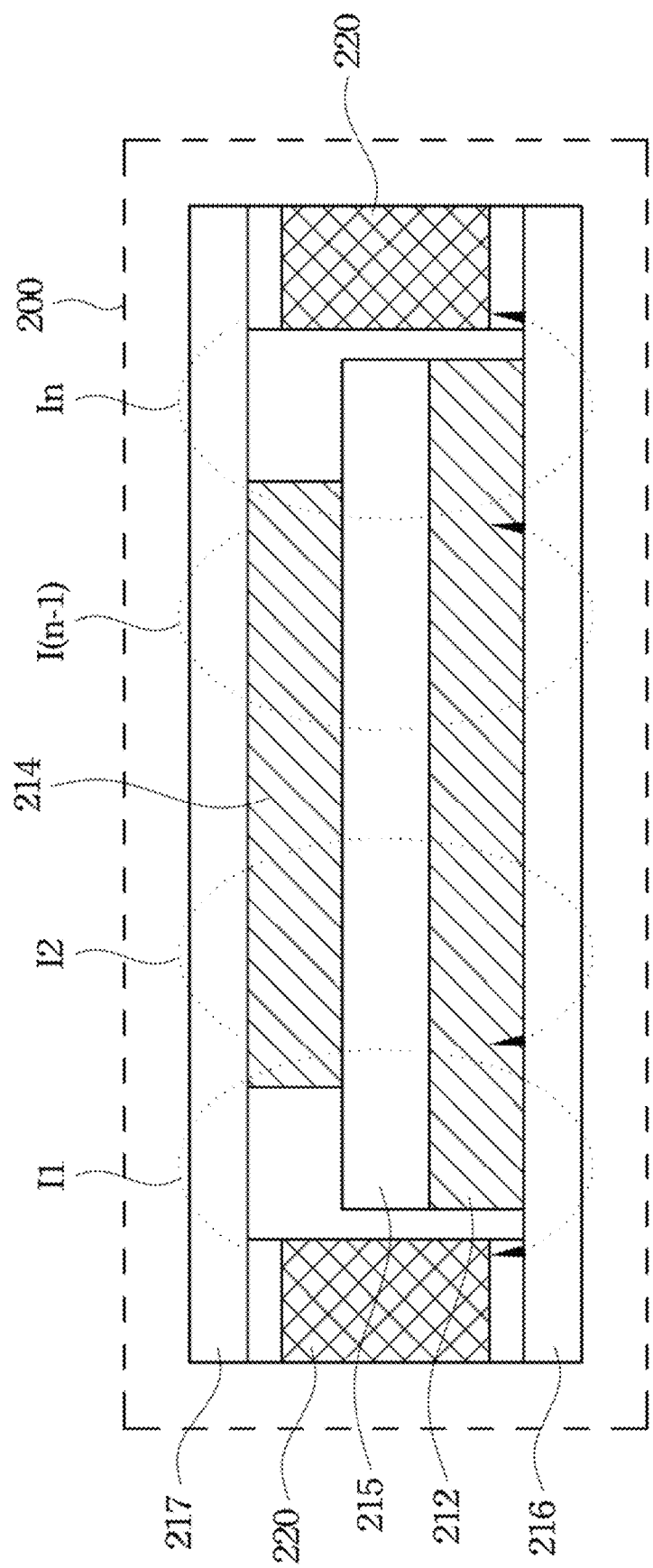
FIG. 2C is a schematic diagram illustrating the commutation loops in a switch circuit package module as shown in FIG. 2A according to an embodiment of the disclosure.

For example, FIG. 2C is a schematic diagram illustrating a commutation loop in the switch circuit package module as shown in FIG. 2A according to an embodiment of the disclosure. As shown in FIG. 2C, the capacitors 220 are arranged at both sides of the first semiconductor switch unit 212, and the symmetrical commutation loops such as I1 and In, I2 and I(n−1), etc., are formed between the capacitors 220 at both sides and the sub micro-switch elements in the first semiconductor switch unit 212, and the impedances of any two symmetrical commutation loops are close to or the same with each other.

Moreover, the switch circuit package module 200 may further include a second semiconductor switch unit 214. The first semiconductor switch unit 212 and the second semiconductor switch unit 214 may be stacked and packaged to form a stacked switch structure 210, in which the capacitor units may be arranged at a periphery of the switch structure 210 (e.g., at both sides).

In practice, the first semiconductor switch unit 212 may be a half bridge low side semiconductor switch chip, and the second semiconductor switch unit 214 may be a half bridge high side semiconductor switch chip. Moreover, each of the above-mentioned capacitors 220 may be a separately packaged capacitor component. Alternatively, all the above-mentioned capacitors 220 may be packaged in a capacitor component. I.e., it can be implemented by one capacitor component having a larger capacitance.

Figure 2D:
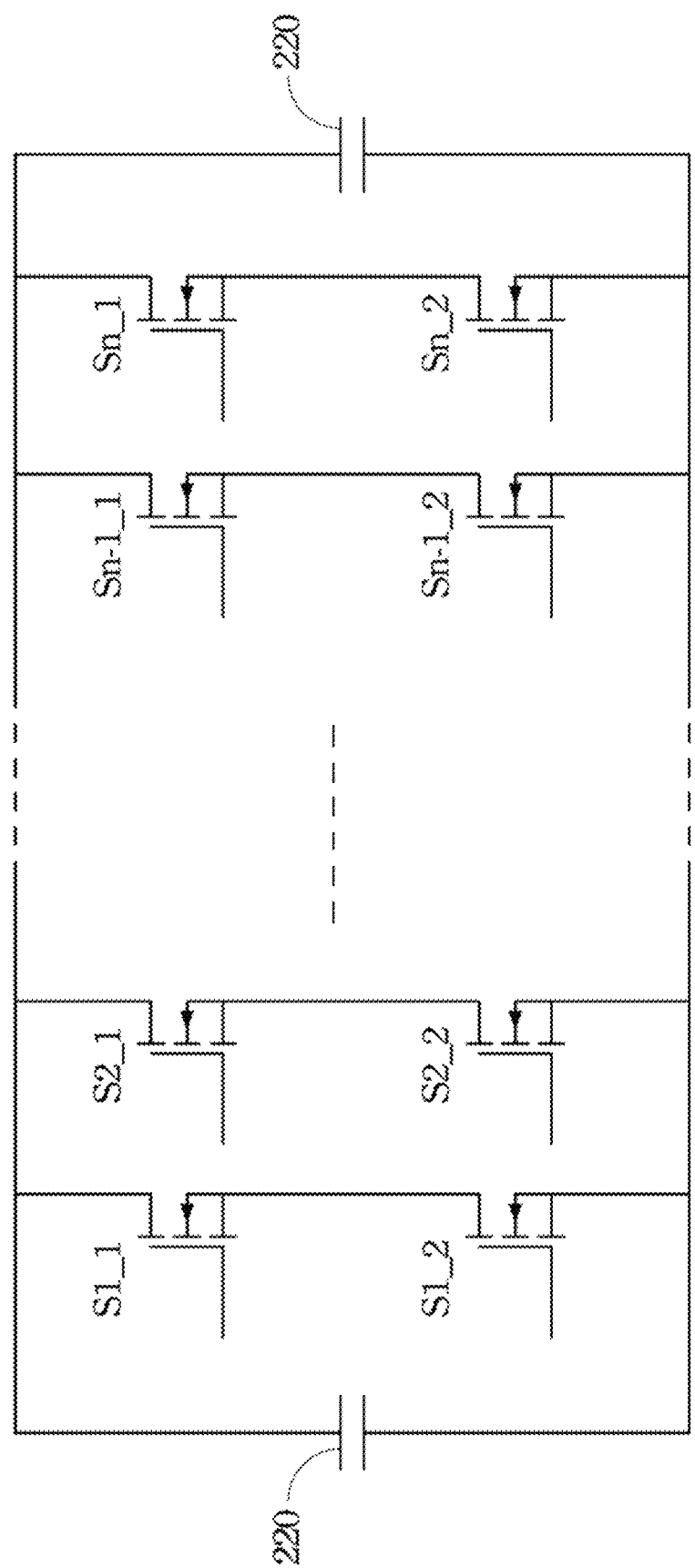
FIG. 2D illustrates a schematic diagram of a switch equivalent circuit of the switch circuit package module as shown in FIG. 2A according to an embodiment of the disclosure.

Next, if the first semiconductor switch unit 212 and the second semiconductor switch unit 214 are decomposed according to cell structure, then the switch circuit package module 200 may be equivalent to a switch equivalent circuit as shown in FIG. 2D. Specifically, according to the number of cells integrated into the chip and a packaged structure, corresponding to the capacitors 220 on both of the left and right sides, millions of the semiconductor cells in the chip may be divided into two cell groups (i.e., the left cell group an the right cell group). Both of the left and right parts may be one complete switch circuit respectively, and each complete switch circuit includes multiple sub high side semiconductor switches (e.g., S1__1 and S2__1) and multiple sub low side semiconductor switches (e.g., S1__2 and S2__2). Therefore, when the semiconductor cells of both of the left and right parts are driven by a gate signal to work simultaneously, the commutation loop may be shortened to about half of the original commutation loop.

In an embodiment, the first semiconductor switch unit 212 and the second semiconductor switch unit 214 each has a source, a drain and a gate. The drain of the first semiconductor switch unit 212 is electrically connected with the source of the second semiconductor switch unit 214. For example, the drain of the first semiconductor switch unit 212 is electrically connected with the source of the second semiconductor switch unit 214, and as shown in FIG. 2D, the connection relationship thereof may be that the drain of the sub low side semiconductor switch (e.g., S1__2 and S2__2) is electrically connected with the source of the sub high side semiconductor switch (e.g., S1__1 and S2__1).

In practice, both of the first semiconductor switch unit 212 and the second semiconductor switch unit 214 may be implemented by a MOSFET chip having a vertical structure. The MOSFET chip having the vertical structure has power electrodes (i.e., the drain and source) and a control electrode (gate), in which the drain and gate are configured on the front of the chip, and the source is configured on the back of the chip. Moreover, the switch circuit package module 200 may take a lead frame as a carrier and may be implemented by employing the form of quad flat no-lead (QFN) package.

Next, the above-mentioned capacitors 220 may be multiple paralleled capacitors, each of which is configured with two terminals, and also may be a single capacitor configured with multiple terminals.

In another embodiment, the above-mentioned capacitor unit (or the capacitors 220 therein) may be configured with two electrodes, and the two electrodes are electrically connected with the source of the first semiconductor switch unit 212 and the drain of the second semiconductor switch unit 214 respectively. Specifically, as shown in FIG. 2A, the capacitor 220 may be configured with two capacitor electrodes 222 and 224. The electrode 222 is electrically connected with the source of the first semiconductor switch unit 212 (e.g., both of the electrode 222 and the source of the first semiconductor switch unit 212 being electrically connected with each other through a conductive layer 216), while the electrode 224 is electrically connected with the drain of the second semiconductor switch unit 214 (e.g., both of the electrode 224 and the drain of the second semiconductor switch unit 214 being electrically connected with each other through a conductive layer 217).

Next, an arrangement direction of the two electrodes of the above-mentioned capacitor unit (or the capacitors 220 therein) and a stacking direction of the first semiconductor switch unit 212 and the second semiconductor switch unit 214 may be identical with or vertical to each other. For example, as shown in FIG. 2A, the arrangement direction of the two electrodes 222 and 224 of the capacitor 220 is mainly identical with the stacking direction of the first semiconductor switch unit 212 and the second semiconductor switch unit 214. However, the capacitor 220 also may be configured horizontally, such that the arrangement direction of the two electrodes 222 and 224 may be perpendicular to the stacking direction of the first semiconductor switch unit 212 and the second semiconductor switch unit 214.

Moreover, the switch circuit package module 200 may further include an intermediate conductive layer 215, a first conductive layer 216 and a second conductive layer 217. The intermediate conductive layer 215 is stacked between the first semiconductor switch unit 212 and the second semiconductor switch unit 214. Both of the first semiconductor switch unit 212 and the above-mentioned capacitor unit (including the capacitors 220) are stacked on the first conductive layer 216 and electrically contacted with the first conductive layer 216. The second conductive layer 217 is stacked on the second semiconductor switch unit 214 and the above-mentioned capacitor unit (including the capacitors 220) and electrically contacted with the second semiconductor switch unit 214 and the above-mentioned capacitor unit (including the capacitors 220).

In operation, as shown in FIG. 2C, the currents I1, I2, . . . , I(n−1), In of the commutation loops respectively flow from the capacitors 220 at both sides through the second conductive layer 217, the second semiconductor switch unit 214, the intermediate conductive layer 215, the first semiconductor switch unit 212, the first conductive layer 216 and back to the capacitors 220.

In an embodiment, the intermediate conductive layer 215 may act as a switch point terminal. The first conductive layer 216 may act as a negative input terminal and be implemented by the lead frame. The second conductive layer 217 may act as a positive input terminal, and this positive input terminal may be led out onto the lead frame for being connected with an external circuit. In another embodiment, the above-mentioned capacitor unit (including the capacitors 220) may be soldered between the first conductive layer 216 and the second conductive layer 217 directly through the conductor (e.g., a copper sheet).

On the other hand, the capacitors 220 included in the above-mentioned capacitor unit may be symmetrically arranged at both sides of the stacked first and second semiconductor switch units 212 and 214. For example, in FIG. 2B, the capacitors 220 are respectively configured on both of the left and right sides of the switch circuit package module 200 and arranged symmetrically to each other.

Furthermore, the switch circuit package module 200 may further include a drive connecting line 230. The drive connecting line 230 is connected with the second semiconductor switch unit 214 by a wire bonding manner (as shown in FIG. 2A). In an embodiment, the drive connecting line 230 may be configured in the center of the second semiconductor switch unit 214, away from input ends of the capacitors. In practice, the drive connecting line 230 may be connected to a corresponding lead on the lead frame through the wire bonding. It should be noted that, the above is only a brief and schematic description, and in actual, the switch circuit package module 200 also includes another drive connecting line connected with the first semiconductor switch unit 212, and the specific connecting mode of the drive connecting line may be referred to FIG. 6.

Figure 3A:
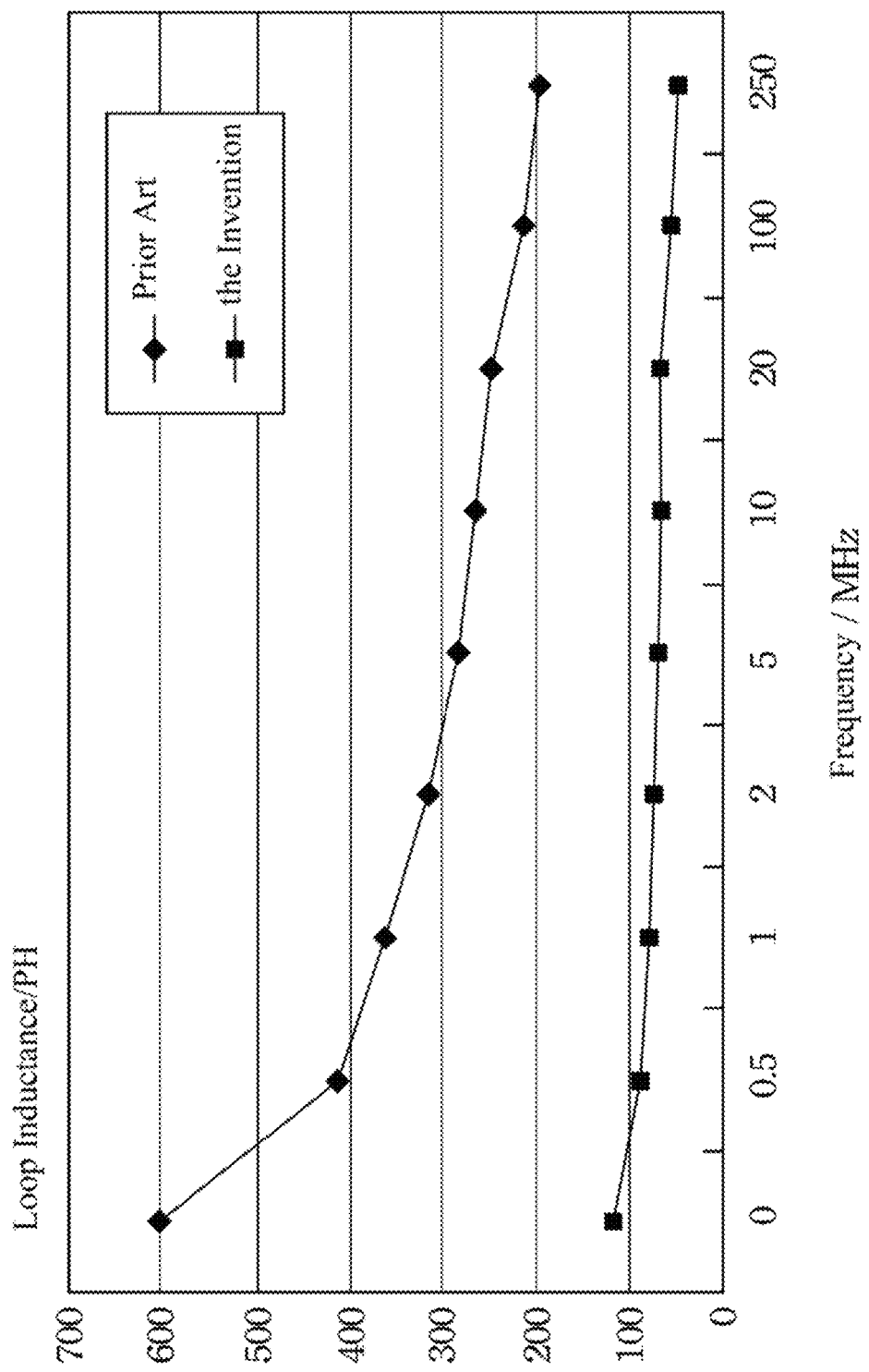
FIG. 3A illustrates a relation curve comparative diagram between frequencies and loop inductances of a switch circuit package module respectively using the embodiment of the disclosure and the prior art.
Figure 3B:
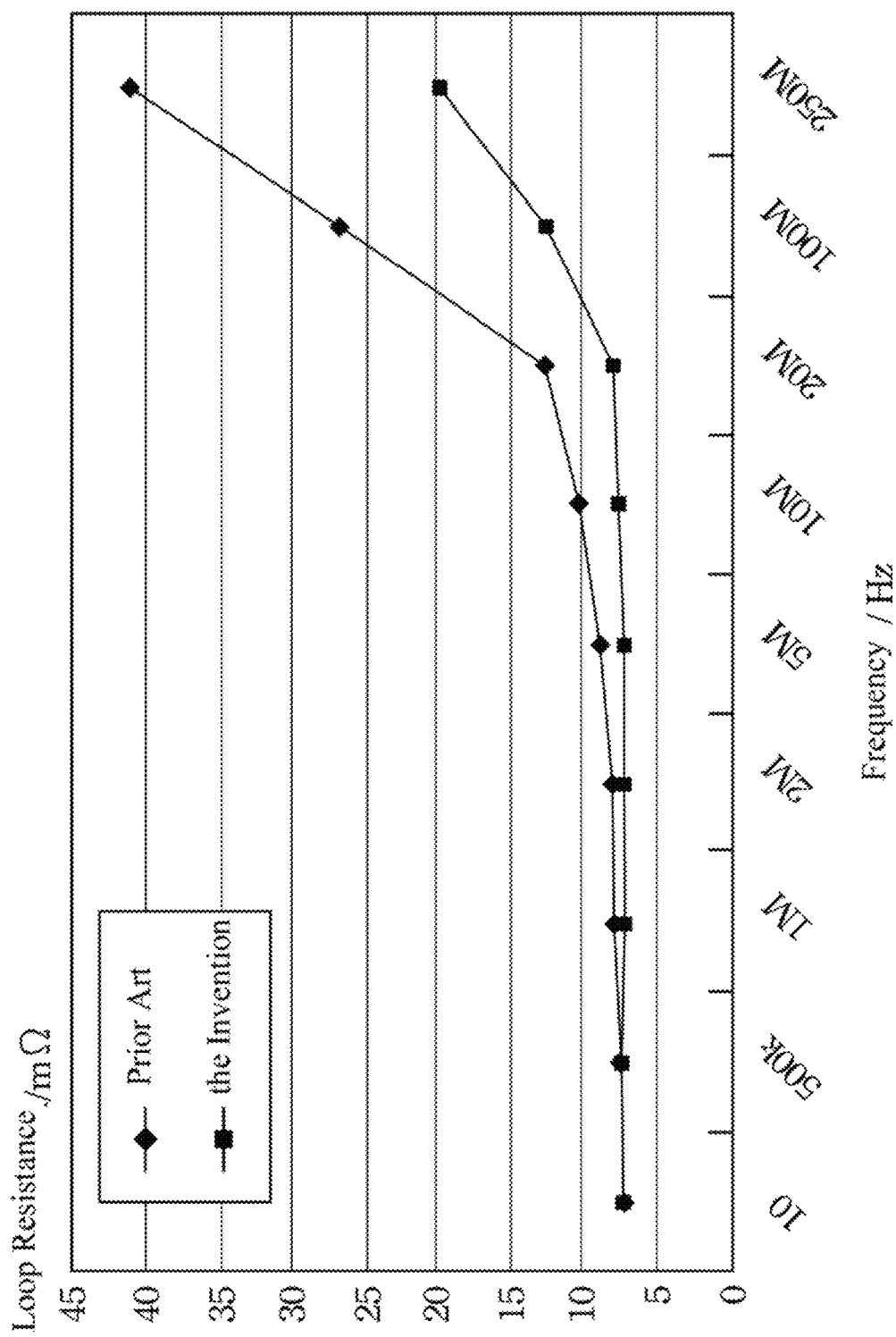
FIG. 3B illustrates a relation curve comparative diagram between frequencies and loop switch-on resistances of a switch circuit package module respectively using the embodiment of the disclosure and the prior art.

FIG. 3A illustrates a relation curve comparative diagram between the frequencies and the loop inductances of the switch circuit package module respectively using the embodiments of the disclosure and the prior art. It can be seen from FIG. 3A that, compared to the prior art, the loop inductances of the switch circuit package module using the embodiments of the disclosure may be reduced by about 40%. FIG. 3B illustrates a relation curve comparative diagram between the frequencies and the loop switch-on resistances of the switch circuit package module respectively using the embodiments of the disclosure and the prior art. It can be seen from FIG. 3B that, compared to the prior art, the loop switch-on resistances of the switch circuit package module using the embodiments of the disclosure may become smaller.

In view of the above, the switch circuit package module 200 shown in FIGS. 2A and 2B mainly has the following advantages:

1) a stack mode is employed in the semiconductor switch chip, such that the distance between the semiconductor switch chips may be reduced;

2) the capacitor is wireless and may be soldered with the semiconductor switch chip through the conductor (e.g., the copper sheet) directly, so as to reduce the distance between the semiconductor switch and the capacitor;

3) the capacitors are soldered at both sides of the semiconductor switch chip, such that the number of paralleled capacitors is easily increased, so as to increase the number of the commutation loops and reduce the distance which the current flows between the semiconductor switch and the capacitor;

4) the current on the switch circuit is distributed uniformly, such that the utilization of the switch is effectively enhanced; and 5) the drive connecting line may be configured in the central of the semiconductor switch chip, away from the input ends of the capacitors, so as to increase the drive speed of the semiconductor switch.

On the other hand, in the case that input capacitors are integrated into the switch circuit package module, when a harmonic frequency of a loop loop2 formed by external parasitic inductances and integrated capacitors is close to a frequency band having a larger amplitude in the pulse current of a loop loop1 in the switch circuit package module, a resonance may be generated in the circuit, and thus it is needed to select an appropriate capacitance according to parameters of parasitic components.

Figure 3C:
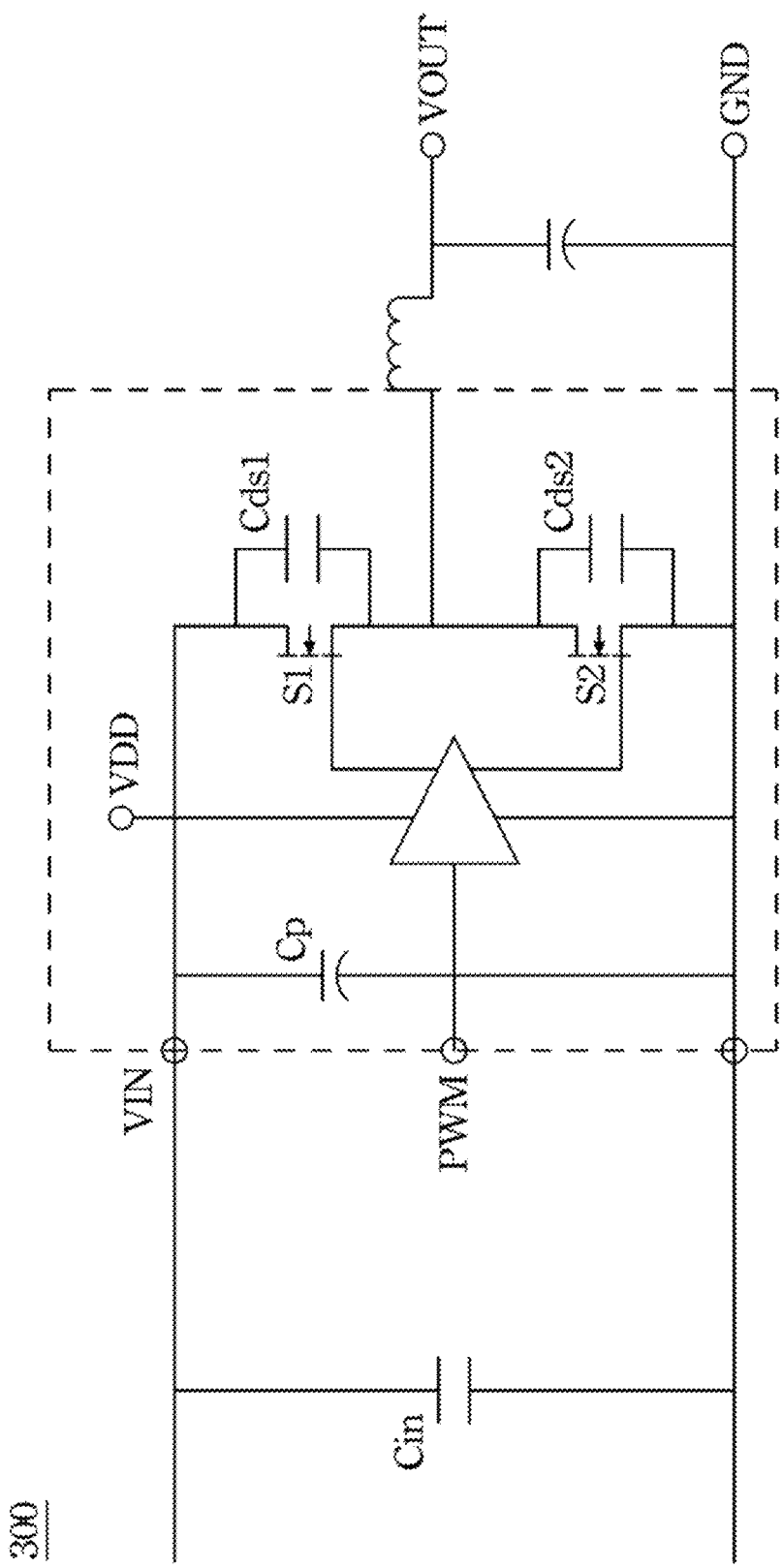
FIG. 3C illustrates a schematic diagram of a conversion circuit.

FIG. 3C illustrates a schematic diagram of a conversion circuit. A conversion circuit 300 includes a switch circuit package module 310 (the equivalent circuit of the switch circuit package module 310 shown in FIG. 3C) and an external capacitor Cin. The external capacitor Cin is electrically connected to the switch circuit package module 310, and the switches S1 and S2 and an integrated capacitor Cp are integrated into the switch circuit package module 310, while the switches S1 and S2 are respectively connected to parasitic capacitors Cds1 and Cds2 of the semiconductor chip. When the capacitance of the integrated capacitor Cp within the switch circuit package module 310 is smaller, it is needed to configure the external capacitor Cin outside the switch circuit package module 310.

Figure 3D:
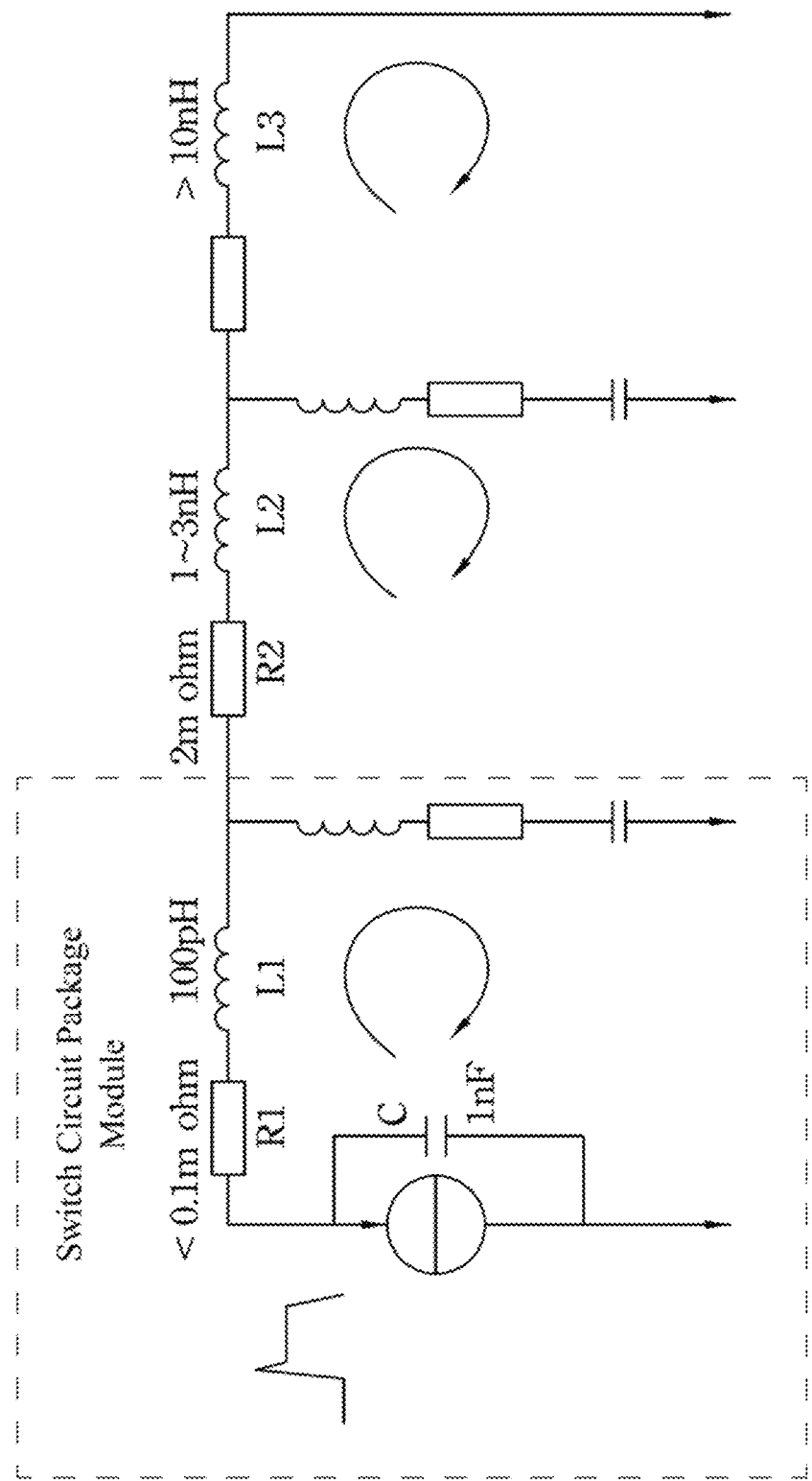
FIG. 3D illustrates a schematic equivalent circuit diagram including a switch circuit package module and an external capacitor.
Figure 3E:
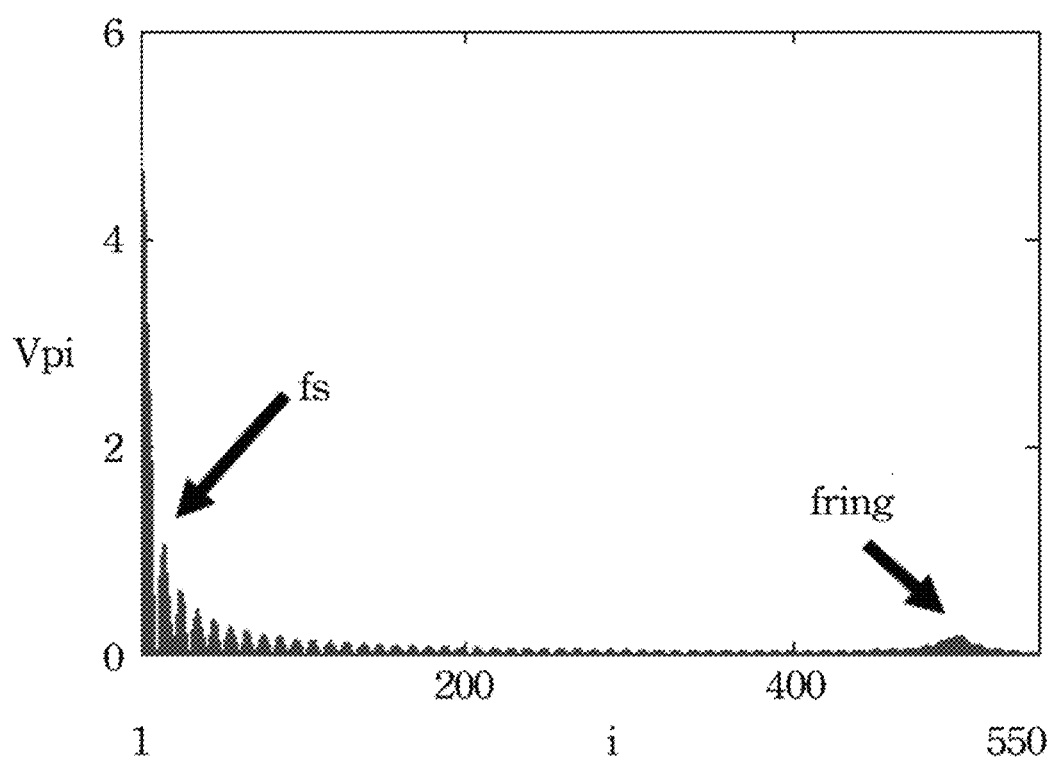
FIG. 3E illustrates a schematic change diagram of a switch frequency and a pulse current oscillation frequency.

For a circuit connection shown in FIG. 3C, in the case that the semiconductor chip is operable to generate a pulse current and a voltage jump and the semiconductor chip is equivalent to a pulse current source, as shown in FIG. 3D, a schematic equivalent circuit diagram of the switch circuit package module and the external capacitor can be obtained. Next, FIG. 3E illustrates a schematic diagram of a frequency domain decomposition result. As shown in FIG. 3E, by performing the Fourier-decomposition for the pulse current, it can be found that at both the switch frequency fs and the frequency around fring formed by an abrupt change and oscillation of the pulse current, during switch-on (switch-off) time, the Fourier-decomposition for pulse current may have larger amplitude.

Figure 3F:
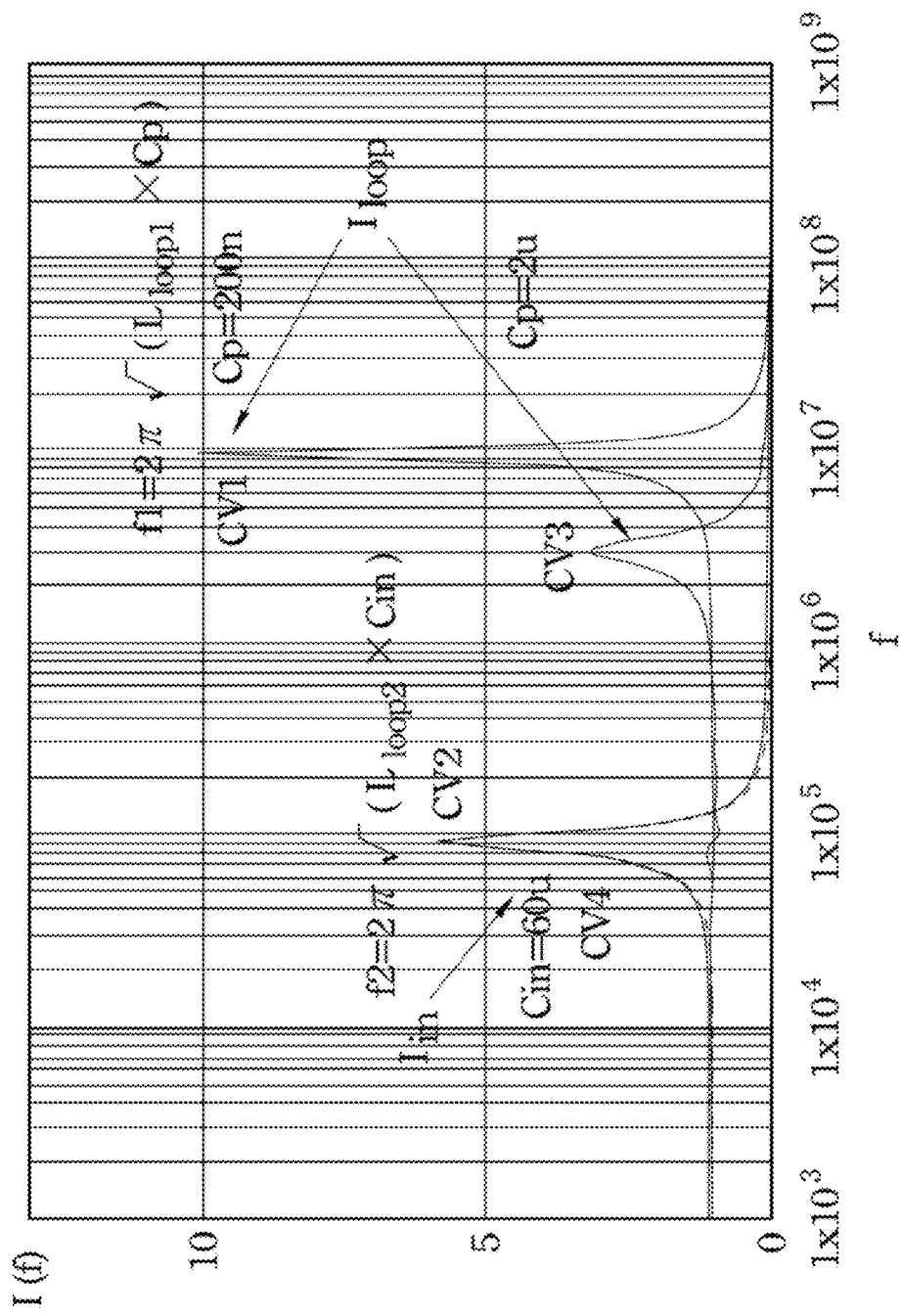
FIG. 3F illustrates a schematic change diagram of a frequency domain analysis result.

Since a larger parasitic inductance exists between the external capacitor Cin and the internal integrated capacitor Cp, it is easy to generate the resonance, and meanwhile the resonance may also be generated between the external capacitor Cin and the input parasitic inductance. By performing a frequency domain analysis for an oscillating loop of the equivalent circuit, a frequency domain relation of a ratio of the loop current to the pulse current can be obtained, and the frequency domain analysis result is shown in FIG. 3F. When Cp=200 nF and Cin=60 µF, the resulted frequency domain analysis result is shown as curves CV1 and CV2; when Cp=2 µF and Cin=60 µF, the resulted frequency domain analysis result is shown as curves CV3 and CV4, in which the curves CV2 and CV4 are overlapped roughly.

Therefore, when a technical means with the external capacitor Cin is employed to design the capacitance of the integrated capacitor Cp, it should be avoided that the pulse current generates the resonance in the loops related to the external capacitor Cin. Therefore, for a harmonic frequency f1 of the loop formed by the external capacitor Cin and the integrated capacitor Cp, the switch frequency fs, and the frequency fring formed by the abrupt change and oscillation of the pulse current at the switch-on (switch-off) time, the following relation should be satisfied among the three:

$$fs << f1 < fring.$$

Therefore, the loop loop1 shown in FIG. 3D can be reduced to cut down a voltage peak, and meanwhile the undesired oscillation cannot be formed in the loop2.

Moreover, the loop formed by the external capacitor Cin and the input inductance also needs to avoid the oscillation, and thus the following relation is also satisfied by a harmonic frequency f2 of the loop:

$$f2 << fs.$$

Based on the above-mentioned design, an essential function of the built-in integrated capacitor Cp aims to decrease the loop inductance influence during the switch process, reduce the switch loss and decrease the voltage peak of the chip resulted from the oscillation between the loop inductance and the capacitor of the chip itself. In order to achieve this purpose, the capacitance of the built-in integrated capacitor Cp is also required to be larger the capacitor of the chip itself significantly, so as to effectively decrease the loop1.

Figure 3G:
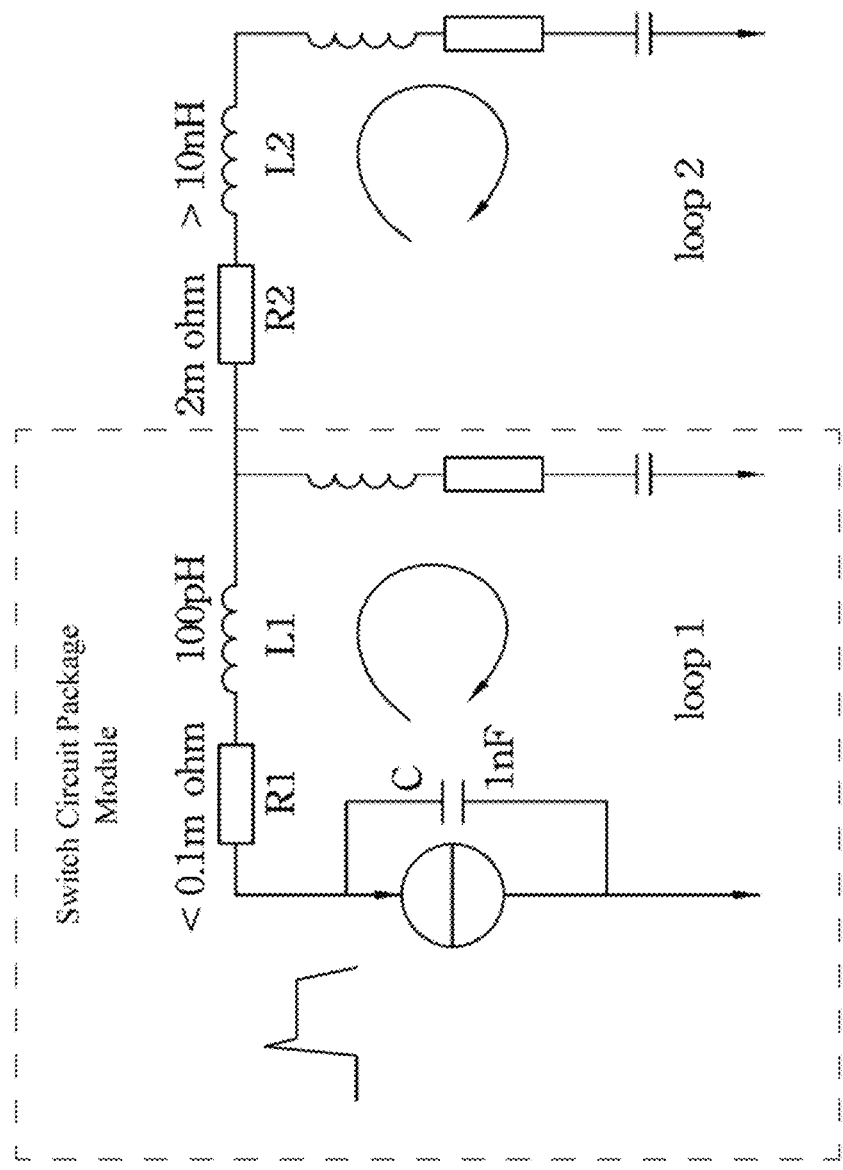
FIG. 3G illustrates a schematic equivalent circuit diagram including a switch circuit package module without an external capacitor.

On the contrary, when the capacitance of the integrated capacitor Cp within the switch circuit package module is sufficiently large, the external capacitor placed adjacent to the module is not needed. Alternatively, since an AC harmonic is filtered to be very small by a sufficiently large capacitor, a probability that an additional capacitor generates the resonance is reduced to be very low, so as to make it easier to be used. When the external capacitor Cin adjacent to the module is not required, a schematic equivalent circuit diagram of the switch circuit package module without the external capacitor as shown in FIG. 3G can be obtained.

Figure 3H:
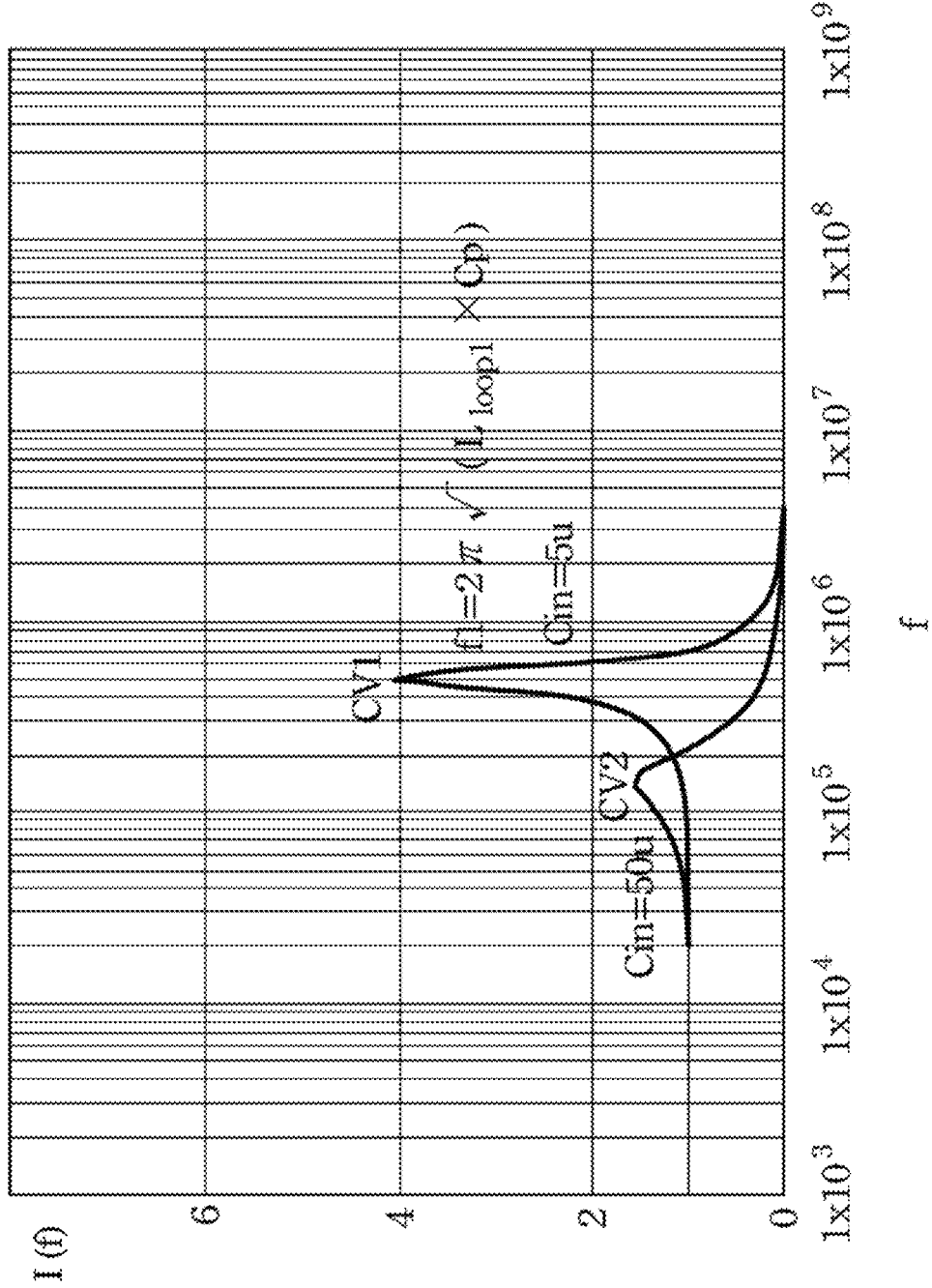
FIG. 3H illustrates a schematic change diagram of another frequency domain analysis result.

Since the resonance is generated between the built-in integrated capacitor Cp and the loop loop2 formed by the input parasitic inductances, by performing the frequency domain analysis for the oscillating loop of the equivalent circuit, the frequency domain relation of the ratio of the loop current to the pulse current can be obtained, and the frequency domain analysis result is shown in FIG. 3H. When Cp=5 µF, the resulted frequency domain analysis result is shown as the curve CV1; when Cp=50 µF, the resulted frequency domain analysis result is shown as the curve CV2.

Therefore, when the technical means with a larger built-in capacitor is employed to design the capacitance of the integrated capacitor, a built-in capacitance large enough should be used, such that the following relation is satisfied by the harmonic frequency f1 of the loop loop2 formed by the built-in integrated capacitor and the input parasitic inductances:

$$f1 << fs.$$

Figure 4A:
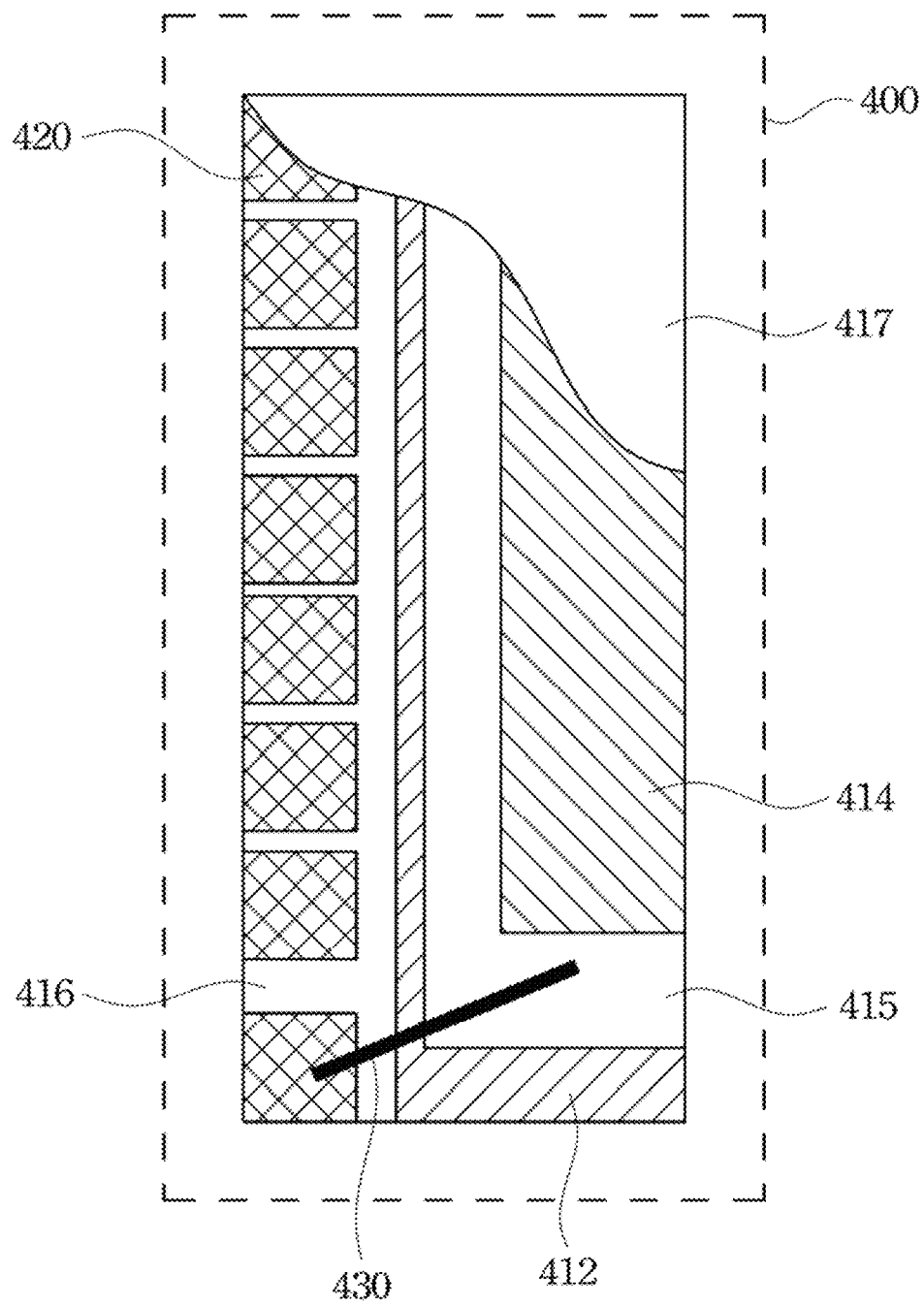
FIG. 4A is a schematic top diagram illustrating a switch circuit package module according to a second embodiment of the disclosure.

FIG. 4A is a schematic top diagram illustrating a switch circuit package module according to a second embodiment of the disclosure. As shown in FIG. 4A, a switch circuit package module 400 includes a first semiconductor switch unit 412, a second semiconductor switch unit 414, an intermediate conductive layer 415, a first conductive layer 416, a second conductive layer 417, a drive connecting line 430 and the capacitor unit (e.g., including a plurality of capacitors 420). All the configurations of the switch circuit package module 400 are similar to those of the switch circuit package module 200 as shown in FIGS. 2A and 2B, which are not illustrated any further herein. Compared to FIG. 2B, in the case that the switch circuit package module 400 is fabricated with a chip pattern, the chip may be lengthened longitudinally or laterally, while the capacitor unit (e.g., including capacitors 420) may be configured along a lengthened side of the switch structure (including the first semiconductor switch unit 412 and the second semiconductor switch unit 414) adjacent to the switch structure.

Figure 4B:
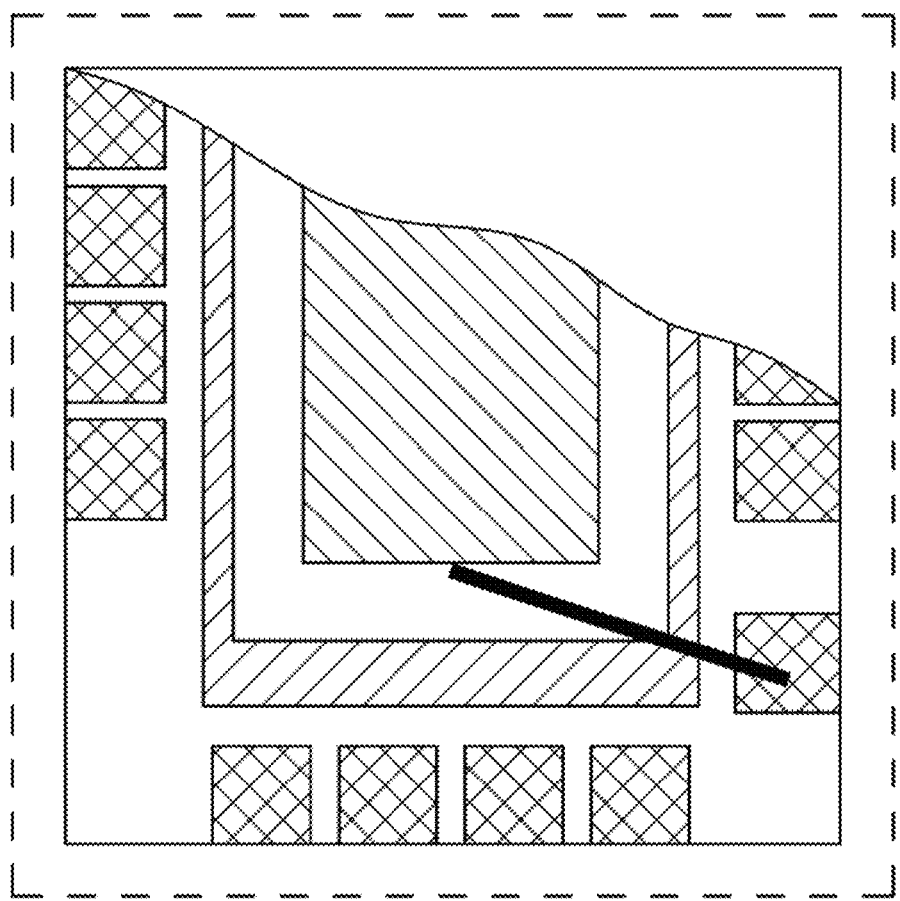
FIG. 4B is a schematic top diagram illustrating a switch circuit package module according to a third embodiment of the disclosure.

FIG. 4B is a schematic top diagram illustrating a switch circuit package module according to a third embodiment of the disclosure. As shown in FIG. 4B, in the above-mentioned switch circuit package modules 200 or 400, the capacitors included in the capacitor unit may be configured along a third side (a downside of the switch structure as shown in FIG. 4B) of the switch structure adjacent to the switch structure. The third side of the switch structure is different from the above-mentioned both opposing sides of the switch structure.

Figure 4C:
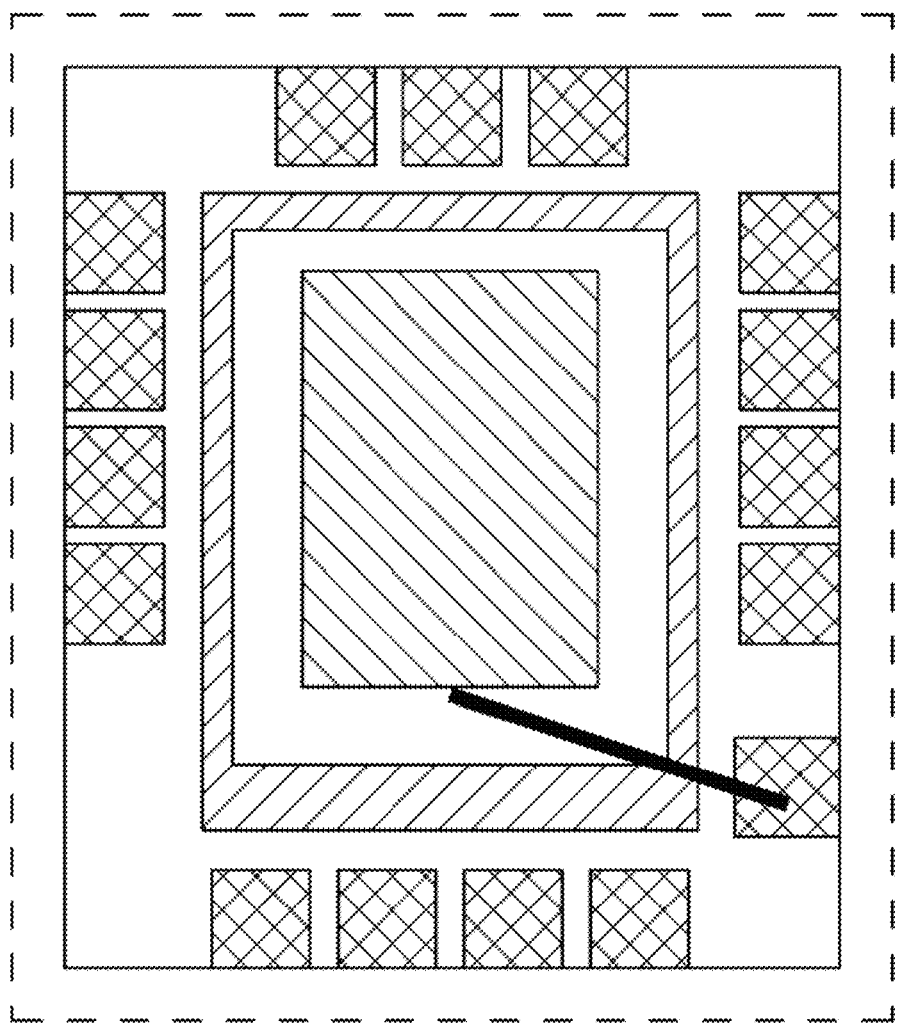
FIG. 4C is a schematic top diagram illustrating a switch circuit package module according to a fourth embodiment of the disclosure.

FIG. 4C is a schematic top diagram illustrating a switch circuit package module according to a fourth embodiment of the disclosure. As shown in FIG. 4C, in the above-mentioned switch circuit package modules 200 or 400, the capacitors included in the capacitor unit may be configured further along a fourth side of the switch structure opposing to the above-mentioned third side; i.e., the capacitors may be symmetrically arranged and configured along a periphery of the above-mentioned switch circuit package modules 200 or 400.

In view of the above, the above-mentioned capacitor unit may not only be configured on any two sides of the front side, back side, left side and right side of the switch structure (including the first semiconductor switch unit and the second semiconductor switch unit), but also be configured selectively on any three sides thereof according to actual requirements, or even be configured at the periphery of the switch structure. Furthermore, the above-mentioned capacitor unit may include capacitors having standard hexahedron form, and abnormal-shaped capacitors (e.g., the capacitors having a shape such as L shape and mouth shape) may also be employed. Next, in the case that the switch circuit package module is fabricated with the chip pattern, even if the chip is not rectangle, as long as the above-mentioned capacitor unit is configured on a side face of the switch structure, the switch circuit package module can have the effect similar to the aforementioned descriptions.

Figure 5A:
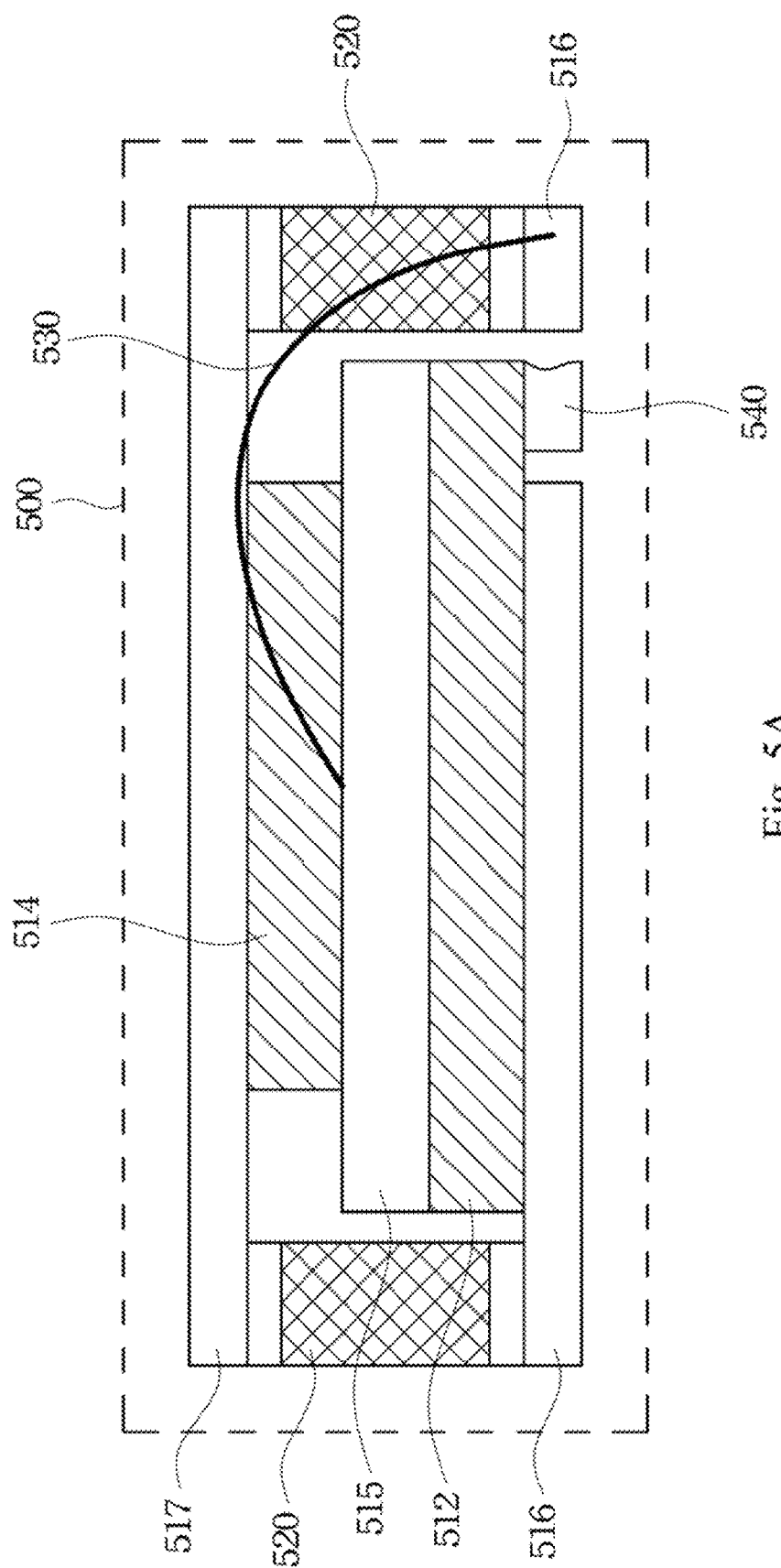
FIG. 5A is a schematic cross-section diagram illustrating a switch circuit package module according to a fifth embodiment of the disclosure.

FIG. 5A is a schematic cross-section diagram illustrating a switch circuit package module according to a fifth embodiment of the disclosure. As shown in FIG. 5A, a switch circuit package module 500 includes a first semiconductor switch unit 512, a second semiconductor switch unit 514, an intermediate conductive layer 515 (e.g., configured as the switch point terminal), a first conductive layer 516 (e.g., configured as the negative input terminal), a second conductive layer 517 (e.g., configured as the positive input terminal), a drive connecting line 530 and the capacitor unit (including at least two capacitors 520). The configuration and implementation of the switch circuit package module 500 are similar to the embodiment shown in FIG. 2A, which are not illustrated any further herein.

Compared to FIG. 2A, in this embodiment, the first semiconductor switch unit 512 is a half bridge high side semiconductor switch chip, and the second semiconductor switch unit 514 is a half bridge low side semiconductor switch chip. In practice, both of the first semiconductor switch unit 512 and the second semiconductor switch unit 514 may respectively be implemented by the MOSFET chip with the vertical structure. The gate and the source of the MOSFET chip employed by the first semiconductor switch unit 512 are integrated on the same face of the chip, while the gate and the drain of the MOSFET chip employed by the second semiconductor switch unit 514 are integrated on the same face of the chip and the source of the MOSFET chip is located at the other opposing face of the chip. Next, the corresponding drive connecting line of the first semiconductor switch unit 512 may be led out by a corresponding output lead 540 on the lead frame.

For the embodiment shown in FIG. 5A, by using this switch circuit package module 500 it can be avoided that, when a relative large chip is employed by the half bridge low side switch and a relative small chip is employed by the half bridge high side switch, the relative large switch chip is overlapped above the relative small switch chip, such that the drive connecting line on the small chip is difficult to be led out and the process is difficult to be controlled, and the like.

Figure 5B:
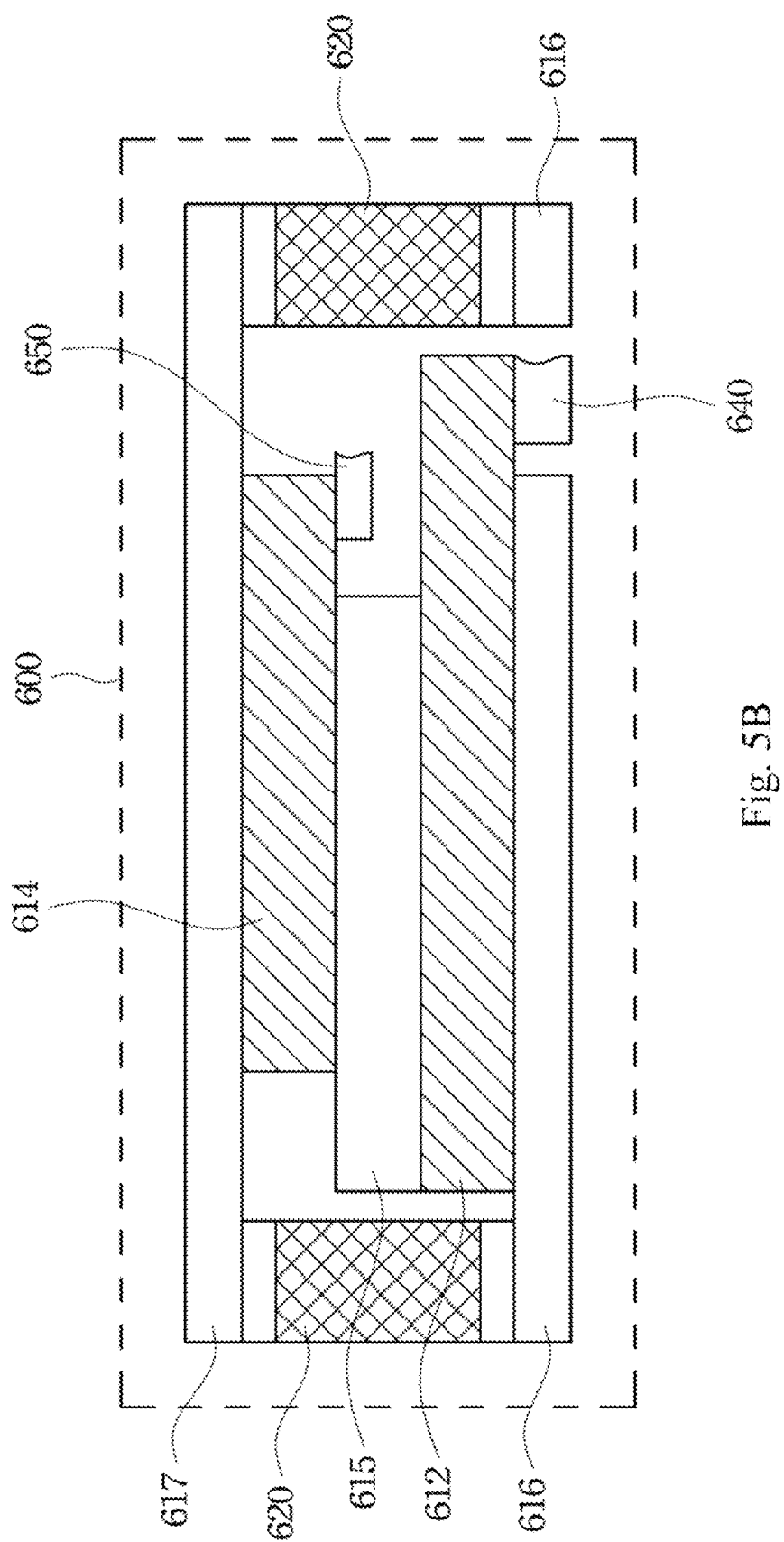
FIG. 5B is a schematic cross-section diagram illustrating a switch circuit package module according to a sixth embodiment of the disclosure.

FIG. 5B is a schematic cross-section diagram illustrating a switch circuit package module according to a sixth embodiment of the disclosure. As shown in FIG. 5B, a switch circuit package module 600 includes a first semiconductor switch unit 612, a second semiconductor switch unit 614, an intermediate conductive layer 615 (e.g., as the switch point terminal), a first conductive layer 616 (e.g., as the negative input terminal), a second conductive layer 617 (e.g., as the positive input terminal) and the capacitor unit (including at least two capacitors 620). The configuration and implementation of the switch circuit package module 600 are similar to the embodiment shown in FIG. 5A, which are not illustrated any further herein.

In this embodiment, the switch circuit package module 600 further includes a drive lead 650. The drive lead 650 and the intermediate conductive layer 615 are arranged side by side and located between the first semiconductor switch unit 612 and the second semiconductor switch unit 614. The drive lead 650 is electrically contacted with the second semiconductor switch unit 614, to serve as a drive line led out from the second semiconductor switch unit 614. Moreover, an output lead 640 may also be led out similarly through the lead frame, to serve as the drive connecting line of the first semiconductor switch unit 612.

In an embodiment, the above-mentioned control pin 650 may be implemented by a partially etched lead frame, and the functions of necessary insulation and electrical connection with the corresponding lead on the lead frame are achieved by the partially-etched lead frame. In another embodiment, the control pin 650 also may be implemented without the partially-etched lead frame, but implemented by performing a shift of a certain position for the first semiconductor switch unit 612 and the second semiconductor switch unit 614.

Figure 5C:
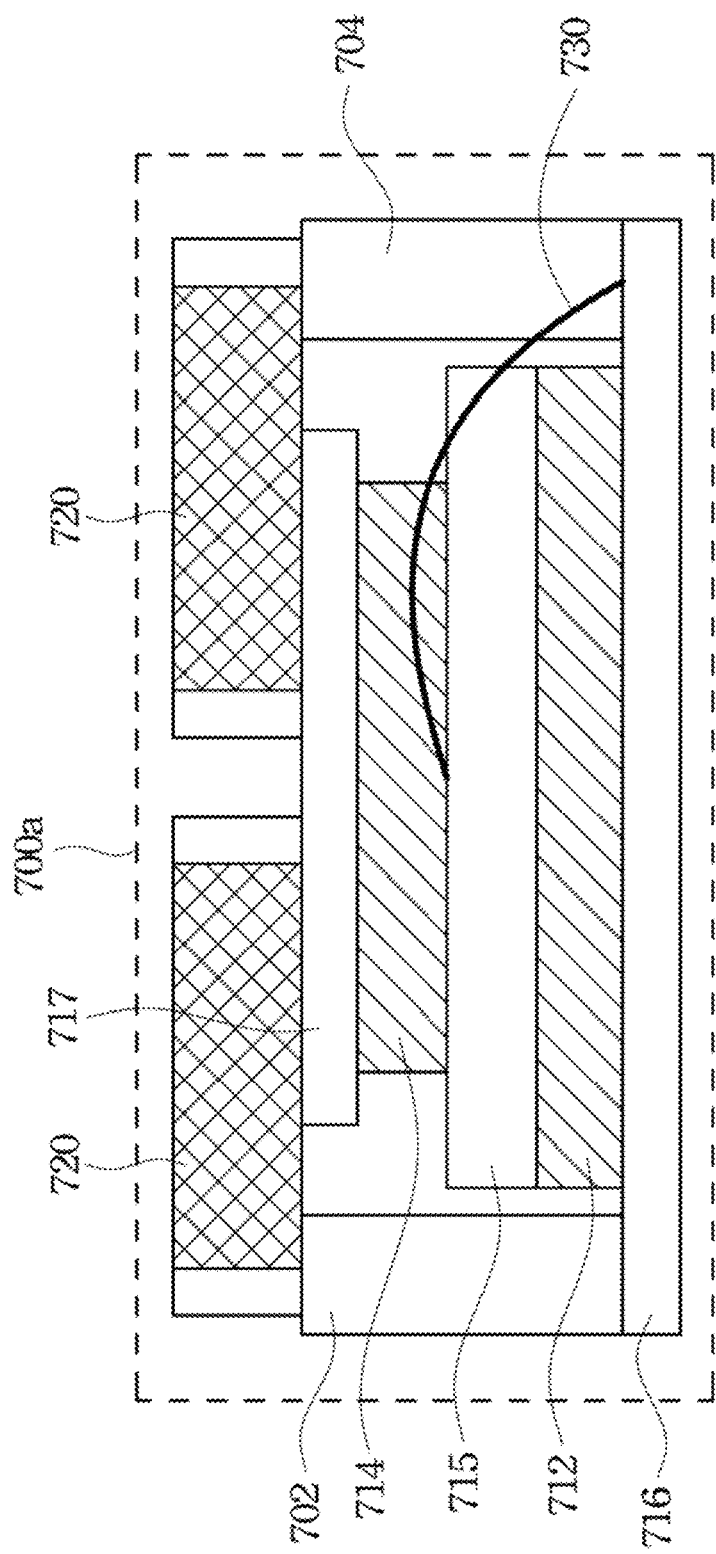
FIG. 5C is a schematic cross-section diagram illustrating a switch circuit package module according to a seventh embodiment of the disclosure.

FIG. 5C is a schematic cross-section diagram illustrating a switch circuit package module according to a seventh embodiment of the disclosure. Compared to FIG. 2A, the capacitor unit (e.g., including at least two capacitors 720) of this embodiment may further be stacked on a stacked package structure formed by a first semiconductor switch unit 712 and a second semiconductor switch unit 714. Specifically, as shown in FIG. 5C, a switch circuit package module 700a may further include capacitor connecting terminals 702 and 704. The capacitor connecting terminals 702 and 704 are configured at both sides of a stacked structure of the first semiconductor switch unit 712 and the second semiconductor switch unit 714. Capacitors 720 at both sides of the above are electrically contacted with the capacitor connecting terminals 702 and 704 respectively and stacked on the structure formed by the first semiconductor switch unit 712 and the second semiconductor switch unit 714.

Next, the capacitor connecting terminals 702 and 704 may be respectively connected between the electrodes of the capacitors 720 and a first conductive layer 716. Two electrodes of the capacitor 720 are respectively connected to the capacitor connecting terminal 702 (or 704) and a second conductive layer 717, such that the capacitors 720 may be equivalently connected between the first conductive layer 716 and the second conductive layer 717.

Figure 6:
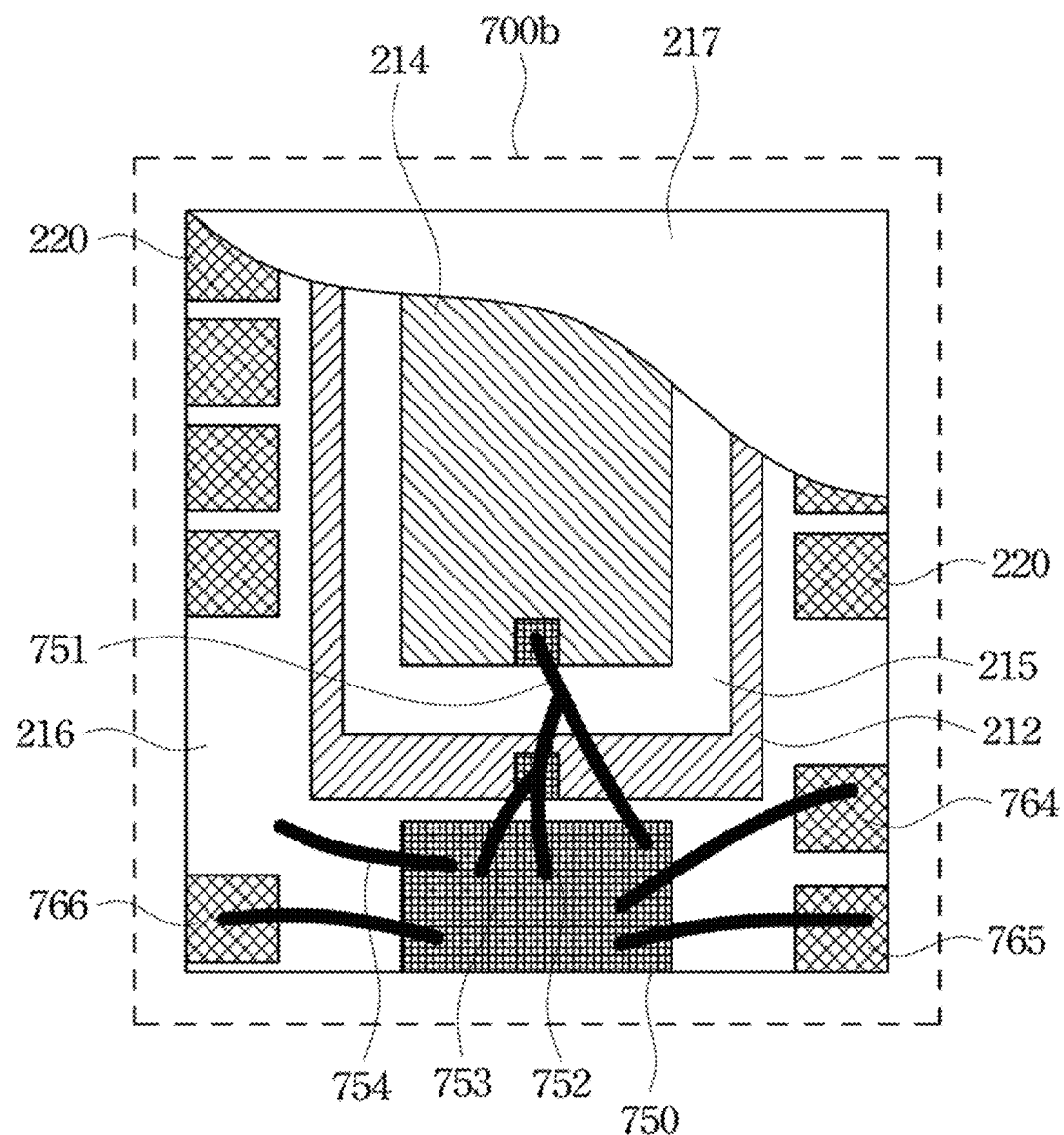
FIG. 6 is a schematic top diagram illustrating a switch circuit package module according to an eighth embodiment of the disclosure.

FIG. 6 is a schematic top diagram illustrating a switch circuit package module according to an eighth embodiment of the disclosure. Compared to FIG. 2B, a switch circuit package module 700b in this embodiment may further include a drive circuit unit 750. The drive circuit unit 750 is disposed at one side of the stacked package structure formed by the first semiconductor switch unit 212 and the second semiconductor switch unit 214, and electrically connected to the first semiconductor switch unit 212 and the second semiconductor switch unit 214. In this embodiment, the drive circuit unit 750 may be electrically connected to drive signal input terminals 764, 765 and 766. The drive circuit unit 750 may be electrically connected with the second semiconductor switch unit 214, the intermediate conductive layer 215, the first semiconductor switch unit 212 and the first conductive layer 216 respectively through drive connecting lines 751, 752, 753 and 754, such that the drive circuit unit 750 may be operable to control the first semiconductor switch unit 212 and the second semiconductor switch unit 214.

Both of the above-mentioned first and second semiconductor switch units may also be integrated together with the single MOSFET chip having a lateral structure except of being implemented with the MOSFET chip having the vertical structure, in which the gate, source and drain are integrated onto the same face of the MOSFET chip. Two semiconductor switches (MOSFET) of the half bridge high side and low side are integrated into the same chip by employing this kind of monolithic integration technology, such that the integration level between the two semiconductor switches (MOSFET) is enhanced, and thus the electrical performance of the system may be enhanced by a reasonable layout of the chip leads.

Figure 7A:
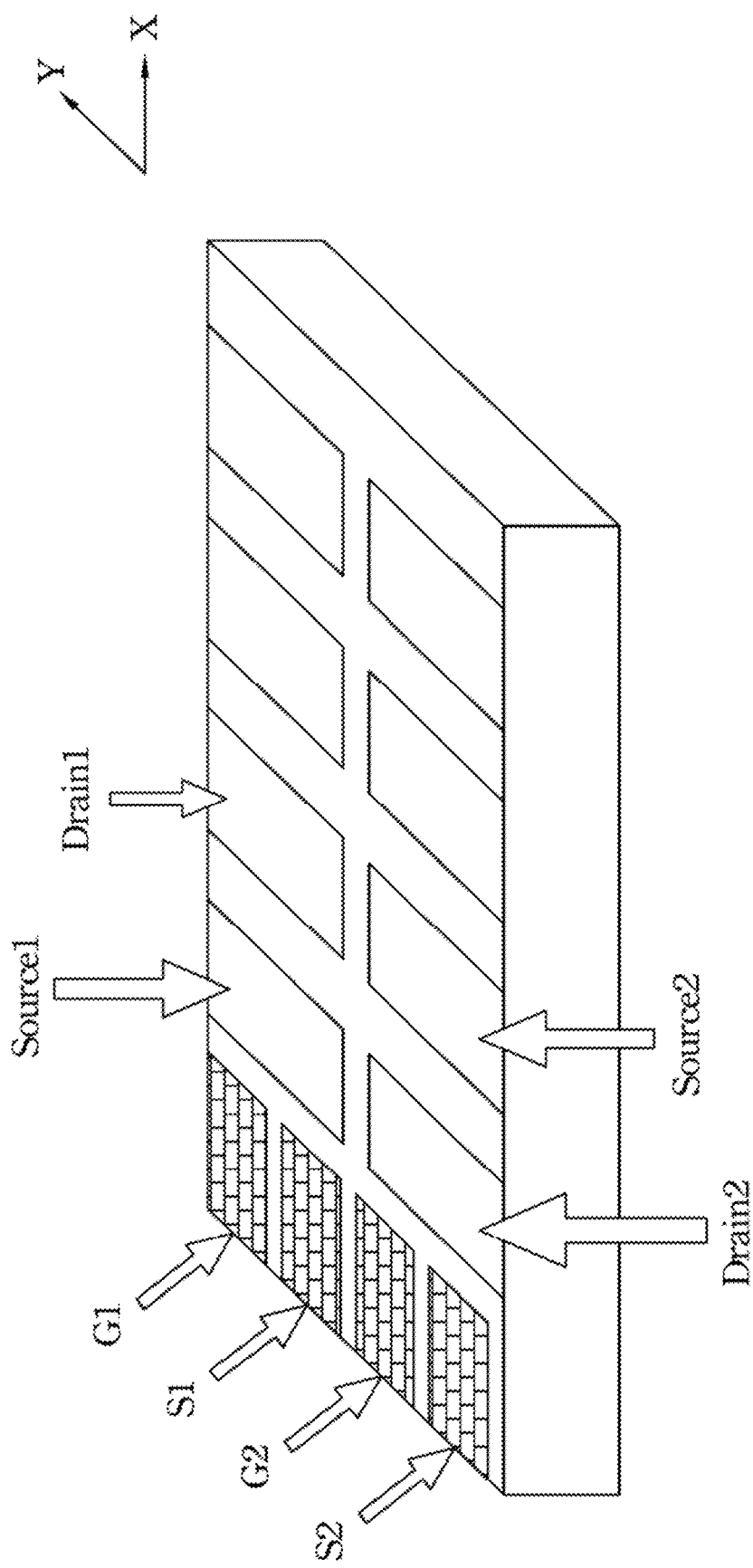
FIG. 7A is a schematic diagram illustrating a switch circuit package structure having a matrix lead structure.

FIG. 7A is a schematic diagram illustrating a switch circuit package structure having a matrix lead structure. As shown in FIG. 7A, the gate is located on the left side of the chip as shown. Gates G1 and S1 are the gates of the half bridge low side semiconductor switch, and gates G2 and S2 are the gates of the half bridge high side semiconductor switch. The drains and sources of the two semiconductor switches are configured on the right side of the chip as shown with a matrix layout, in which Drain1 and Source1 are the drain and source of the half bridge low side semiconductor switch respectively, and Drain2 and Source2 are the drain and source of the half bridge high side semiconductor switch respectively.

FIG. 7B is a schematic diagram illustrating a switch circuit package structure having a staggered lead structure. As shown in FIG. 7B, the gate is located on the left side of the chip as well. Gates G1 and S1 are the gates of the half bridge low side semiconductor switch, and gates G2 and S2 are the gates of the half bridge high side semiconductor switch. The drains and sources of the two semiconductor switches are configured on the right side of the chip with a staggered layout, in which the drain Drain2 and the source Source1 are configured on the right side of the chip with the staggered layout, while the drain Drain1 and the source Source2 are integrated into the same lead.

The above-mentioned first and second semiconductor switch units may be integrated into the same chip with the above-mentioned matrix layout or staggered layout according to actual requirements. For the purpose of clear illustration hereinafter, the switch circuit package module with the staggered lead structure is mainly exemplified for illustration, but those of skills in the art can still make an implementation with the switch circuit package structure with the matrix lead structure according to the above-mentioned disclosure, without departing from the spirit and scope of the disclosure, which is not limited to the following description.

Figure 8A:
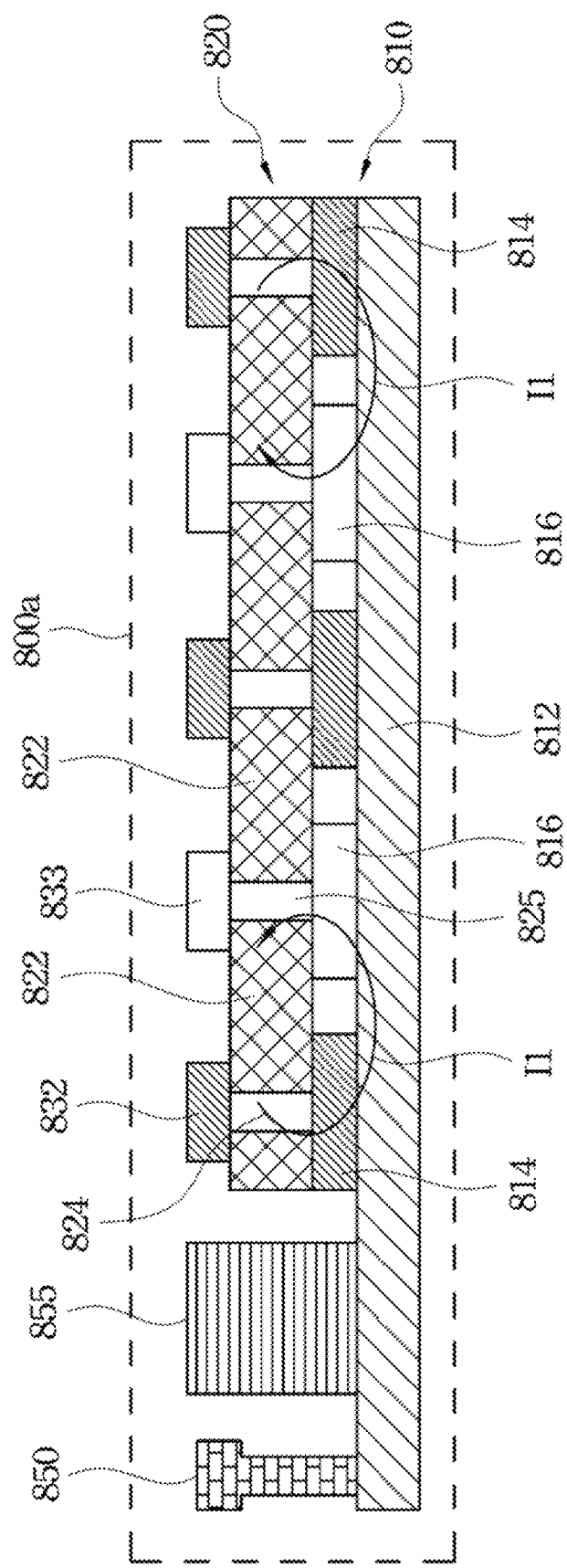
FIG. 8A is a schematic cross-section diagram illustrating a switch circuit package module with a staggered lead structure according to a ninth embodiment of the disclosure.
Figure 8B:
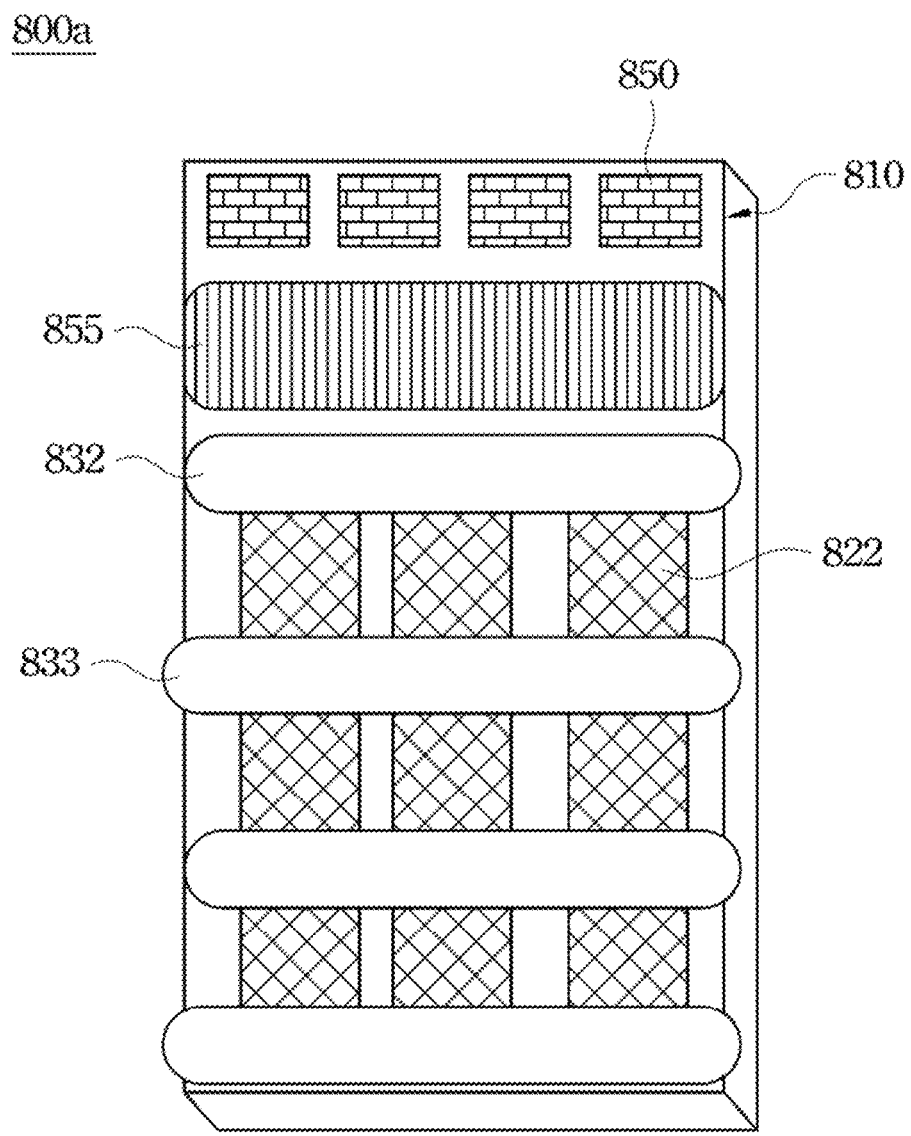
FIG. 8B is a schematic top diagram illustrating a switch circuit package module with the staggered lead structure as shown in FIG. 8A according to an embodiment of the disclosure.

FIG. 8A is a schematic cross-section diagram illustrating a switch circuit package module with the staggered lead structure according to a ninth embodiment of the disclosure. FIG. 8B is a schematic top diagram illustrating a switch circuit package module with the staggered lead structure as shown in FIG. 8A according to an embodiment of the disclosure. As shown in FIGS. 8A and 8B, a switch circuit package module 800a includes a semiconductor switch unit 810 and a capacitor unit 820. Similar to the aforementioned descriptions, the semiconductor switch unit 810 includes a plurality of sub micro-switch elements (i.e., the semiconductor switch unit 810 including multiple cells, each of which or several ones of which may be equivalent to one sub micro-switch element). Next, the capacitor unit 820 (e.g., including multiple capacitors 822) is stacked on a surface of the semiconductor switch unit 810, such that the impedances of multiple commutation loops between the capacitor unit 820 and the above-mentioned sub micro-switch elements are close to or the same with each other.

Specifically, as shown in FIG. 8A, the semiconductor switch unit 810 may include a substrate 812 and a plurality of switch conductive electrodes (as switch conductive electrodes 814 and 816). The capacitor unit 820 is correspondingly configured on a face of the semiconductor switch unit 810 (the upper face of the semiconductor switch unit 810 as shown in FIG. 8A) and electrically contacted with the semiconductor switch unit 810, such that multiple commutation loops I1 are formed by the above-mentioned switch conductive electrodes and the capacitor unit 820 (e.g., a single commutation loop I1 formed by adjacent two switch conductive electrodes 814 and 816 and a single capacitor 822), and the impedances of the above-mentioned commutation loops I1 are close to or the same with each other.

Therefore, the equivalent circuit of the semiconductor switch unit 810 and the capacitor unit 820 corresponding to each of multiple commutation loops 11 may be considered as one complete equivalent sub switch circuit. If the number of the capacitors 822 is n, then n sets of paralleled equivalent sub switch circuits exist; when n sets of paralleled equivalent sub switch circuits are operated simultaneously according to the gate drive signal, compared to the commutation loop of the original switch circuit with an external capacitor module, the commutation loops of the n sets of paralleled equivalent sub switch circuits are shortened to 1/n.

In an embodiment, a first semiconductor switch element (such as the half bridge high side semiconductor switch) and a second semiconductor switch element (such as the half bridge low side semiconductor switch) are integrated into the semiconductor switch unit 810. The above-mentioned switch conductive electrode 814 may act as the conductive electrode of the first semiconductor switch element, and the above-mentioned switch conductive electrode 816 may act as the conductive electrode of the second semiconductor switch element.

Next, the first semiconductor switch element and the second semiconductor switch element may respectively have sources, drains and gate. The source of the first semiconductor switch element and the drain of the second semiconductor switch element may be integrated into a source-drain common electrode. The surface of the semiconductor switch unit 810 is configured with the above-mentioned source-drain common electrode, the n drains of the first semiconductor switch element and the n sources of the second semiconductor switch element (n being a natural number greater than or equal to 1). The n drains of first semiconductor switch element and the n sources of the second semiconductor switch elements are arranged alternately. In an embodiment, the drains of the first semiconductor switch element and the sources of the second semiconductor switch element are staggered and arranged on the surface of the semiconductor switch unit 810, such that the drains and sources of the two semiconductor switch elements are configured with the staggered layout as shown in FIG. 7B, so as to form the staggered lead structure. Next, the number of terminals led out from this kind of monolithic integration semiconductor switch unit 810 may be roughly determined according to the number of the switch conductive electrodes 814 and 816.

On the other hand, in other embodiments, the first semiconductor switch element and the second semiconductor switch element may respectively have n sources and n drains. The n drains and n sources of the first semiconductor switch element and the n drains and n sources of the second semiconductor switch element may be configured on the surface of the semiconductor switch unit 810 in a form of matrix pattern (as shown in FIG. 7A). The drain Drain1 (or Drain2) and the source Source1 (or Source2) of the first semiconductor switch element (or the second semiconductor switch element) are staggered and arranged in a first array direction (an X direction as shown in FIG. 7A), while the drain Drain1 or the source Source1 of the first semiconductor switch element and the drain Drain2 or the source Source2 of the second semiconductor switch element are staggered and arranged in a second array direction (a Y direction as shown in FIG. 7A, only two rows being provided in the embodiment), in which n is a natural number greater than or equal to 1.

In an embodiment, the gates of both of the first semiconductor switch element and the second semiconductor switch element may be configured on the surface of the semiconductor switch unit 810, and the drain of the first semiconductor switch element and the source of the second semiconductor switch element also may be configured on the surface of the semiconductor switch unit 810.

As shown in FIGS. 8A and 8B, the semiconductor switch unit 810 may include multiple switch conductive electrodes 814 and multiple switch conductive electrodes 816. Both of the switch conductive electrodes 814 and 816 are configured on the substrate 812, in which the above-mentioned switch conductive electrode 814 may act as the drain of the first semiconductor switch element, and the above-mentioned switch conductive electrode 816 may act as the source of the second semiconductor switch element. Moreover, the semiconductor switch unit 810 may further include a control electrode 850 and an integrated switch conductive electrode 855. The control electrode 850 may be independently configured on the substrate 812 to serve as the gates of the first semiconductor switch element and the second semiconductor switch element in the semiconductor switch unit 810, while the integrated switch conductive electrode 855 is separated from the control electrode 850 and configured on the substrate 812 to serve as the source-drain common electrode of the first semiconductor switch element and the second semiconductor switch element. In another embodiment, the capacitor unit 820 may include a plurality of capacitors 822. The capacitors 822 are respectively stacked across the drain of the first semiconductor switch element and the source of the second semiconductor switch element (e.g., each capacitor 822 being correspondingly stacked on two adjacent switch conductive electrodes 814 and 816).

Moreover, the above-mentioned capacitor unit 820 may include a capacitor array. This capacitor array may include multiple capacitors 822 which are configured in a form of array pattern. The above-mentioned capacitors 822 are stacked on the surface of the semiconductor switch unit 810, and each of the capacitors 822 has two capacitor conductive electrodes (e.g., a capacitor conductive electrode 824 serving as a positive capacitor terminal and a capacitor conductive electrode 825 serving as a negative capacitor terminal). The two capacitor conductive electrodes 824 and 825 of each of the capacitors 822 are respectively connected to the drain of the first semiconductor switch element and the source of the second semiconductor switch element that are nearest to the capacitors 822 (e.g., each of the capacitors 822 being correspondingly stacked on two adjacent switch conductive electrodes 814 and 816 and electrically contacted with the two adjacent switch conductive electrodes 814 and 816), to respectively serve as the positive and negative capacitor terminals of the single capacitor 822.

Figure 9A:
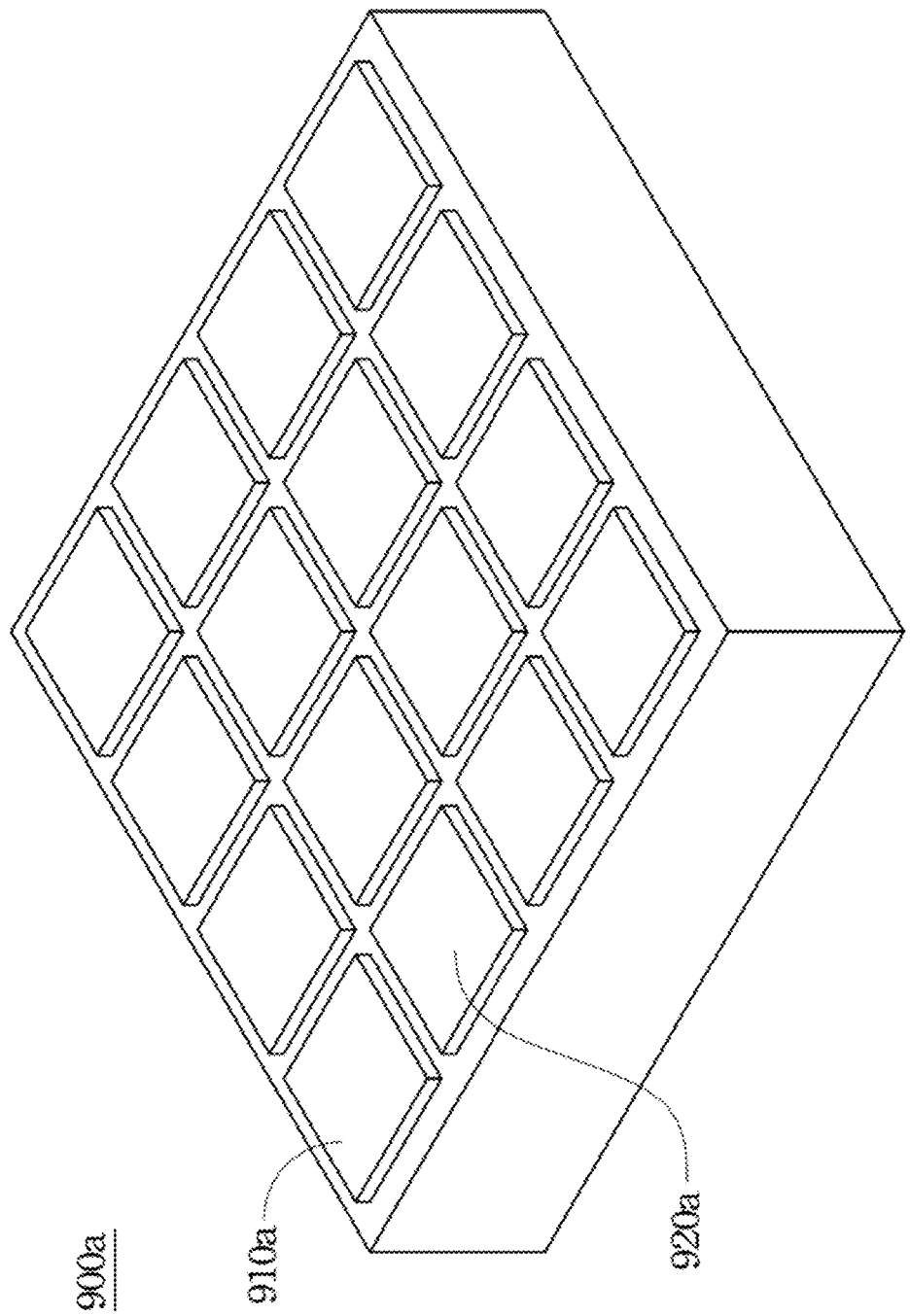
FIG. 9A is a schematic diagram illustrating an array capacitor according to an embodiment of the disclosure.
Figure 9B:
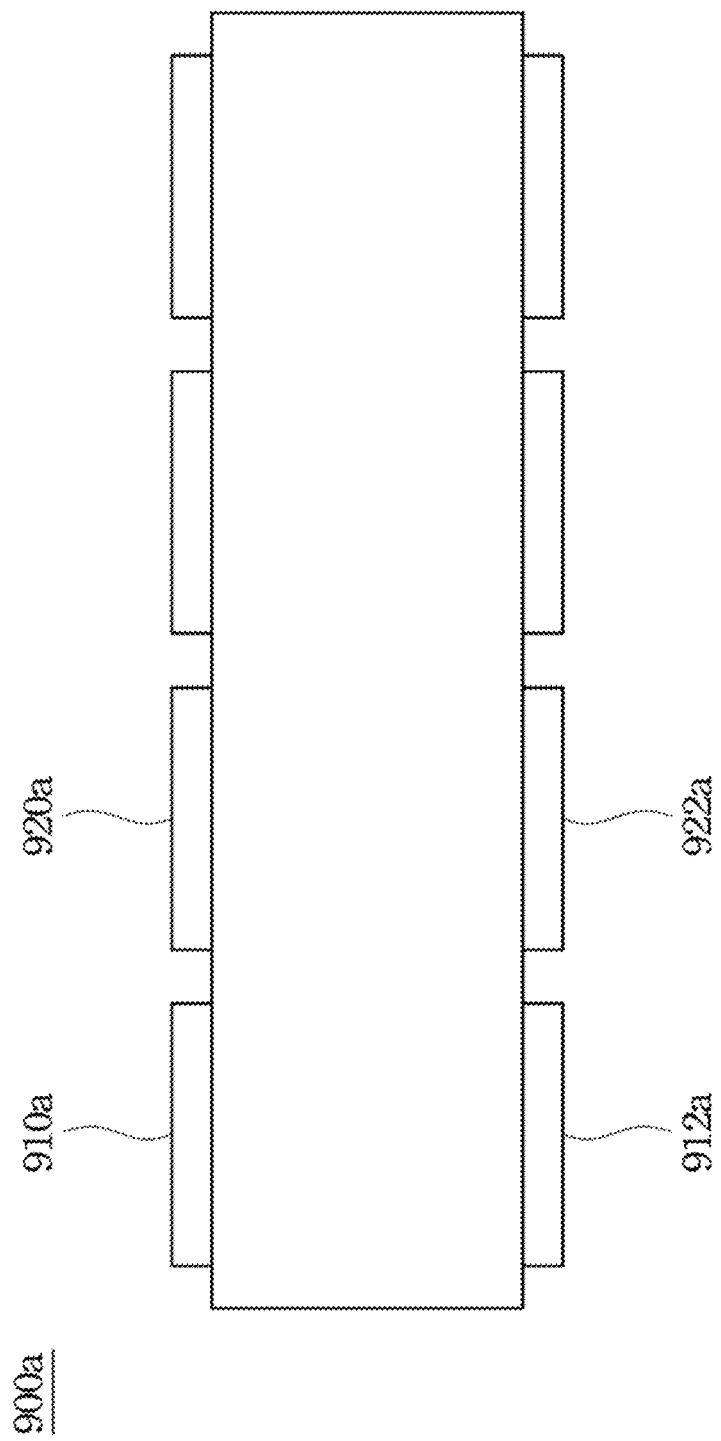
FIG. 9B is a side view illustrating the array capacitor as shown in FIG. 9A according to an embodiment of the disclosure.

FIG. 9A is a schematic diagram illustrating an array capacitor according to an embodiment of the disclosure. FIG. 9B is a side view illustrating the array capacitor as shown in FIG. 9A according to an embodiment of the disclosure. As shown in FIGS. 9A and 9B, multiple positive capacitor terminals 910*a* and multiple negative capacitor terminals 920*a* are configured on a face of an array capacitor 900*a*, while corresponding positive capacitor terminals 912*a* and negative capacitor terminals 922*a* are configured on the other opposing face of the array capacitor 900*a*. The positive capacitor terminals 910*a* and 912*a* may electrically belong to the same electrode, and the negative capacitor terminals 920*a* and 922*a* may electrically belong to the same electrode, and the number of terminals on both faces of the array capacitor 900*a* may be designed to be same or different according to actual requirements.

In actual application, the above-mentioned array capacitor 900*a* may be configured on a face of the semiconductor switch unit 810 as shown in FIG. 8A. Next, the array capacitor 900*a* may be integrated into an additional signal layer or pin to deliver a related electrical signal. The array capacitor 900*a* may also be integrated into a similar related signal layer or pin to deliver a related electrical signal. At the same time, both faces of the array capacitor 900*a* need not to lead out the pin from the same hole, and it is convenient for other units or elements to be stacked again above the array capacitor 900*a*.

Figure 9C:
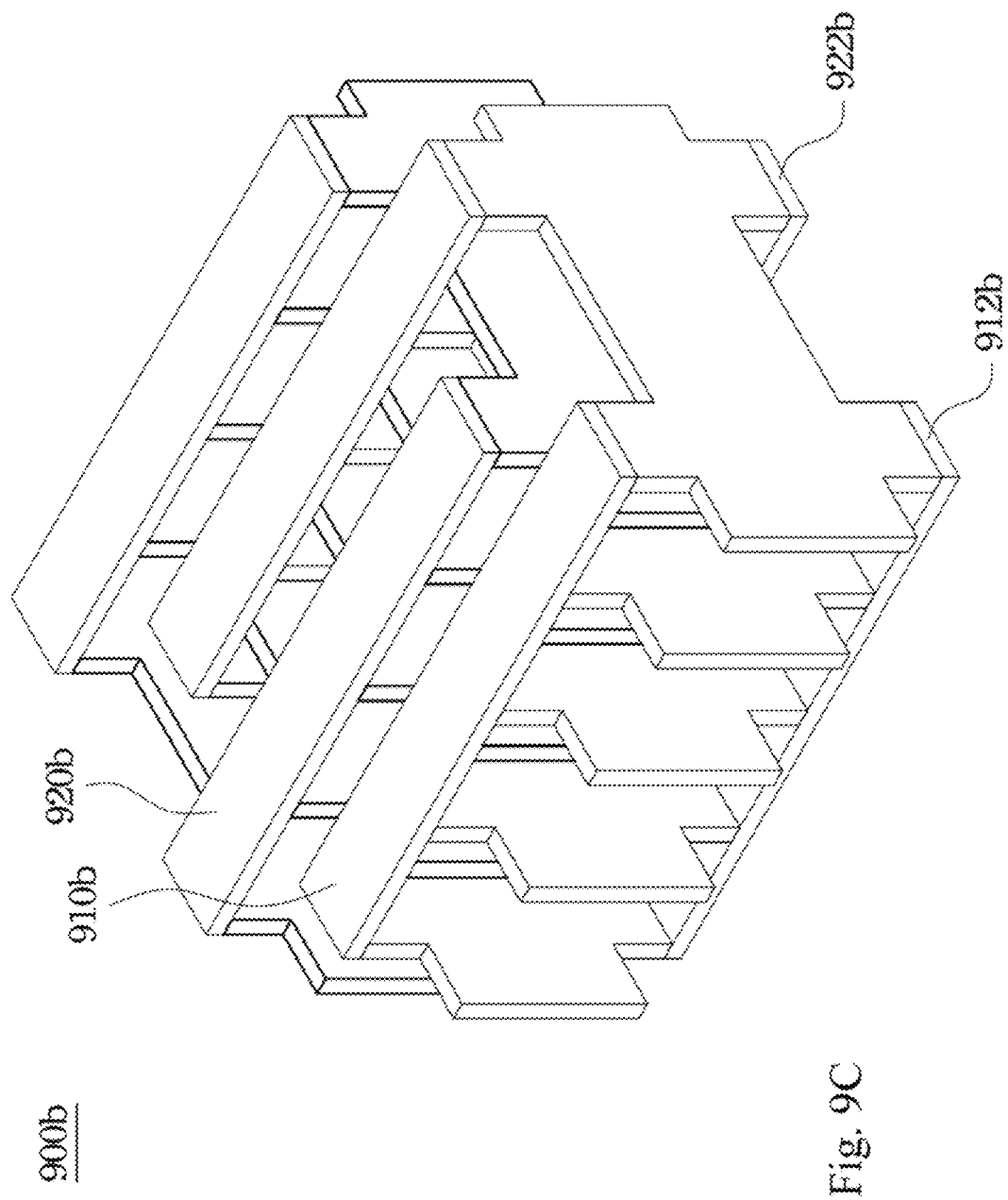
FIG. 9C is a schematic internal structure diagram illustrating a metal layer arrangement and terminal leading-out in the array capacitor as shown in FIG. 9A according to an embodiment of the disclosure.

FIG. 9C is a schematic internal structure diagram illustrating metal layer arrangement and terminal leading-out in the array capacitor as shown in FIG. 9A according to an embodiment of the disclosure. An array capacitor 900*b* is configured with multiple metal layers. A dielectric layer with a high dielectric constant is in the middle of the metal layers, while a protective insulation layer is coated at the outermost side of the entire column capacitors. All of the above are known to those of the skills in the art, which is not illustrated any further herein.

Next, positive capacitor terminals 910*b* are connected with multiple metal wiring layers in the array capacitor 900*b*, and negative capacitor terminals 920*b* are connected with multiple metal wiring layers in the array capacitor 900*b*. The metal wiring layer connected with the positive capacitor terminals 910*b* and the metal wiring layer connected with the negative capacitor terminals 920*b* are spaced and arranged in an alternate form (i.e., the form of ABAB). Additionally, positive capacitor terminals 912*b* are configured on a side opposing to the positive capacitor terminals 910*b*, and both of the positive capacitor terminals 912*b* and 910*b* within the capacitor are connected to the same metal wiring layer; similarly, negative capacitor terminals 922*b* are configured at a side opposing to the negative capacitor terminals 920*b*, and both of the negative capacitor terminals 922*b* and 920*b* within the capacitor are connected to the same metal wiring layer.

Moreover, in the array capacitor 900*b*, except that the capacitor may be formed between the positive capacitor terminals 910*b* and the negative capacitor terminals 920*b*, a current channel also may exist between the positive capacitor terminals 910*b* and 912*b*, and since more than 5% of the capacitor volume is generally occupied by the metal wiring layer, the capability of conducting current through the positive capacitor terminals 910*b* and 912*b* is considerable. In practice, the array capacitor 900*b* also may be configured with at least one terminal that is connected with neither the positive capacitor terminals 910*b* and 912*b* nor the negative capacitor terminals 920*b* and 922*b*, and that is just configured for transmitting other electrical signals (such as a drive signal). Additionally, the side on which the array capacitor 900*b* stacks and connects with semiconductor also may be configured with an electrical signal line that is configured for transmitting other electrical signals (such as a drive signal), in which the electrical signal line neither connects with positive capacitor terminals 910*b* and 912*b* nor the negative capacitor terminals 920*b* and 922*b*.

Figure 9D:
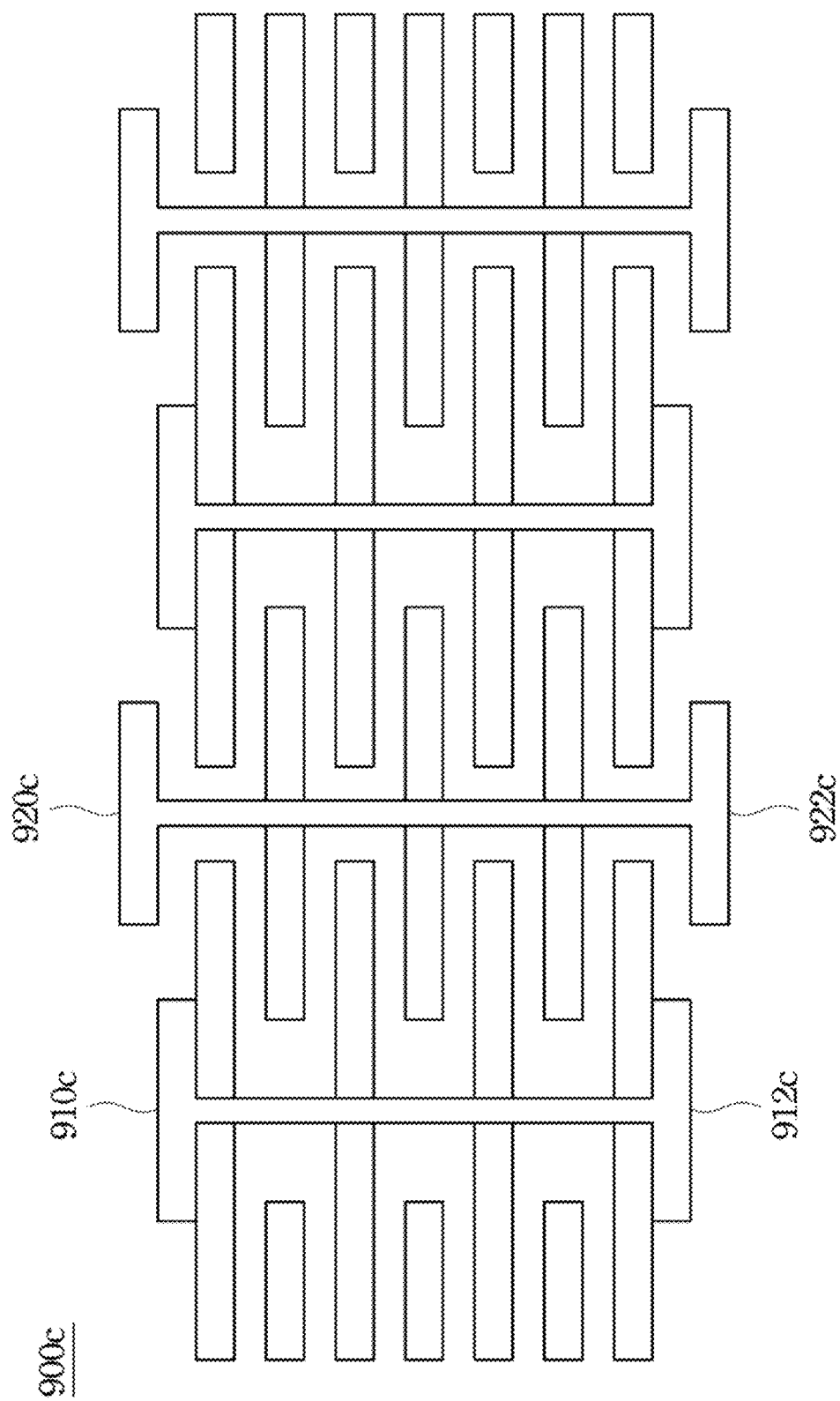
FIG. 9D is a schematic internal structure diagram illustrating a metal layer arrangement and terminal leading-out in the array capacitor as shown in FIG. 9A according to another embodiment of the disclosure.

FIG. 9D is a schematic internal structure diagram illustrating a metal layer arrangement and terminal leading-out in the array capacitor as shown in FIG. 9A according to another embodiment of the disclosure. Similarly, an array capacitor 900*c* is configured with multiple metal layers. The dielectric layer with the high dielectric constant is in the middle of the metal layers, while the protective insulation layer is coated at the outermost side of the entire column capacitors. All of the above are known to those of skills in the art, which is not illustrated any further herein.

Next, positive capacitor terminals 910*c* are connected with multiple metal wiring layers in the array capacitor 900*c* through a through-hole, and negative capacitor terminals 920*c* are also connected with multiple metal wiring layers in the array capacitor 900*c* through the through-hole. The metal wiring layer connected with the positive capacitor terminals 910*c* and the metal wiring layer connected with the negative capacitor terminals 920*c* are spaced and arranged in an alternate form (i.e., the form of ABAB). Additionally, positive capacitor terminals 912*c* are configured on a side opposing to the positive capacitor terminals 910*c*, and both of the positive capacitor terminals 910*c* and the positive capacitor terminals 912*c* within the capacitor are also connected through the through-hole. The structure of this array capacitor 900*c* is applied so as to make the component thinner and it has a preferred effect in the application of thinning.

Similarly, in practice, the array capacitor 900*c* also may be configured with at least one terminal that is connected with neither the positive capacitor terminals 910*c* and 912*c* nor the negative capacitor terminals 920*c* and 922*c*, and that is just configured for transmitting other electrical signals (such as a drive signal). Additionally, the side on which the array capacitor 900*c* stacks and connects with the semiconductor also may be configured with an electrical signal line that is configured for transmitting other electrical signals (such as a drive signal), in which the electrical signal line neither connects with positive capacitor terminals 910*c* and 912*c* nor the negative capacitor terminals 920*c* and 922*c*.

Referring to FIG. 8A again, the switch circuit package module 800*a* may further include a plurality of input electrodes. The above-mentioned input electrodes include the input electrodes (such as an input end electrode 832) capable of serving as the positive input terminals and the input electrodes (such as an input end electrode 833) capable of serving as the negative input terminals. These input electrodes respectively correspond to the drain (such as the switch conductive electrode 814) of the first semiconductor switch element and the source (such as the switch conductive electrode 816) of the second semiconductor switch element to be stacked on corresponding capacitor conductive electrodes 824 and 825 and respectively stacked across the above-mentioned two adjacent capacitors.

In practice, the number of the above-mentioned switch conductive electrodes, capacitor conductive electrodes and input electrodes may be the same with or different from each other, which is mainly on the basis that all the above-mentioned electrodes are required to be capable of cooperating with each other and forming multiple commutation loops I1 between the semiconductor switch unit 810 and the capacitor unit 820.

In view of the above, the above-mentioned switch conductive electrodes may include the drain of the half bridge high side switch and the source of the half bridge low side switch. The above-mentioned capacitor conductive electrodes may include the positive conductive electrodes and the negative conductive electrodes. The above-mentioned input electrodes may include the positive input electrodes and the negative input electrodes. The positive conductive electrodes are stacked on the drain of the half bridge high side switch, and the positive input electrodes are stacked on the positive conductive electrodes, and the negative conductive electrodes are stacked on the source of the half bridge low side switch, and the negative input electrodes are stacked on the negative conductive electrode. In other words, the surfaces of the switch terminals (i.e., the switch conductive electrodes 814 and 816) of the semiconductor switch unit 810 respectively correspond to the positive and negative capacitor terminals (i.e., the capacitor conductive electrodes 824 and 825) of the capacitor unit 820, while the surfaces of the positive and negative capacitor terminals of the capacitor unit 820 respectively correspond to the positive and negative input terminals (i.e., the input electrodes 832 and 822) of the switch circuit package module 800a, such that the switch circuit package module 800a has the staggered lead structure. Therefore, the distance between the semiconductor switch unit 810 and the capacitor unit 820 may be reduced, and multiple commutation loops 11 may be formed between the semiconductor switch unit 810 and the capacitor unit 820.

For the switch circuit package module 800a shown in FIG. 8A, if a pair of positive and negative input terminals (i.e., the input electrodes 832 and 833), a single capacitor (including the capacitors 822 and the capacitor conductive electrodes 824 and 825 at both sides of the capacitors 822), a pair of terminals (i.e., the switch conductive electrodes 814 and 816) of the semiconductor switch unit 810 and a corresponding part of the body of the semiconductor switch unit 810 are considered as a single sub switch circuit, then the number of the equivalent paralleled sub switch circuits may be determined by the number of the capacitors 822.

Figure 10:
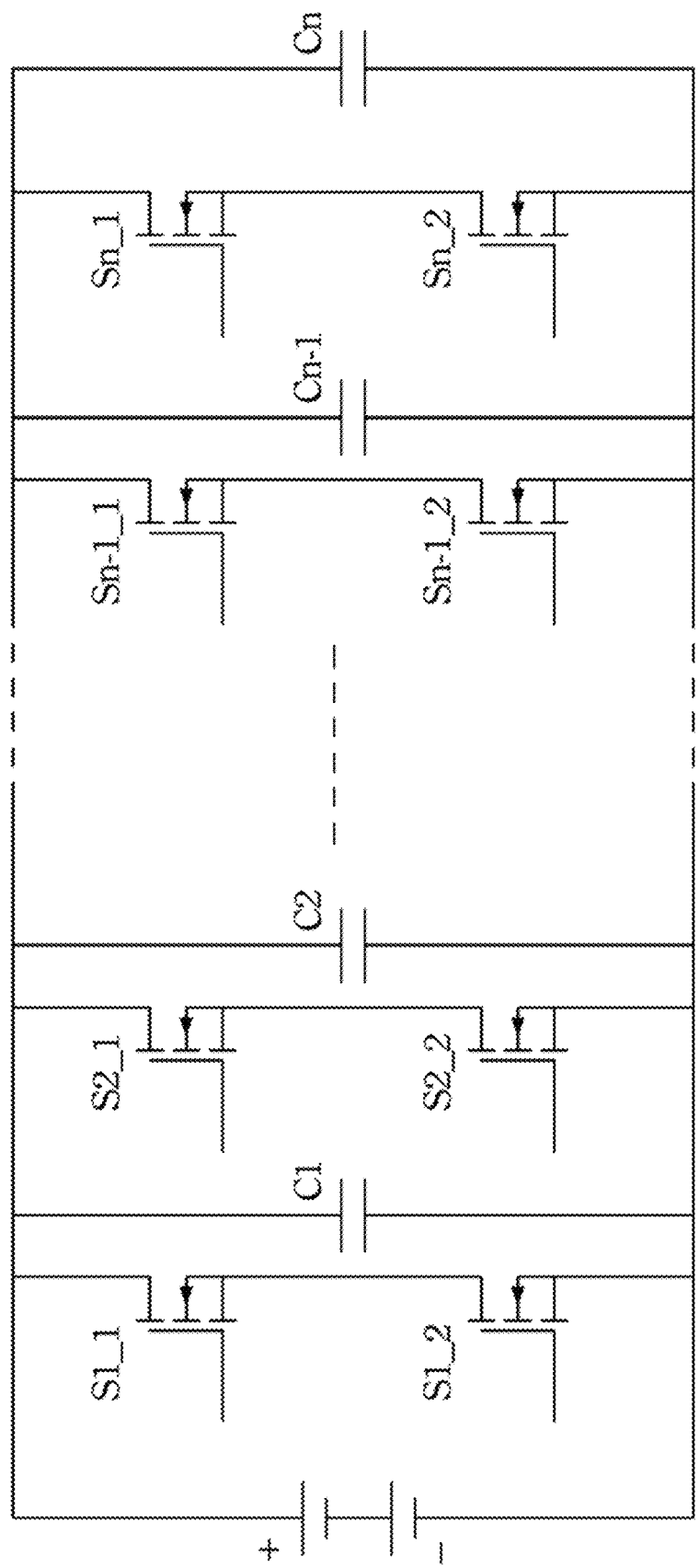
FIG. 10 is a schematic equivalent circuit diagram illustrating the switch circuit package module as shown in FIG. 8A according to an embodiment of the disclosure.

FIG. 10 is a schematic equivalent circuit diagram illustrating the switch circuit package module as shown in FIG. 8A according to an embodiment of the disclosure. Specifically, as shown in FIGS. 8A and 10, if the switch circuit package module 800a has n capacitors 822 (i.e., C1, C2, . . . , Cn), then the equivalent circuit shown in FIG. 10 may include n sets of paralleled equivalent sub switch circuits according to the structure shown in FIG. 8A, and each set of sub switch circuits includes equivalent sub half bridge high side switches (S1_1, S2_1, . . . or Sn_1) and sub half bridge low side switches (S1_2, S2_2, . . . or Sn_2). When the above-mentioned n sets of paralleled equivalent sub switch circuits are operated according to the gate drive signal, compared to the commutation loop of the original switch circuit with the external capacitor module, the commutation loops of the n sets of paralleled equivalent sub switch circuits are shortened to 1/n.

In view of the above, the switch circuit package module 800a fabricated by the embodiment shown in FIG. 8A mainly includes the following characteristics:

1) the commutation loop of the equivalent switch circuit may be shortened to 1/n of the original commutation loop, and n commutation loops are juxtaposed, such that the parasitic inductances on the commutation loops are reduced significantly when compared to the parasitic inductances on the original lines, so as to significantly reduce the loss caused by the parasitic inductances on the commutation loops and the resonance between the parasitic inductances and the capacitors;

2) since the equivalent switch circuit may be averagely divided into n sub switch circuits, the commutation path of each sub switch circuit is essentially the same, such that the currents flowing through n sub switch circuits are essentially identical, so as to eliminate the non-uniform problem of the cell current resulted from different paths constituted by the cells and the capacitors, and also further reduce the loss of the semiconductor switch during the switch-on process;

3) since the commutation path of each sub switch circuit is essentially the same, and the drive line and the main line may be separated from each other by the monolithic integration technology, each sub switch circuit can be switched on simultaneously, and thus during the switch process, the current distribution in the semiconductor switch is very uniform, such that the effective utilization of the semiconductor switch may arrive or approach to 100%.

Figure 11:
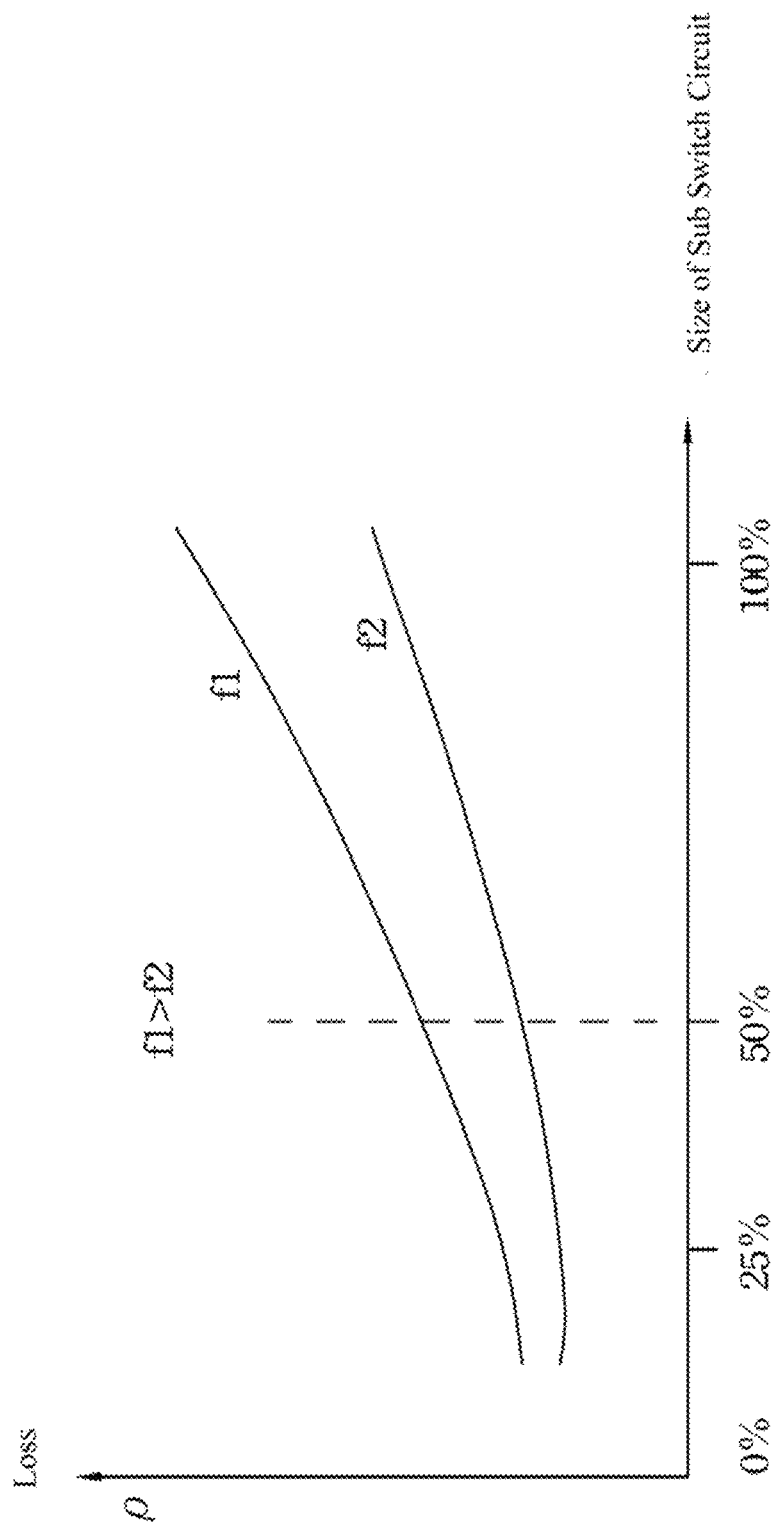
FIG. 11 is a schematic diagram illustrating a relative relation between the size and loss of a sub switch circuit according to an embodiment of the disclosure.

FIG. 11 is a schematic diagram illustrating a relative relation between the size and loss of a sub switch circuit according to an embodiment of the disclosure. Herein, the size of the sub switch circuit mainly represents a volume percent of a semiconductor component portion corresponding to a single equivalent sub switch circuit in a whole semiconductor component, while the loss represents the total loss required by the whole equivalent switch circuit during the operation. It can be clearly seen from FIG. 11 that, when the number of the equivalent sub switch circuits is increased to make the size (i.e., the occupied volume percent) of the sub switch circuit reduced, the loss caused by the inductances on the commutation loops, the non-uniform distribution of the cell current of the semiconductor switch, the utilization of the semiconductor switch and the like may be correspondingly reduced, and in the case that the switch frequency is increased (e.g., being increased from the frequency f2 to the frequency f1) or the switch-on resistance of the whole semiconductor component is reduced, the application of the switch circuit in the embodiment of the disclosure may reduce the loss more significantly.

Figure 12:
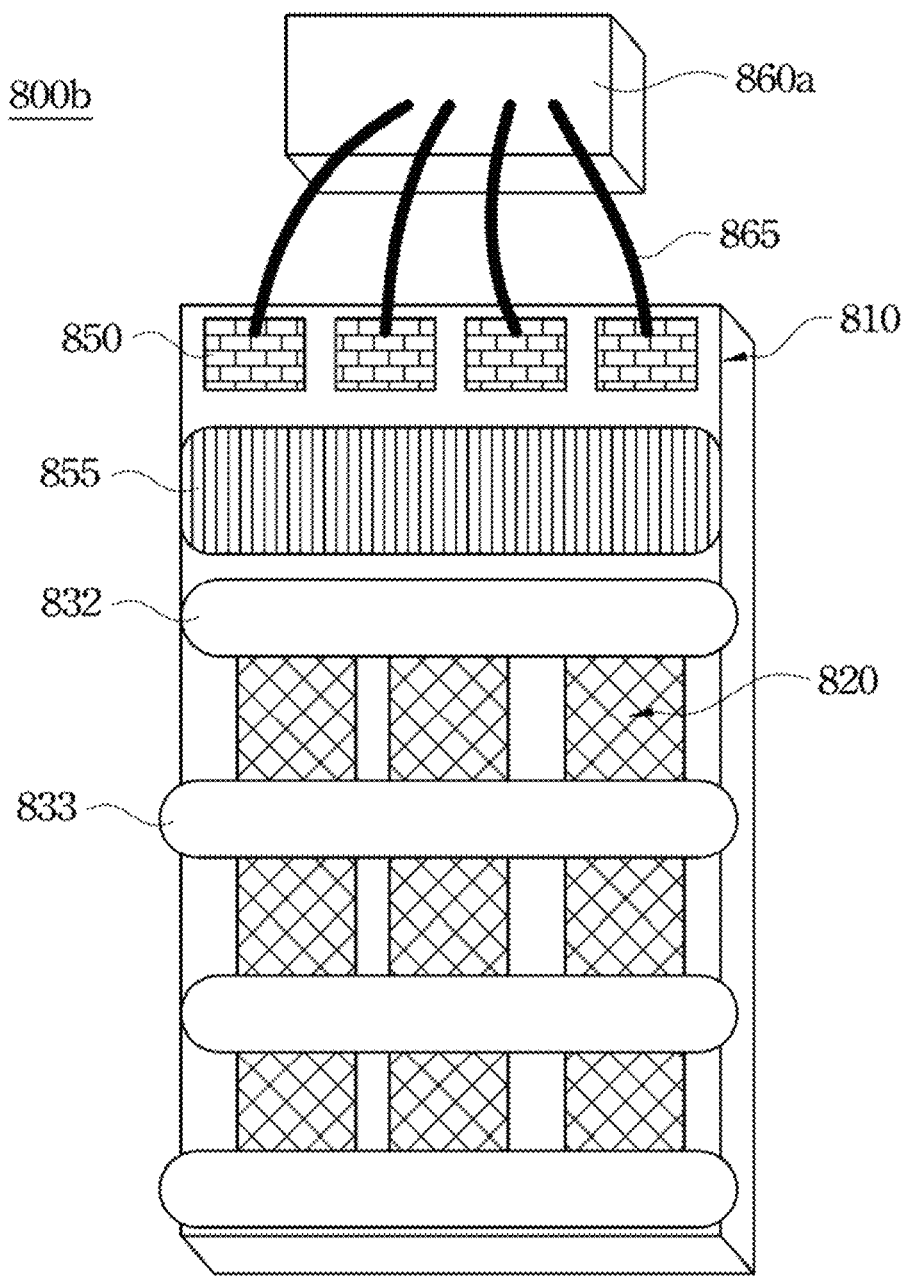
FIG. 12 is a schematic diagram illustrating a switch circuit package module according to a tenth embodiment of the disclosure.

Next, the equivalent switch circuit as shown in FIG. 10 needs to be controlled by the drive circuit, such that the sub half bridge high side switches S1_1, S2_1, . . . and Sn_1 and the sub half bridge low side switches S1_2, S2_2, . . . and Sn_2 therein may be respectively switched on or switched off according to the drive signals generated by the drive circuit, so as to satisfy the operational requirements. FIG. 12 is a schematic diagram illustrating a switch circuit package module according to a tenth embodiment of the disclosure. Compared to the switch circuit package module 800a shown in FIG. 8B, a switch circuit package module 800b shown in FIG. 12 may further include a drive circuit unit 860a. The drive circuit unit 860a is configured outside the semiconductor switch unit 810 and electrically connected with the control electrode 850 (i.e., the gates of the first semiconductor switch element and the second semiconductor switch element) of the semiconductor switch unit 810 through a conductor 865 (e.g., a wire) for transmitting a corresponding drive signal to the control electrode 850 through the conductor 865, so as to control the operation of each equivalent switch circuit.

In the prior art, the drive circuit is generally configured outside the switch circuit package module, and thus the required drive circuit lead is longer, so as to not only affect the drive speed, but also lead to the electromagnetic interference. Compared to the prior art, in the embodiment shown in FIG. 12, the drive circuit is mainly integrated into a switch circuit package structure, and thus not only the length of the drive circuit lead may be reduced to enhance the drive speed, such that the switch circuit is capable to be operated with a higher switch frequency, but also the loss of the switch circuit may be reduced, so as to reduce the interference to the drive circuit caused by the external circuit.

Figure 13A:
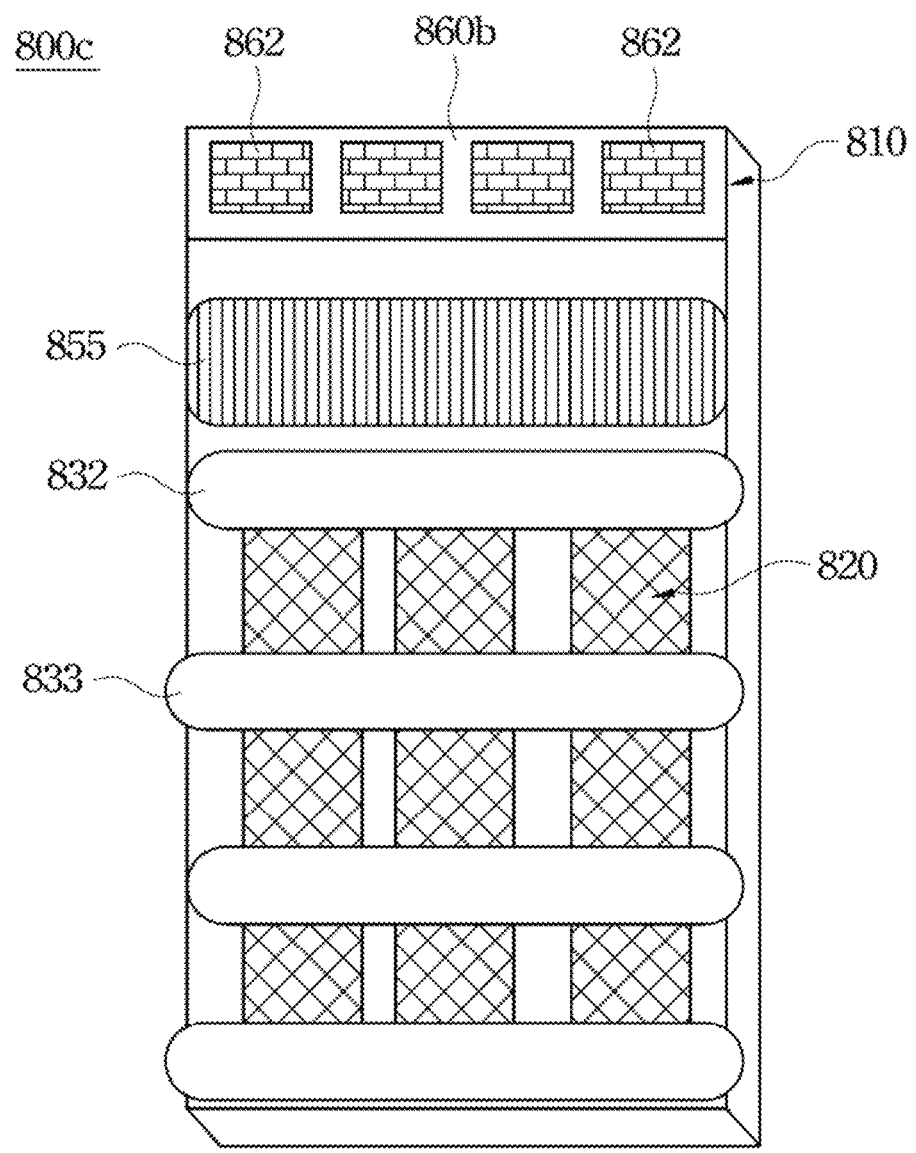
FIG. 13A is a schematic diagram illustrating a switch circuit package module according to an eleventh embodiment of the disclosure.
Figure 13B:
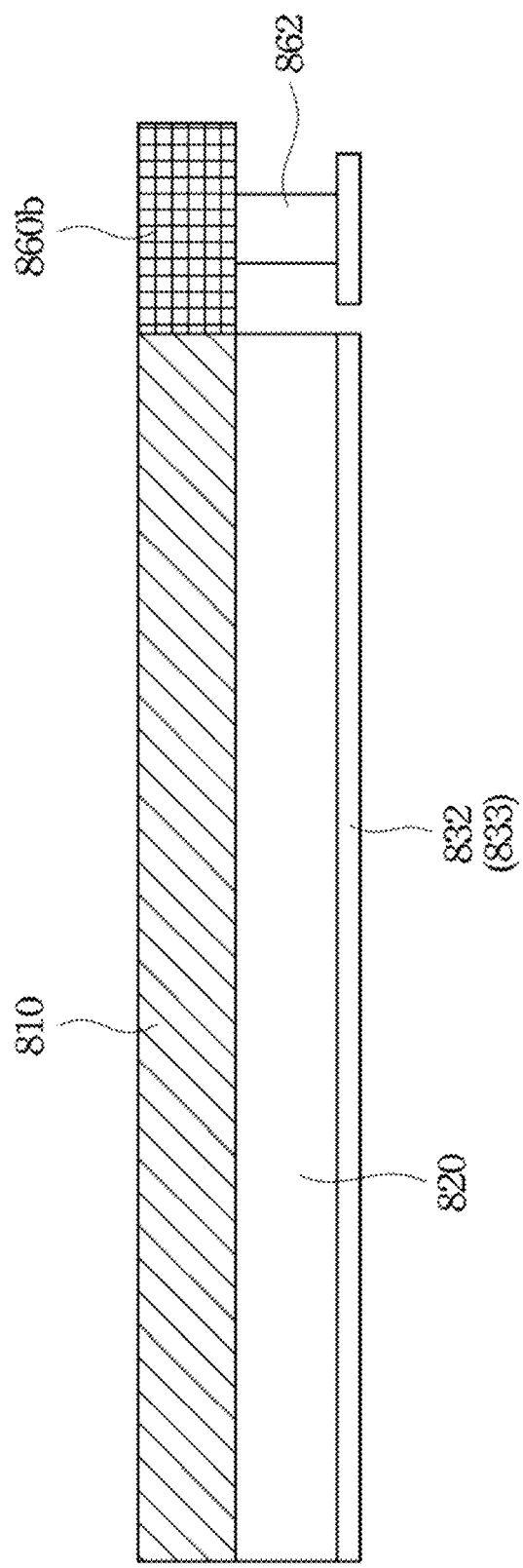
FIG. 13B is a schematic simplified side view illustrating the switch circuit package module as shown in FIG. 13A after being inversed.

FIG. 13A is a schematic diagram illustrating a switch circuit package module according to an eleventh embodiment of the disclosure. FIG. 13B is a schematic simplified side view illustrating the switch circuit package module as shown in FIG. 13A after being inversed. Compared to the switch circuit package module 800b shown in FIG. 12, a switch circuit package module 800c shown in FIG. 13A includes a drive circuit unit 860b. The drive circuit unit 860b and the semiconductor switch unit 810 are integrated together and electrically connected with the control electrode 850 (i.e., the gates of the first semiconductor switch element and the second semiconductor switch element). The drive circuit unit 860b may include a signal input/output (I/O) portion 862 connected with the control electrode 850, such that the semiconductor switch unit 810 is controlled more directly by the drive circuit unit 860b. In other words, the drive circuit unit 860b and the semiconductor switch unit 810 may be integrated into the same chip with the monolithic integration technology, such that no wire or other conductors are required for connecting the drive circuit unit 860b and the semiconductor switch unit 810. Therefore, not only the drive speed may be further enhanced and the loss of the switch circuit may be reduced, but also the interference to the wire and the drive circuit caused by the external circuit may be reduced.

On the other hand, the circuit shown in FIG. 1C may be a Buck circuit comprised of the switch circuit 100, drive circuit, inductance and capacitor, besides that the switch circuit 100, drive circuit and capacitor may be integrated into the switch circuit package module according to the above-mentioned embodiment, the output inductance $L_O$ may also be integrated into the switch circuit package module.

Figure 14:
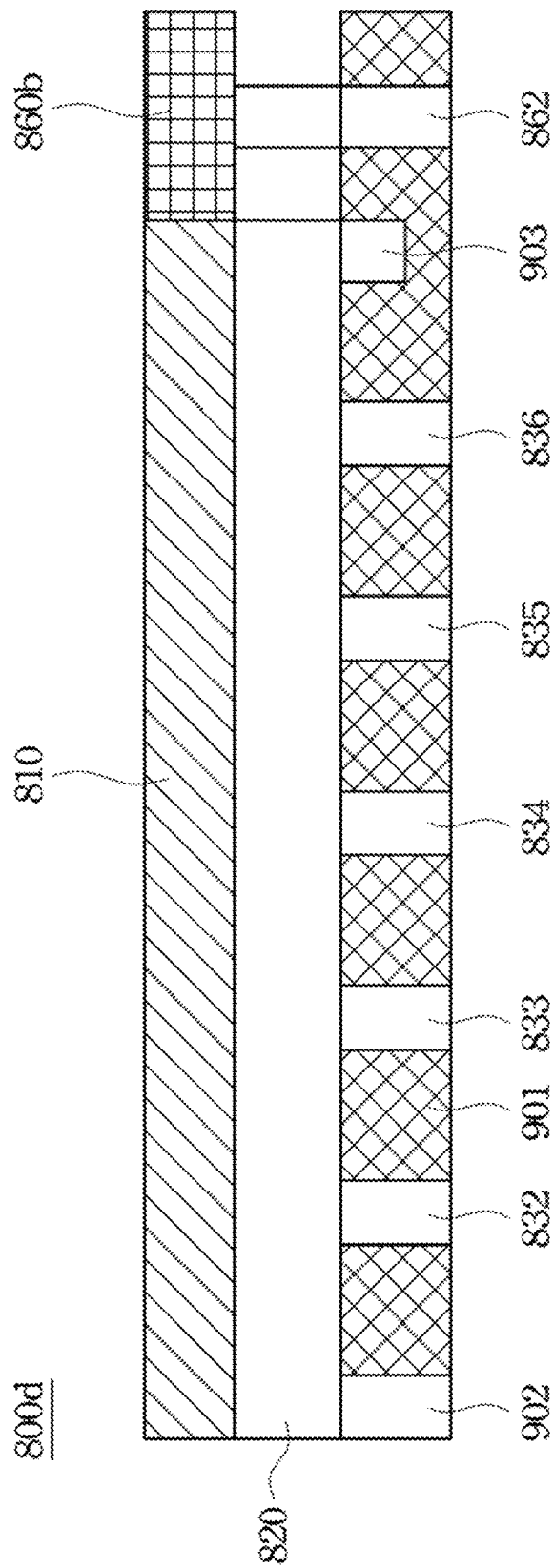
FIG. 14 is a schematic diagram illustrating a switch circuit package module according to a twelfth embodiment of the disclosure.

FIG. 14 is a schematic diagram illustrating a switch circuit package module according to a twelfth embodiment of the disclosure. Compared to the embodiment shown in FIG. 13B, a switch circuit package module 800d shown in FIG. 14 may further include input electrodes (such as main power input terminals) 832-836 that are configured separately, an inductor unit 901 and inductance input/output terminal 902/903. The inductor unit 901 and the input electrodes 832-836 corresponding to the first semiconductor switch element and the second semiconductor switch element are stacked on the same face of the capacitor unit 820.

It should be noted that, the above-mentioned inductor unit 901 may be an independent inductor and also may include multiple inductors, which is not limited to the drawings herein. Since the volume of the output inductor is generally larger, if the inductor is integrated into the switch circuit package module with the embodiment shown in FIG. 14, then the power density of the circuit may be enhanced and the volume of the circuit may be reduced. Next, similar to the above-mentioned embodiments, the input or output signals received or transmitted by the drive circuit unit 860b and other necessary electrical connections may also be implemented through the capacitor unit 820.

Moreover, in order to make the switch circuit package module have a better integration level, the output capacitor $C_O$ shown in FIG. 1C may also be integrated into the switch circuit package module. Specifically, the capacitor unit 820 may be implemented by one three-terminal capacitor. The three-terminal capacitor has an input end, an output end and a common end (usually a ground end (GND)), so as to respectively achieve the characteristics of the input capacitor and the output capacitor, such that the switch circuit package module may be directly used as the Buck circuit shown in FIG. 1C, and it is unnecessary to utilize other external capacitors again to cooperate with the switch circuit package module.

It should be noted that herein, since the withstand voltages of both of the input capacitor and the output capacitor are generally different, the above-mentioned capacitor unit 820 may be formed by combining two independent capacitors with different withstand voltages, in which the above-mentioned input capacitor can still be fabricated with the form of capacitor array. Moreover, if the same fabrication process is used for decreasing the cost, then the requirements of different capacities and withstand voltages may be implemented by performing a series/parallel combination for the capacitors.

Next, it should be noted that, though the Buck circuit is taken for example above, but those of skills in the art can still implement a Boost circuit, Buck-Boost circuit, etc. according to the above-mentioned embodiments, without departing from the spirit and scope of the disclosure, which is not limited to the above-mentioned description.

Figure 15:
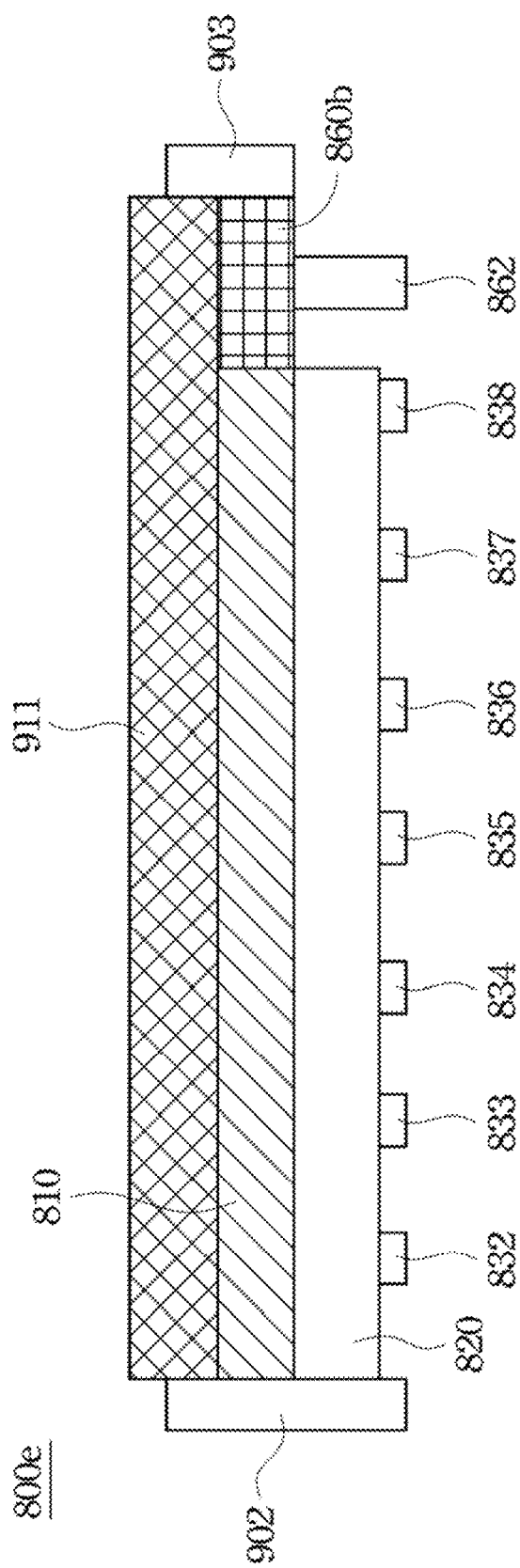
FIG. 15 is a schematic diagram illustrating a switch circuit package module according to a thirteenth embodiment of the disclosure.

FIG. 15 is a schematic diagram illustrating a switch circuit package module according to a thirteenth embodiment of the disclosure. Compared to the embodiment shown in FIG. 13B, a switch circuit package module 800e in this embodiment includes an inductor unit 911. When the drive circuit unit 860b is integrated with the semiconductor switch unit 810, the inductor unit 911 and the capacitor unit 820 are respectively configured on both opposing sides of the semiconductor switch unit 810.

Specifically, the switch circuit package module 800e in this embodiment may further include the input electrodes (such as the main power input terminals) 832-838 that are configured separately, the inductor unit 911 and the input/output terminal 902/903 of the inductor unit 911. The inductor unit 911 is integrated on the same facet of the semiconductor switch unit 810 and the drive circuit unit 860b (the upper facet of the semiconductor switch unit 810 and the drive circuit unit 860b), while the semiconductor switch unit 810 is located between the capacitor unit 820 and the inductor unit 911. The input/output terminal 902 is disposed at one side of the inductor unit 911, semiconductor switch unit 810 and capacitor unit 820 and electrically connected with the inductor unit 911, semiconductor switch unit 810 and capacitor unit 820, while the input/output terminal 903 is configured on the other side of the inductor unit 911 and the drive circuit unit 860b and electrically connected with the inductor unit 911 and the drive circuit unit 860b. It should be noted that herein, the input/output terminals of the inductor are located on both sides of the inductor unit 911 and the drive circuit unit 860b. However, the input/output terminals of the inductor can also be configured on the same side of the inductor unit 911 and the drive circuit unit 860b according to actual requirements, which is not limited to the above-mentioned description herein.

For the embodiment shown in FIG. 15, since the inductor unit 911 and the input electrodes (such as the main power input terminals) 832-838 together with the signal input/output portion (I/O) 862 are arranged at different facets of semiconductor switch unit 810, the drive signal and power path in this package structure can avoid passing the surface of inductor and causing more parasitic inductances on the line, so as to be capable to effectively make less parasitic inductances of the line. Moreover, by applying the package structure shown in FIG. 15, the heat generated correspondingly by the loss of the semiconductor switch unit 810 is unnecessary to be conducted by the inductor unit 911 as the embodiment shown in FIG. 14, such that the whole heat-conducting efficiency may be improved and it may avoid that the chip temperature is raised due to a bad heat dissipation and more component losses are caused.

Figure 16:
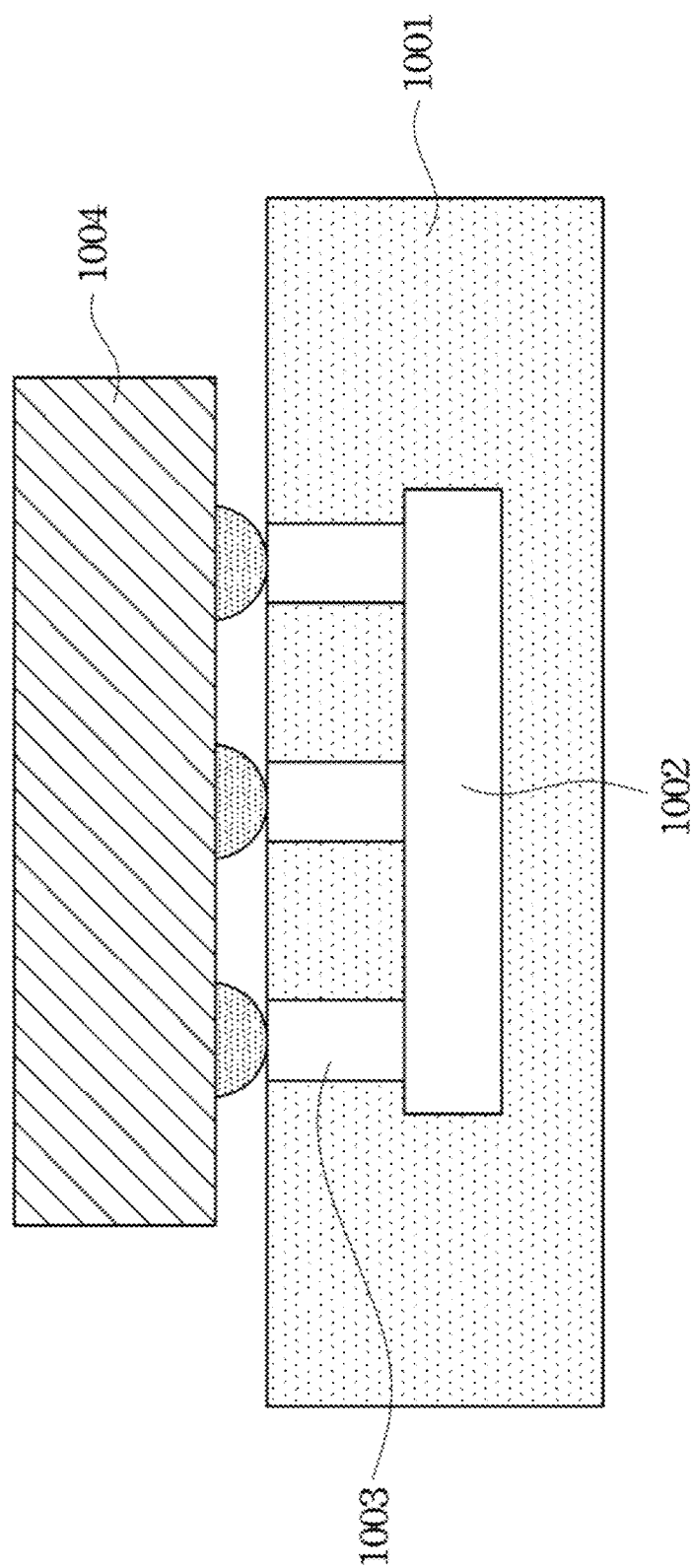
FIG. 16 is a schematic structure diagram illustrating a component which is embedded into a printed circuit board.

FIG. 16 is a schematic structure diagram illustrating that a component is embedded into a printed circuit board. As shown in FIG. 16, a printed circuit board (PCB) 1001 is used as the substrate, and an embedded component 1002 is embedded in the PCB 1001 and connected with a surface component 1004 by an internal connection through-hole 1003. The above-mentioned switch circuit package module may also be implemented with this type of structure, such that the semiconductor switch unit and the drive circuit unit are embedded into the PCB.

Figure 17:
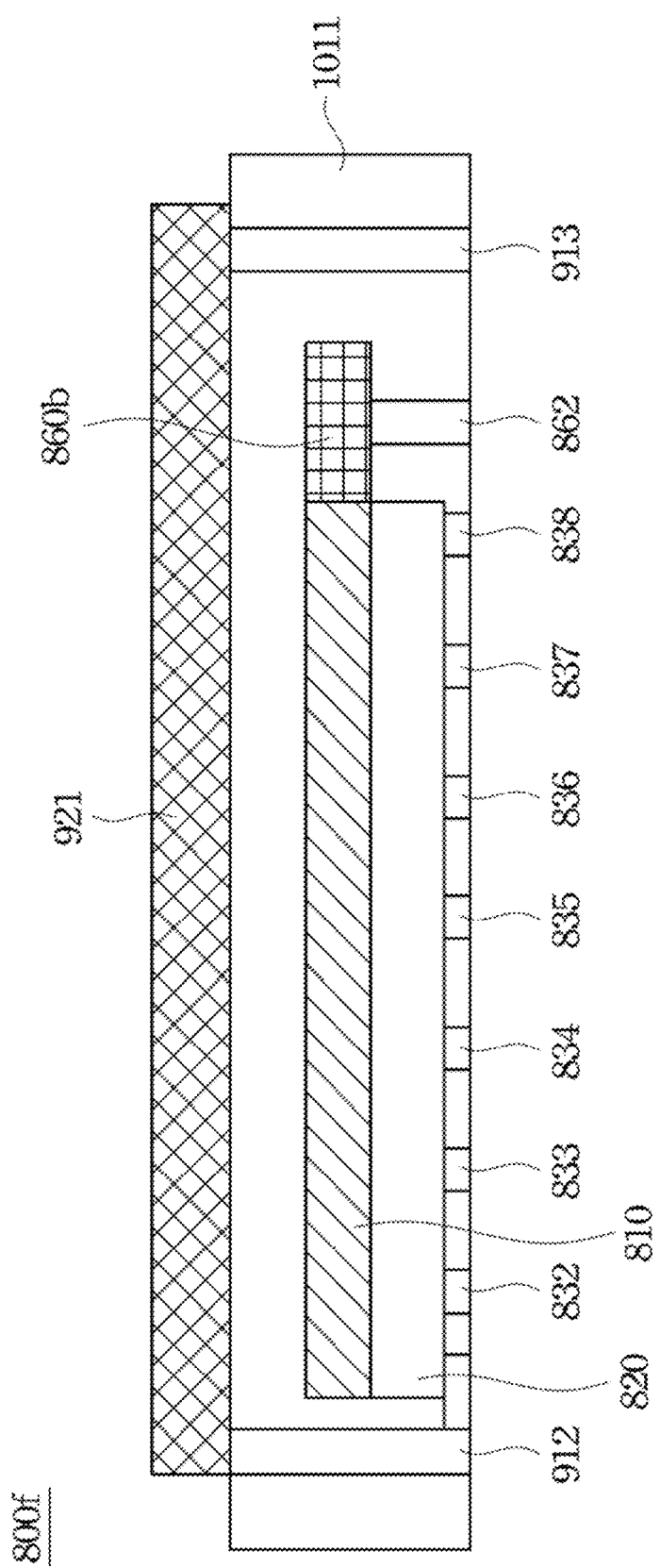
FIG. 17 is a schematic diagram illustrating a switch circuit package module according to a fourteenth embodiment of the disclosure.

FIG. 17 is a schematic diagram illustrating a switch circuit package module according to a fourteenth embodiment of the disclosure. Compared to the embodiment shown in FIG. 13B, a switch circuit package module 800f in this embodiment further includes the input electrodes (such as the main power input terminals) 832-838 that are configured separately, an inductor unit 921, input/output terminals 912/913 of the inductor unit 921 and a PCB 1011. The semiconductor switch unit 810, capacitor unit 820, drive circuit unit 860b, signal input/output (I/O) portion 862 and the above-mentioned input electrodes 832-838 are all embedded into the PCB 1011, while the inductor unit 921 is integrated on the face of the PCB 1011, the one of PCB 1011 closer to the semiconductor switch unit 810.

Next, the inductor unit 921 is electrically connected with the semiconductor switch unit 810, capacitor unit 820 and the like through the input/output terminal 912 embedded into the PCB 1011, such that in the switch circuit package module 800f, the main components (especially the semiconductor switch unit 810, capacitor unit 820 and drive circuit unit 860b) except the inductor unit 921 are all embedded into the PCB 1011. It should be noted that herein, though the inductor unit 921 is integrated on the upper face of the PCB 1011 shown in FIG. 17, the inductor unit 921 may also be configured on the other face of the PCB 1011 (i.e., the face closer to the input electrodes 832-838) according to actual requirements, which is not limited to the above-mentioned description herein.

Figure 18:
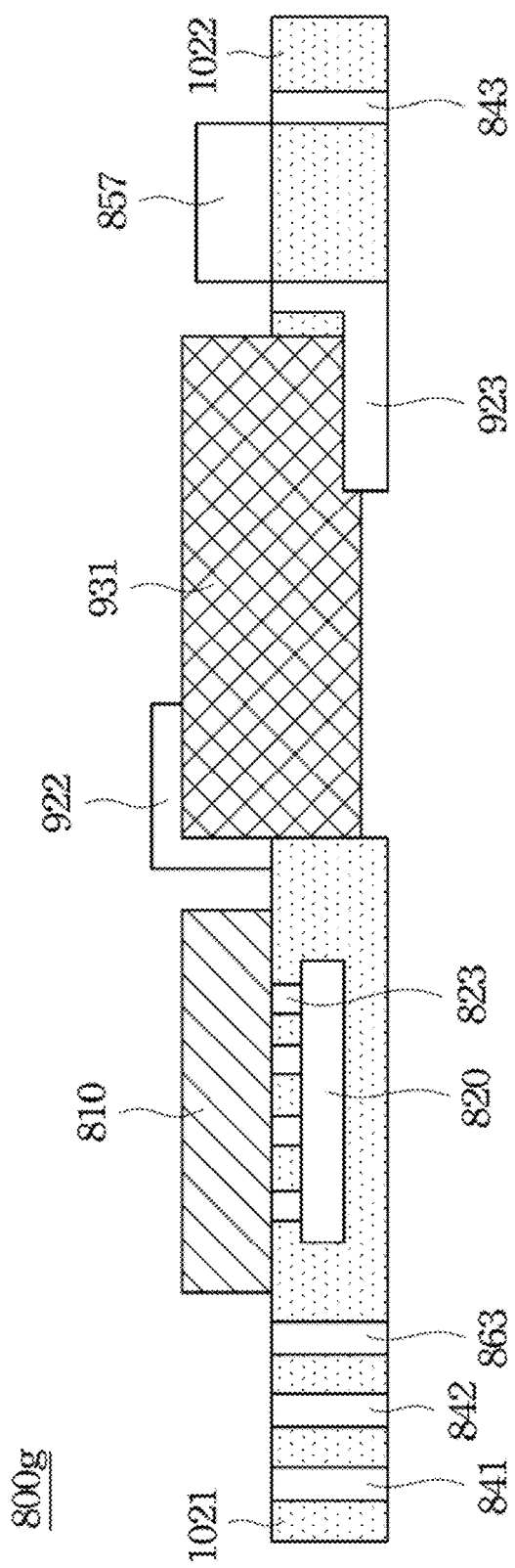
FIG. 18 is a schematic diagram illustrating a switch circuit package module according to a fifteenth embodiment of the disclosure.

FIG. 18 is a schematic diagram illustrating a switch circuit package module according to a fifteenth embodiment of the disclosure. Compared to the embodiment shown in FIG. 17, a switch circuit package module 800g in this embodiment includes PCBs 1021 and 1022. The semiconductor switch unit 810 (along with the drive circuit unit) is configured on the PCB 1021. The capacitor unit 820 is embedded into the PCB 1021 and electrically connected with the semiconductor switch circuit 810 (along with the drive circuit unit) through the through-hole 823, while the other PCB 1022 is configured separately from the PCB 1021. Next, the input electrodes 841, 842 and 843 are respectively embedded in the PCBs 1021 and 1022, and can be exposed for connecting with the external power input. The signal input/output (I/O) portion 863 also may be embedded into the PCB 1021. Moreover, the switch circuit package module 800g may further include an output capacitor unit 857, and the output capacitor unit 857 is configured on the PCB 1022.

In addition, as shown in FIG. 18, an inductor unit 931 is embedded between the PCBs 1021 and 1022. The input/output terminal 922 is stacked across the PCB 1021 and the inductor unit 931, while the other input/output terminal 923 is partially embedded into the PCB 1022 and exposed for connecting, and the other part of the input/output terminal 923 is configured below the inductor unit 931. It should be noted that, the above-mentioned manner in which the inductor unit 931 is embedded between the PCBs 1021 and 1022 may also be implemented by forming a hole in a single PCB and embedding the inductor unit 931 into the hole of the PCB, which is not limited to the above-mentioned description.

Figure 19:
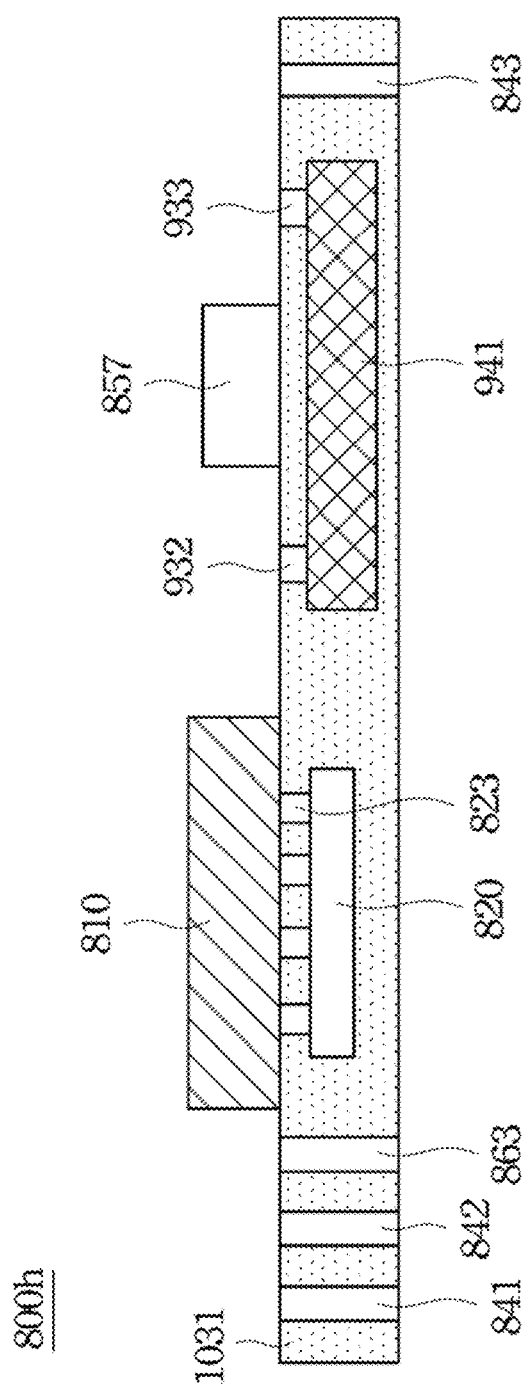
FIG. 19 is a schematic diagram illustrating a switch circuit package module according to a sixteenth embodiment of the disclosure.

FIG. 19 is a schematic diagram illustrating a switch circuit package module according to a sixteenth embodiment of the disclosure. A switch circuit package module 800h in this embodiment includes a PCB 1031. The semiconductor switch unit 810 (along with the drive circuit unit) is configured on the PCB 1031. The capacitor unit 820 is embedded into the PCB 1031 and electrically connected with the semiconductor switch unit 810 (along with the drive circuit unit) through the through-hole 823. Moreover, the input electrodes 841, 842 and 843 are all embedded into the PCB 1031 for connecting with the external power input. The signal input/output portion (I/O) 863 is also embedded into the PCB 1031. Next, the output capacitor unit 857 is configured on the PCB 1031.

Compared to the embodiment shown in FIG. 18, an inductor unit 941 and the input/output terminals 932 and 933 of the inductor unit 941 in this embodiment are all embedded into the PCB 1031, and the inductor unit 941 may be electrically connected with an external component or circuit through the input/output terminal 932/933.

In practice, the above-mentioned PCB may be a laminate substrate or circuit board that is made of resin, ceramic and other materials and has a certain mechanical strength.

For the switch circuit package modules shown in the drawings following FIG. 8, since the processes of the switch circuit package modules have the following steps, the switch circuit package modules have better performance when compared to the prior art. Specific steps or ways are respectively described as below:

1) Being Made of the Integrated Semiconductor Chip:

In the above-mentioned switch circuit package module, multiple semiconductor chips (e.g., the half bridge high side switch chip, half bridge low side switch chip and drive circuit chip) respectively having different functions are integrated into the same semiconductor chip mainly by the monolithic integration technology, and various chips are electrically connected with each other through the internal metal;

2) Forming Multiple Units in the Semiconductor Chip:

The semiconductor chip in the power part when being formed may be considered to be divided into multiple sub switch circuit units having smaller area, and each sub switch circuit unit is led out separately and arranged (a typical model of a staggered and arranged matrix form) according to actual requirements. Additionally, the required drive signal could employ the concentrated leads;

3) Integrating the Capacitor on the Chip Surface:

An absorption capacitor at an input side of a power switch circuit generally has a higher capacitance, and the capacitance is generally at a level between 1 nF and $10^3$ nF, while the capacitance of the capacitor may be derived from the following mathematical formula:

$$C = n \cdot \in \cdot A_{\mathit{effc}} / 4\pi k \cdot d,$$

where $\in$ represents a relative dielectric constant, $1/(4\pi k)$ represents a dielectric constant, $A_{\mathit{effc}}$ represents a metal electrode area, d represents a distance between two metal electrodes and n represents the number of layers stacked repeatedly by the capacitor. In order to reduce the size of the integrated capacitor, the distance between the metal electrodes generally is required to be reduced to increase the dielectric value of the dielectric material. The distance between the metal electrodes still depends on dielectric breakdown strength of a selected material in addition to the limitation from the process, and thus at present capacitor fabrication process selects the material having a higher dielectric value and larger dielectric breakdown strength.

4) Employing Compact Package Leads to Lead Out the Electrodes:

In the above-mentioned manner by which the chip surface is used for integrating the capacitor, a ceramic dielectric may be generally used, while the used ceramic dielectric requires a high-temperature processing to form a suitable dielectric material. For example, the common ferroelectric film material (PZT) is required to be processed at a high temperature of 500-700° C., or even processed at a high temperature more than 1000° C. In addition, in the semiconductor fabrication process, after the internal interconnected line (especially the wiring) is formed, the high-temperature process is not suitable any more generally. At this time, a thin film transfer technology may be employed to transfer the dielectric thin film to the semiconductor chip surface at a low-temperature, so as to form the capacitor.

A ferroelectric thin film transfer technology is taken for example. First, a PZT thin film material sintered on a sapphire substrate is transferred to a target face with the solder (such as AuSn); then, the above-mentioned PZT thin film material is baked in a reflow oven with the highest temperature less than 300° C., for example baking for 60 seconds at 280° C.; next, after the temperature is reduced to be less than 100° C., the PZT thin film material may be dropped from the sapphire substrate and transferred to the target face.

On the other hand, since the process ways for forming the chip and the capacitor are different, the structure and process of this chip also may be adjusted correspondingly according to actual requirements, such that the integration of the capacitor may be more convenient and has higher space utilization.

The above-mentioned switch circuit package module in any embodiment of the disclosure may be applied to the conversion circuit shown in FIG. 3C. The switch circuit package module is electrically connected with the external capacitor Cin, such that the switch circuit package module and the external capacitor Cin may be operated simultaneously as described above.

Alternatively, the above-mentioned switch circuit package module in the embodiment of the disclosure may be applied to the device that needs small loop inductances, e.g., the device including at least a capacitor and at least two switch components. The above-mentioned switch components are operated and matched with each other, in which at least one switch component is an active component (as the MOSFET) and at least the other one is a passive component (as a diode), or at least two switch components are both active components.

Figure 20:
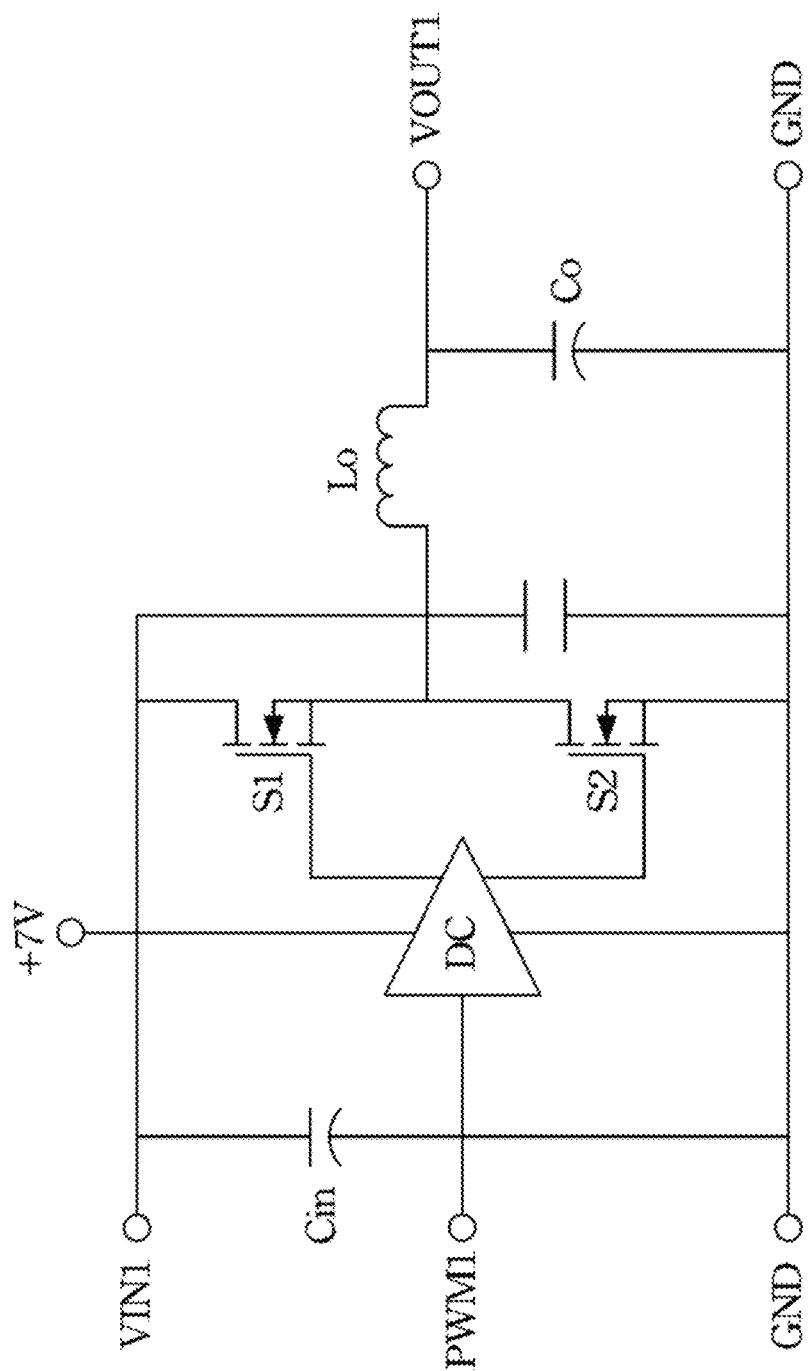
FIG. 20 is a schematic diagram illustrating a synchronous buck circuit.

For example, the above-mentioned switch circuit package module in the embodiment of the disclosure may be applied to a synchronous Buck circuit as shown in FIG. 20. This synchronous Buck circuit includes the switch circuits S1 and S2, drive circuit DC, input capacitor Cin, output inductance $L_o$ and output capacitor $C_o$. Various components in the package structure are connected with each other through a copper substrate on the bottom, and the copper substrate is also used as the lead of the module. In addition, the output capacitor is placed outside the module and connected with the internal component through the module lead.

The above-mentioned synchronous Buck circuit may be applied to a DC-DC transformation for powering the central processing unit (CPU), and the following application requirements may be satisfied, such as high efficiency transformation, high operating frequency, low voltage ripple and high power density. Moreover, the above-mentioned synchronous Buck circuit also may be applied to a power supply system of a portable apparatus (e.g., an adapter and DC-DC transformation of a notebook computer), so as to satisfy the following application requirements, such as high efficiency transformation and small volume.

Next, the above-mentioned switch circuit package module in the embodiment of the disclosure also may be applied to a converter circuit module (such as a converter circuit module employing an insulated and resonated topology), so as to satisfy the following application requirements, such as high efficiency transformation, high operating frequency and high power density.

In the above-mentioned embodiments, the structural features in the switch circuit package module may all be formed separately, and also be formed and matched with each other. Therefore, in the above-mentioned various embodiments, corresponding features are described only for convenient illustration, while all the embodiments may be selectively matched with each other according to actual requirements, so as to fabricate the switch circuit package module in the disclosure, which is not intended to limit the disclosure.

Another aspect of the disclosure relates to a method for fabricating the switch circuit package module. The method is described as follows and may be applied to the switch circuit package module as described in the above-mentioned embodiments. Next, for the purpose of convenient and clear illustration, the method may be described as follows with reference to the above-mentioned embodiment shown in FIG. 8A. However, the method is not limited to this.

First, the first semiconductor switch element and the second semiconductor switch element are integrated into the semiconductor switch unit 810, in which the semiconductor switch unit 810 includes a plurality of sub micro-switch elements. Secondly, the capacitor unit 820 is configured on the surface of the semiconductor switch unit 810, such that the impedances of multiple commutation loops between the capacitor unit 820 and the sub micro-switch elements are close to or the same with each other.

In an embodiment, the step of integrating the first semiconductor switch element and the second semiconductor switch element into the semiconductor switch unit 810 described above may further include: integrating the source of the first semiconductor switch element and the drain of the second semiconductor switch element into the source-drain common electrode, and alternately arranging the drains (e.g., the switch conductive electrode 814) of n first semiconductor switch elements and the sources (e.g., the switch conductive electrode 816) of n second semiconductor switch elements (as shown in FIG. 7B).

In another embodiment, the step of integrating the first semiconductor switch element and the second semiconductor switch element into the semiconductor switch unit 810 described above may further include: forming n drains (Drain1) and n sources (Source1) of the first semiconductor switch element and n drains (Drain2) and n sources (Source2) of the second semiconductor switch element onto the surface of the semiconductor switch unit 810 with the matrix pattern (the matrix pattern as shown in FIG. 7A).

Next, in yet another embodiment, the step of integrating the capacitor unit 820 onto the surface of the semiconductor switch unit 810 may further include: stacking multiple capacitors 822 in the capacitor unit 820 on the drain (e.g., the switch conductive electrode 814) of the first semiconductor switch element and the source (e.g., the switch conductive electrode 816) of the second semiconductor switch element with the array pattern (the capacitor array pattern as shown in FIG. 9A) respectively.

The sequence of all steps mentioned in this embodiment can be adjusted according to the actual requirements and they can even be performed simultaneously or partially simultaneously, except expressly specified otherwise in the above embodiment. The above is only an embodiment and is not intended to limit the disclosure.

Although the disclosure has been disclosed with reference to the above embodiments, these embodiments are not intended to limit the disclosure. It will be apparent to those of skills in the art that various modifications and variations can be made without departing from the spirit and scope of the disclosure. Therefore, the scope of the disclosure should be defined by the appended claims.

What is claimed is:

1. A switch circuit package module, comprising:
   at least a semiconductor switch unit comprising:
      a first semiconductor switch element; and
      a second semiconductor switch element, wherein each of the first semiconductor switch element and the second semiconductor switch element comprises a plurality of sub micro-switch elements; and
   at least a capacitor unit, wherein the capacitor unit is stacked on a surface of the semiconductor switch unit and comprises a plurality of capacitors configured in a form of array pattern, wherein the capacitors are configured to cooperate with the sub micro-switch elements, such that impedances of multiple commutation loops between the capacitors and the sub micro-switch elements are close to or the same with each other.

2. The switch circuit package module of claim 1, wherein the first semiconductor switch element and the second semiconductor switch element each has sources, drains and a gate, the source of the first semiconductor switch element and the drain of the second semiconductor switch element are integrated to a source-drain common electrode, the source-drain common electrode, n drains of the first semiconductor switch element and n sources of the second semiconductor switch element are configured on the surface of the semiconductor switch unit, the n drains of the first semiconductor switch elements and the n sources of the second semiconductor switch elements are alternately arranged, and n is a natural number greater than or equal to 1.

3. The switch circuit package module of claim 2, wherein the drains of the first semiconductor switch element and the n sources of the second semiconductor switch element are staggered and arranged on the surface of the semiconductor switch unit.

4. The switch circuit package module of 2, wherein two electrodes of the capacitor are respectively connected to the drain of one of the first semiconductor switch elements and the source of one of the second semiconductor switch elements that are nearest to the capacitor.

5. The switch circuit package module of claim 2, wherein the capacitors are respectively stacked across the drains of the first semiconductor switch element and the sources of the second semiconductor switch element.

6. The switch circuit package module of claim 1, wherein the first semiconductor switch element and the second semiconductor switch element each has sources, drains and a gate, wherein n drains and n sources of the first semiconductor switch element and n drains and n sources of the second semiconductor switch element are configured on the surface of the semiconductor switch unit in a form of matrix pattern, the drains and the sources of the first semiconductor switch element or the second semiconductor switch element are staggered and arranged in a first array direction, the drains or sources of the first semiconductor switch element and the drains or sources of the second semiconductor switch element are juxtaposed in a second array direction, and n is a natural number greater than or equal to 1.

7. The switch circuit package module of claim 1, further comprising:
   a plurality of input electrodes, which correspond to the drains of the first semiconductor switch element and the sources of the second semiconductor switch element and are stacked on the capacitor unit.

8. The switch circuit package module of claim 1, wherein the gates of the first semiconductor switch element and the second semiconductor switch element are all configured on the surface of the semiconductor switch unit.

9. The switch circuit package module of claim 1, further comprising:
   a drive circuit unit configured outside the semiconductor switch unit or integrated together with the semiconductor switch unit, wherein the drive circuit unit is electrically connected with gates of the first semiconductor switch element and the second semiconductor switch element.

10. A method for fabricating a switch circuit package module, comprising:
    integrating a first semiconductor switch element and a second semiconductor switch element into a semiconductor switch unit, wherein each of the first semiconductor switch element and the second semiconductor switch element comprises a plurality of sub micro-switch elements; and
    configuring at least a capacitor unit on a surface of the semiconductor switch unit, wherein the capacitor unit comprises a plurality of capacitors configured in a form of array pattern, and the capacitors are configured to cooperate with the sub micro-switch elements such that impedances of multiple commutation loops between the capacitors and the sub micro-switch elements are close to or the same with each other.

11. The method of claim 10, wherein the step of integrating the first semiconductor switch element and the second semiconductor switch element further comprises:
    integrating a source of the first semiconductor switch element and a drain of the second semiconductor switch element to a source-drain common electrode and alternately arranging n drains of first semiconductor switch element and n sources of second semiconductor switch element.

12. The method of claim 10, wherein the step of integrating the first semiconductor switch element and the second semiconductor switch element further comprises:
    forming n drains and n sources of the first semiconductor switch element and n drains and n sources of the second semiconductor switch element on a surface of the semiconductor switch unit in a form of matrix pattern.

13. A switch circuit package module comprising:
    a substrate;
    a semiconductor switch unit comprising a plurality of first and second switch conductive electrodes disposed on an upper surface of the substrate, wherein the first switch conductive electrodes are arranged alternately with the second switch conductive electrodes; and
    a capacitor unit disposed on an upper surface of the semiconductor switch unit, and electrically and physically contacted with the semiconductor switch unit, wherein the semiconductor switch unit is interposed between substrate and the capacitor unit, and wherein the capacitor unit comprises a plurality of capacitors, and each of the capacitors overlaps portions of a pair of adjacent first and second switch conductive electrodes;

wherein a commutation loop is formed by each of the capacitors and a pair of adjacent switch conductive electrodes that said each of the capacitors partially overlaps, and wherein impedances of all of the commutation loops are close to or the same as each other.

* * * * *